United States Patent [19]

Neal

[11] Patent Number: 4,550,406
[45] Date of Patent: Oct. 29, 1985

[54] AUTOMATIC TEST PROGRAM LIST GENERATION USING PROGRAMMED DIGITAL COMPUTER

[75] Inventor: Thomas M. Neal, Brea, Calif.

[73] Assignee: Everett/Charles Test Equipment, Inc., Pomona, Calif.

[21] Appl. No.: 504,270

[22] Filed: Jun. 14, 1983

[51] Int. Cl.$^4$ ............................................. G01R 31/28
[52] U.S. Cl. ................................. 371/20; 324/73 AT; 364/300; 371/27
[58] Field of Search .................... 371/20, 25, 27; 324/73 R, 73 AT, 73 PC; 364/200, 900, 300

[56] References Cited

U.S. PATENT DOCUMENTS

| | | | |
|---|---|---|---|
| 3,931,506 | 1/1976 | Borrelli et al. | 371/20 |
| 4,070,565 | 1/1978 | Borrelli | 371/20 |
| 4,114,093 | 9/1978 | Long | 324/73 AT |
| 4,216,539 | 8/1980 | Raymond et al. | 371/20 |
| 4,339,819 | 7/1982 | Jacobson | 371/20 X |
| 4,365,334 | 12/1982 | Smith et al. | 371/27 |
| 4,439,858 | 3/1984 | Peterson | 371/20 |

OTHER PUBLICATIONS

Thompson, Node Forcing Techniques, Marconi Instrumentation, vol. 17, No. 2, May 1980, pp. 31-33.

*Primary Examiner*—Charles E. Atkinson
*Attorney, Agent, or Firm*—Christie, Parker & Hale

[57] ABSTRACT

A method uses a digital data processor and a manifestation of an electrical circuit for producing a digitally coded test program list. The test program list is for controlling the operation of a circuit test system in testing a printed wiring board containing the electrical circuit for electrical characteristics, the electrical circuit comprising electrical circuit components connected to conductors. The method includes the steps of selecting a sequence of test node characters that are in a sequential order between a first and last character. The data processing is controlled to generate digitally coded representations of a common list of unique pairs of test node characters, a first test node character in each pair in the list comprising a representation of a common test node character and a second test node character in each pair comprising a representation of the other test node character in the sequence of test node characters. An electrical characteristic of the electrical circuit between each pair of test nodes identified by each of a plurality of the pairs of test node characters in the common list is determined. A test program list is formed comprising representations of pairs of test node characters from the common list and representations of the electrical characteristic between the test nodes corresponding to the pairs of test node characters included in the test program list.

20 Claims, 46 Drawing Figures

PROGRAM HEADER MAP

MEMORY MAP

Fig. 10

COMMON POINT FLAG MAP

|   | 1 | 2 | 3 | 4 | 5 | 6 | 7 | 8 | 9 | A |     |
|---|---|---|---|---|---|---|---|---|---|---|-----|
| C |   |   |   |   |   |   |   |   |   |   | ON/OFF |
| R |   |   |   |   |   |   |   |   |   |   |     |
| J |   |   |   |   |   |   |   |   |   |   | ←170 |

Fig. 11

PROGRAM STORAGE AREA MAP (PSA) 178

| MEAS'T TYPE | FROM | TO | MIN. VAL. | NOM. VAL. | MAX. VAL. | LO TOL | HI TOL | MASK |
|---|---|---|---|---|---|---|---|---|
| | | | | | | | | |

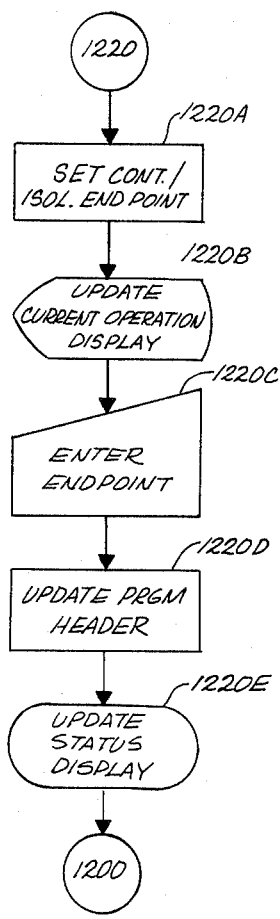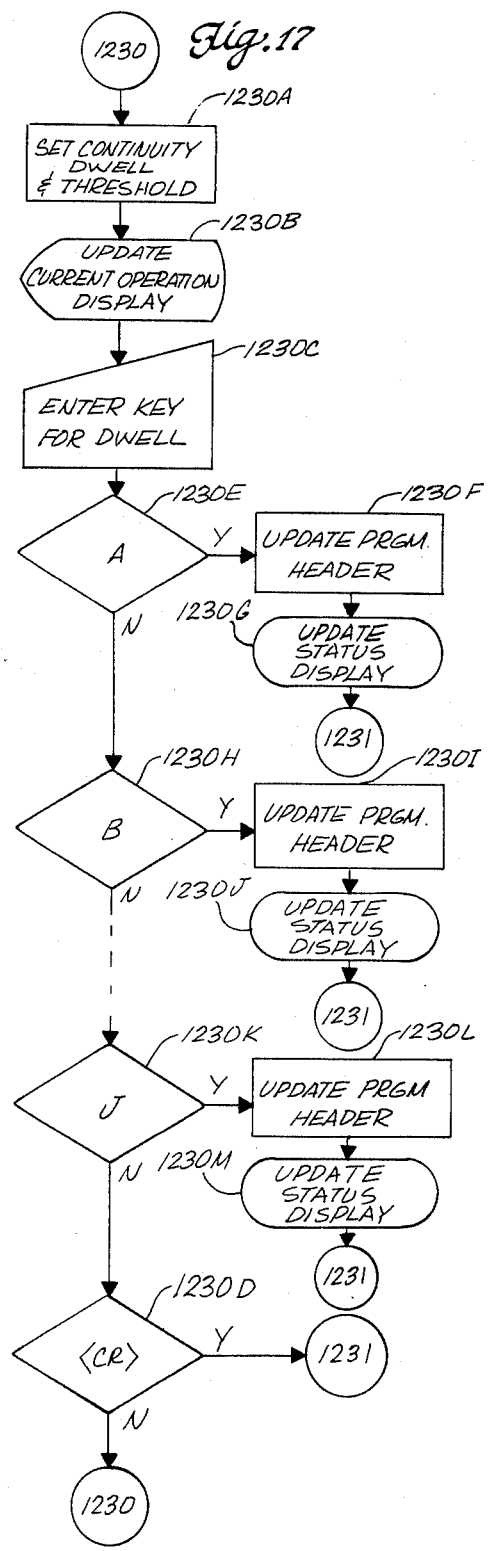

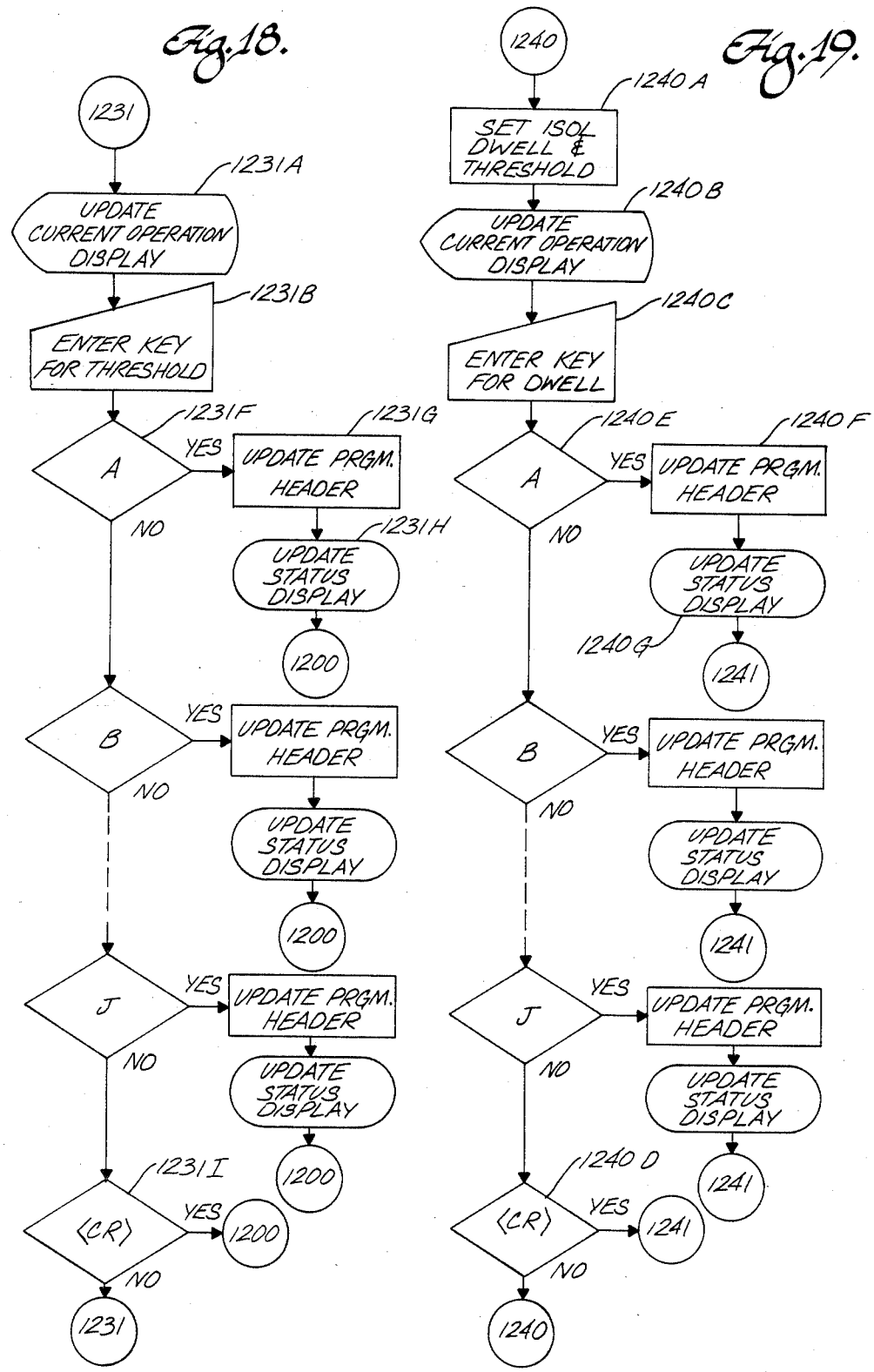

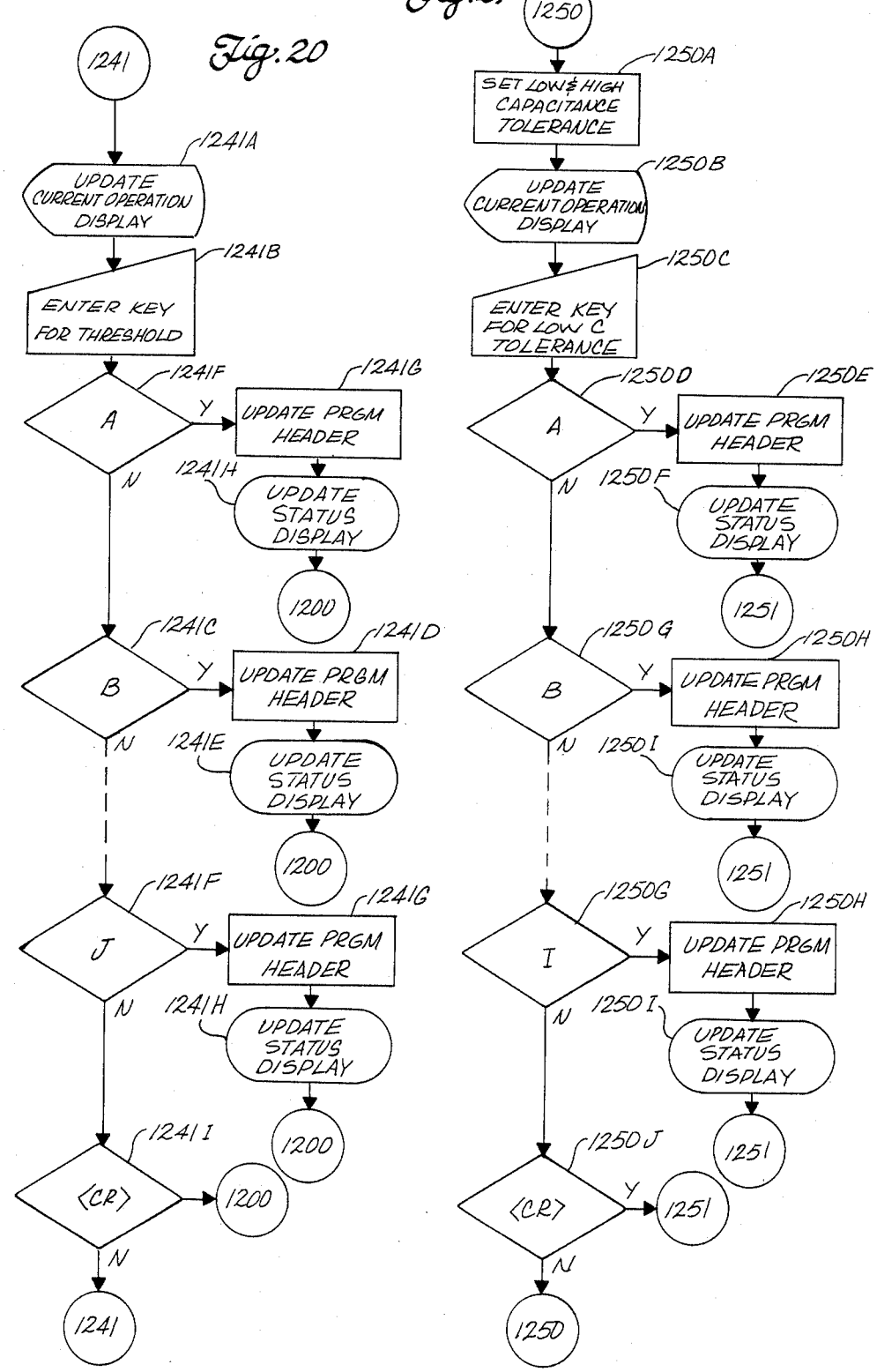

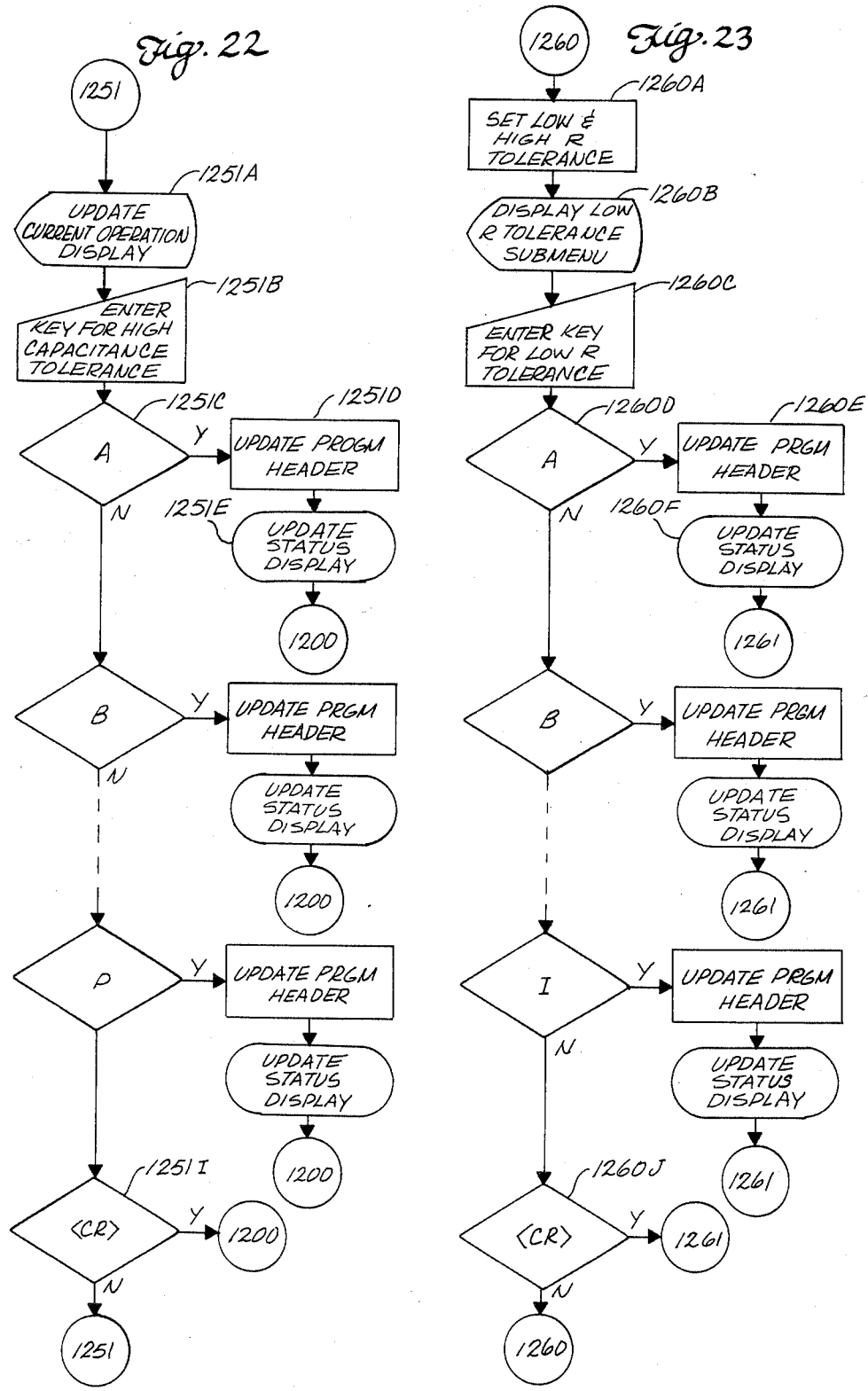

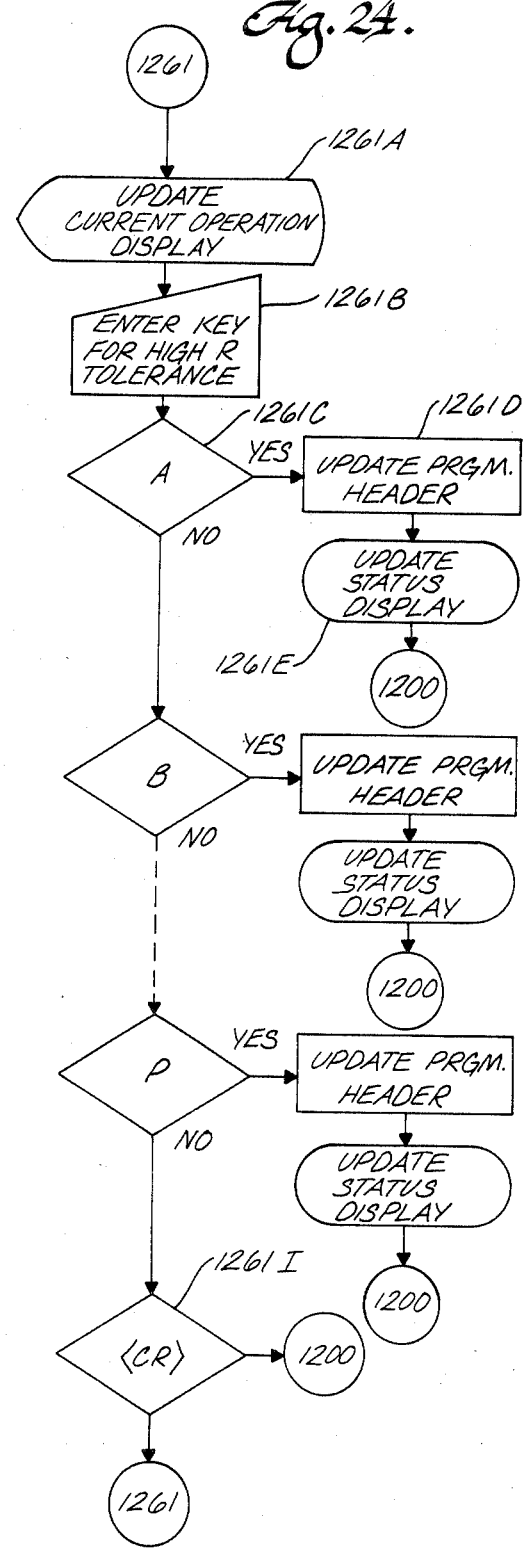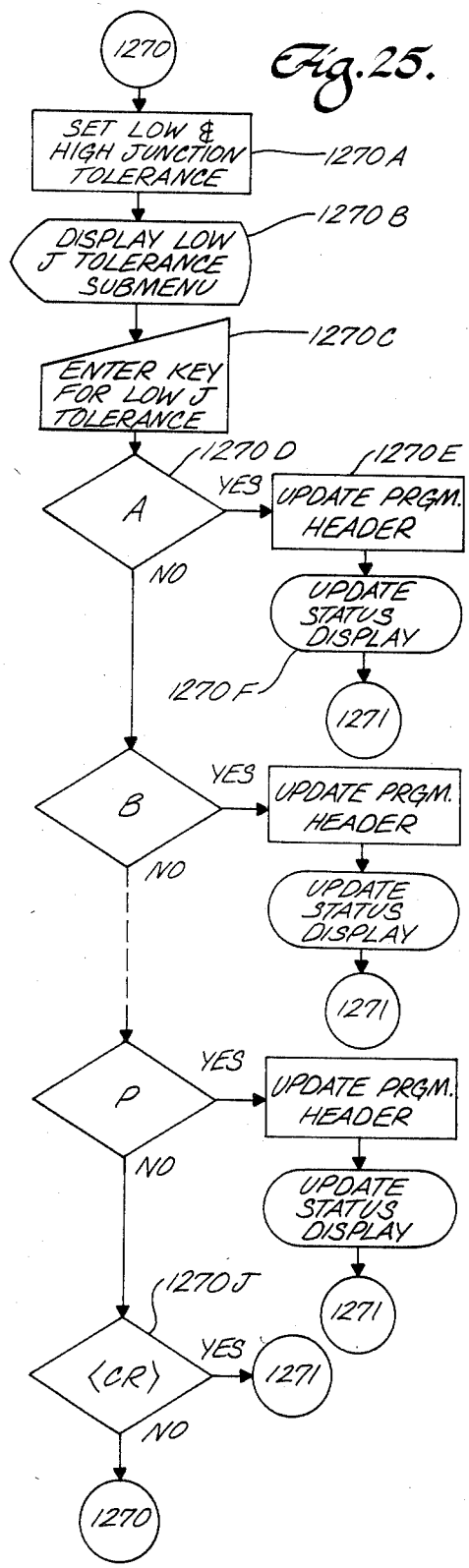

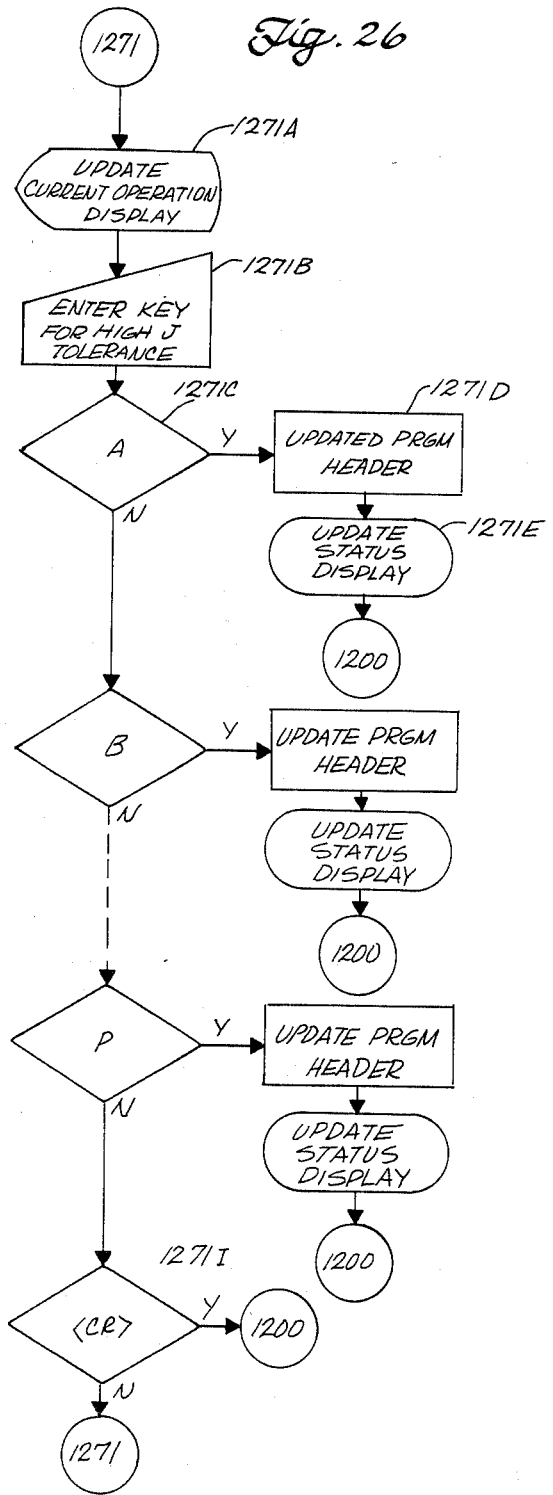

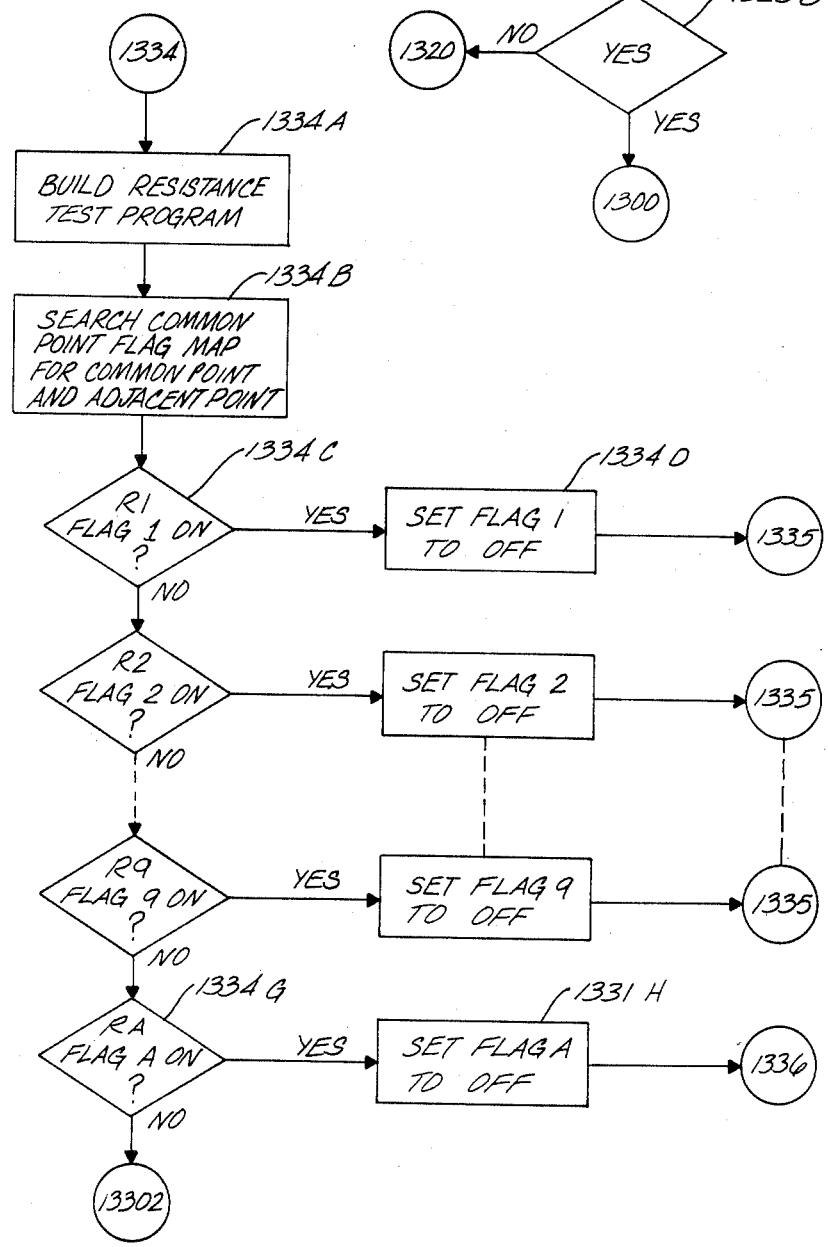

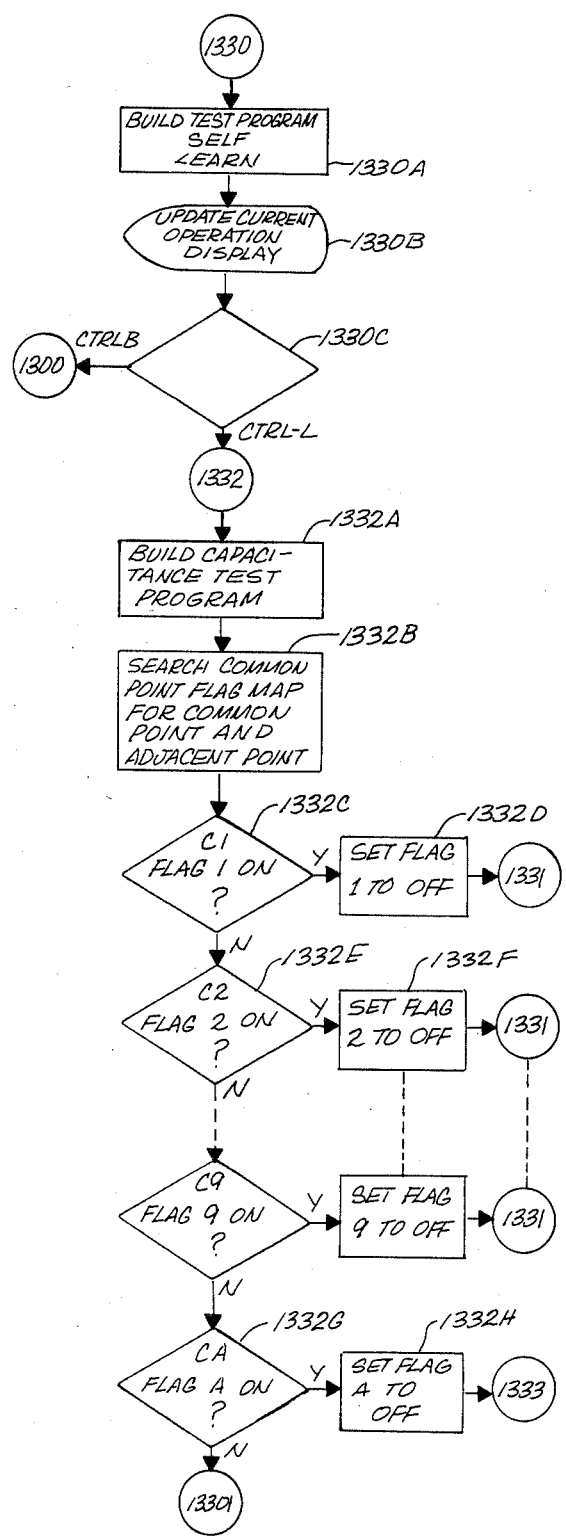

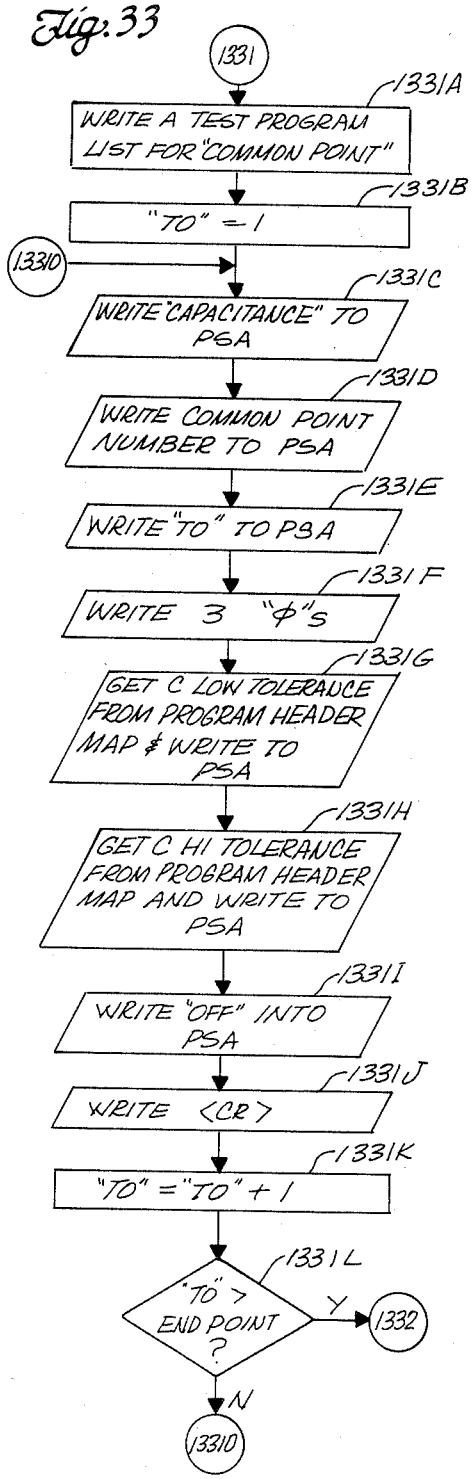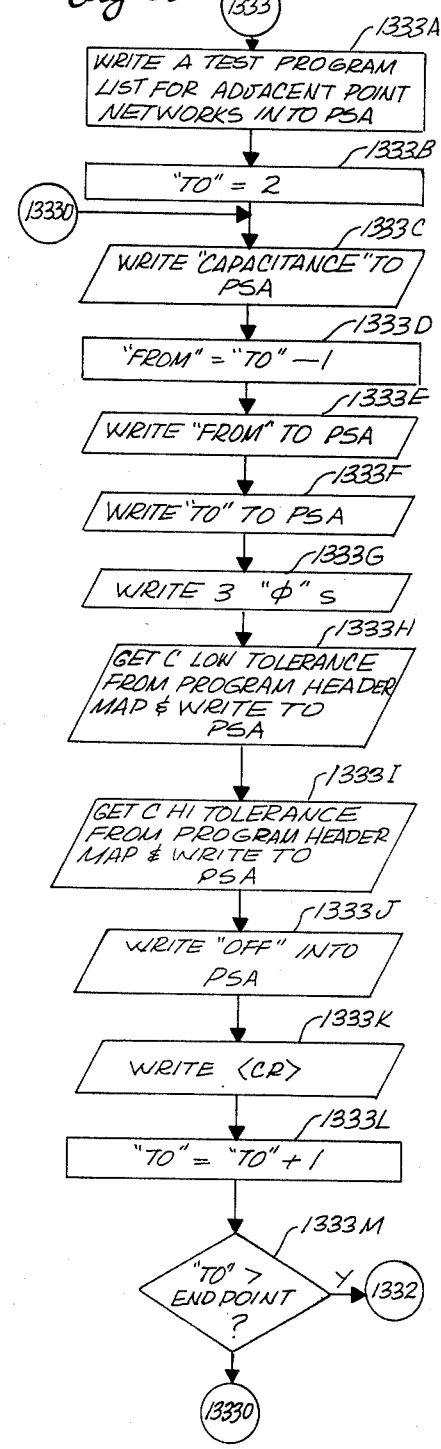

Fig. 34.

| MEAS'T TYPE | FROM | TO | MIN. VAL. | NOM. VAL. | MAX. VAL. | LO TOL. | HI. TOL. | MASK |
|---|---|---|---|---|---|---|---|---|
| CAPACITANCE | 1 | 1 | 0 | 0 | 0 | -40% | +40% | OFF |
| CAPACITANCE | 1 | 2 | 0 | 0 | 0 | -40% | +40% | OFF |
| CAPACITANCE | 1 | 3 | 0 | 0 | 0 | -40% | +40% | OFF |
| CAPACITANCE | 1 | 4 | 0 | 0 | 0 | -40% | +40% | OFF |
| CAPACITANCE | 1 | 5 | 0 | 0 | 0 | -40% | +40% | OFF |
| CAPACITANCE | 1 | 6 | 0 | 0 | 0 | -40% | +40% | OFF |
| CAPACITANCE | 1 | 29 | 0 | 0 | 0 | -40% | +40% | OFF |
| CAPACITANCE | 1 | 30 | 0 | 0 | 0 | -40% | +40% | OFF |

Fig. 36.

| MEAS'T TYPE | FROM | TO | MIN. VAL. | NOM. VAL. | MAX. VAL. | LO TOL. | HI. TOL. | MASK |
|---|---|---|---|---|---|---|---|---|
| CAPACITANCE | 1 | 2 | 0 | 0 | 0 | -40% | +40% | OFF |
| CAPACITANCE | 2 | 3 | 0 | 0 | 0 | -40% | +40% | OFF |
| CAPACITANCE | 3 | 4 | 0 | 0 | 0 | -40% | +40% | OFF |
| CAPACITANCE | 4 | 5 | 0 | 0 | 0 | -40% | +40% | OFF |
| CAPACITANCE | 5 | 6 | 0 | 0 | 0 | -40% | +40% | OFF |
| CAPACITANCE | 6 | 7 | 0 | 0 | 0 | -40% | +40% | OFF |
| CAPACITANCE | 28 | 29 | 0 | 0 | 0 | -40% | +40% | OFF |
| CAPACITANCE | 29 | 30 | 0 | 0 | 0 | -40% | +40% | OFF |

AUTOMATIC TEST PROGRAM LIST GENERATION USING PROGRAMMED DIGITAL COMPUTER

BACKGROUND OF THE INVENTION

This invention relates to methods for generating test programs for identifying faults on a loaded printed wiring board and, more specifically, for automatic program generation of such test programs employing a data processor.

During the manufacture of printed wiring boards loaded with electrical components, it is common to encounter faults, such as reversal of components, missing components, components of the wrong value and erroneously placed components. Techniques have been developed which use test or fixture systems with associated electronics for testing finished loaded printed wiring boards for such defects.

Such systems can generally be classified into two groups, known as functional testers and in-circuit testers. Functional testers are devices which connect to the edge of the printed wiring board and apply test signals at the edge of the board to determine if the loaded board contains any faults. An in-circuit tester is one which tests for the integrity of individual components and utilizes what is commonly known as a bed of nails. The bed of nails includes an array of probes which contact various test points over the printed wiring board and thereby allows test signals to be applied between pairs of such test points.

Functional testers suffer from a number of disadvantages. For example, complex software is required to isolate of diagnose faults and such testers can only apply and sense signals at the edge of the printed wiring board. As a result, it is difficult to identify faults at specific components. To identify a specific fault, it is necessary to take the results of the test at the edge of the printed wiring board and use them to apply a series of manually probed measurements to that portion of the circuit producing the defective test.

Techniques have been devised for generating test programs to direct the sequence of operations to be carried out by a test system in testing printed wiring boards. A test program list is a sequence of instructions which directs the sequence of steps that the test system is to go through to test a printed wiring board. One technique employed is generally referred to as automatic test program generation. The purpose of automatic test program generation is to generate a program which will cause the printed wiring board test system to detect and report defects in the loaded printed wiring board.

The commonly used techniques for test program list generation for in-circuit testers can generally be classified into six classes, as described below.

The first class involves the N-squared technique and is largely theoretical, since it is generally impractical to fully implement. However, it is instructive to discuss the N-squared technique as a backdrop for other methods. The N-squared technique produces a test program list which lists each different pair of test nodes on the printed wiring board and the electrical measurement to be made between each such pair. If a program is generated consecutively to test from each test node to every other test node on the loaded printed wiring board, it results in an extremely large list of test nodes and measurements, the number of such measurements being almost the square of the number of test nodes times the number of measurement types. This requires an extremely large and unwieldy program and takes a substantial amount of time to generate and implement. By way of example, the number of test nodes for a loaded printed wiring board having N different test nodes would be as follows: N* (N−1)* TYPES, where N is number of test nodes and TYPES is the number of different types of tests to be performed. For example, the types of tests that may be performed include resistance measurement, capacitance measurement and junction measurement. Thus, if there are 1,000 different test nodes on the printed wiring board and three types of electrical measurements are to be conducted, the number of measurements would be: 1,000* (1,000−1)* 3=2,997,000. This assumes that all three measurement types are conducted between each pair of test nodes.

The second class is the manual method. In the manual method, technicians or programmers select pairs of test nodes (nodes are also called points) on the loaded printed wiring board corresponding to the electronic component to be tested and the type of measurement to be made between each such pair of test nodes. The problem with this approach is that it requires an inordinate amount of time to manually create such a program with all the required test node pairs, and carefully analyze the circuit to determine nominal values of components and determine minimum and maximum values, and other required data. For example, in determining the nominal value of a component which comprises two resistors in parallel between the associated test nodes, the user must determine the effective resistance between the test nodes to select the nominal value for the corresponding pair of test nodes. If there is a semiconductor junction connected between a pair of test points, the user must specify the polarity at which the junction test is to be made.

The third class involves a process whereby the circuit on the printed wiring board is analyzed and a list of each different test node on the printed wiring board is made including, for each test node, a list of the components connected to that test node and the nominal value of the component. The resultant list is then manipulated by a data processing machine to create a list of pairs of test nodes to be tested by the fixture system.

The fourth class involves what is known as the nodal impedance method. In this technique, tests are applied from each test node to all the other test nodes with all other test nodes shorted together. A measurement is made of the "characteristic impedance" between the test nodes. A serious shortcoming of this technique is that when one shorts a number of nodes in the circuit together, one could be connecting, for example, resistors having very large values of resistance in parallel with resistors having very low values of resistance so that the resultant test between the test nodes may be virtually meaningless when the small resistance masks the presence of the large resistance. Additionally, when one connects large groups of resistors, capacitors and other components in parallel, it is virtually impossible to relate the resultant test to any particular component. For example, it would be very difficult to determine whether nominal values of resistors are within a desired tolerance or to determine if a resistor of a very high value is missing if it is in parallel with a resistor of a very low value. A resistor with an allowable nominal value tolerance of ten percent in parallel with a resistor only ten times larger will cause the resultant nominal value to vary only ten percent if the larger resistor is missing. With this technique, one cannot measure specific values for specific components, cannot select tolerances of specific measurements, and cannot test for junctions. One system in this class of system is an automatic program generator. When generating a test program list with nominal values, the programmer must select a sampling of typical boards, measure the characteristic impedance between each test node and all other points shorted together and average the resultant characteristic impedances between each test node and all other nodes shorted together among all the boards to come up with a characteristic impedance to be used in the test program list.

In the fifth class designed in part for testing logic boards for misplaced or missing pull-up resistors, the circuit is analyzed to identify the +5 volts and ground conductors. These nodes and other test nodes on the printed wiring board are then used in conjunction with a continuity and isolation test method described in the Long U.S. Pat. No. 4,114,093 to produce a preliminary test program list of test pairs. A test signal is then applied across the test nodes in each pair. Specifically, a current is applied between test nodes to see if voltage rises continuously or levels off at some point. If the voltage does not level off within a selected time interval, it is assumed that the component connected between the test nodes is not a pull-up resistor and the particular pair of test nodes is deleted from the test program list. If it stabilizes, it is assumed that a pull-up resistor is connected between the test nodes. A measurement is made by counting the number of regularly occurring time ticks or clock signals that occur during the rise in voltage. This technique is designed principally to test printed wiring boards for computer circuits with TTL-type logic. Typically, the faults in this type of circuit are opens, shorts and missing pull-up resistors. This technique has certain disadvantages which make it difficult to apply to general digital logic circuits and non-digital logic circuits.

The sixth class requires the user to select and manually input pairs of test nodes and specify whether a capacitance, resistance or junction measurement type is to be made between each such pair of test nodes. The system then automatically applies the specified measurement type between each of the specified pairs of test nodes and, in effect, self-learns the actual electrical component nominal values on a loaded printed wiring board. However, this technique does not involve any means for displaying the resultant measurement, nor does it have any provision for allowing the user to edit the results of the measurements.

Because of the deficiencies in the prior art, there is a need for a better and more efficient method for automatic test program list generation where the test program list is for detecting and reporting defects in printed wiring boards, materials and workmanship.

SUMMARY OF THE INVENTION

Common test node technique alone or in combination with adjacent test node technique is a method for automatic test node program list generation for computer based printed wiring board test equipment. The equipment on which the test program list generated by the method is used performs non-functional, in-circuit, electronic inspection as directed by the test program list in order to detect and report defects in printed wiring board materials and workmanship. When the common test node technique is employed together with the adjacent test node technique, they maximize fault coverage and allow very rapid automatic test program list generation results. Although the fault coverage is equivalent to the above described N-squared technique, it results in a substantially reduced size of the test program list.

Selected aspects of the topological layout of a loaded printed wiring board assembly (i.e., a printed wiring board with electrical components connected in an electrical circuit) are communicated to a data processor employed in the automatic test program list generator. Typically, loaded printed wiring board assemblies are designed so that a majority of the components are directly or indirectly connected to certain common test nodes such as power supply lines, power return lines, signal grounds. etc. Rarely do these common test nodes number more than a few, almost never more than nine. However it should be noted that this invention is not limited to just nine common test nodes. The data processor takes the common test nodes into consideration and as a result drastically reduces the number of test steps produced in the test program list. Specifically, the data processor generates a list of pairs of test nodes where each pair comprises a common test node and one of the remaining test nodes on the printed wiring board to be tested. This is repeated for each different measurement type such as capacitance measurement, resistance measurement, and junction measurement. As a result the number of test steps for N test nodes, for T measurement types, and for C common test nodes, to accomplish the test, would be: $(N-1) \times T \times C$. For example, to make three measurements on a 500 node printed wiring board, assuming ten common test nodes, the total measurements would be: $(500-1) \times 3 \times 10 = 14,970$.

The common test node technique reduces the number of data processor assisted test program generated steps significantly compared with the N-squared technique. As a matter of fact, the larger the application and the greater the number of test nodes, the more practical and beneficial the common test node technique becomes, and the more dramatic the reduction of resultant test program size compared to the N-squared method.

All components may not necessarily be directly or indirectly connected to one of the common test nodes. In fact, totally isolated components may be included in the circuit on the printed wiring board. Additionally, certain components may be isolated from a common test node by other components such as resistors, capacitors, semiconductor devices, etc., and hence it is desired to make direct measurement across these components.

To enhance the common test node technique, the data processor automatically generates additional test node characters for the so-called isolated components, the ones that are not directly connected to the common test nodes. Specifically, the conductors on opposite sides of components that are not directly connected to common test nodes are assigned sequential test node numbers. For example, adjacent test node numbers are assigned to each of the two leads of a component, for example the numbers: 91 and 92, and 533 and 534. Adding the adjacent test node measurements for N nodes on a printed wiring board from which a test program list is being generated only adds $N-1$ additional measurements.

The advantage of the adjacent test node technique is that it can easily be utilized to automatically generate test steps for any component. The number of additional test steps is small and the fault coverage is complete for those components located between adjacent test nodes. A minimum number of unwanted test steps is generated.

The adjacent test node technique standing by itself is limited to only those components located between adjacent numbered test nodes. Therefore the combination of adjacent test node and common test node techniques results in fault coverage which is equivalent to the N-squared technique at a very significant reduction in the number of test steps generated. Because the majority of components are directly connected to a common test node, the automatic test program list generation using the common test node technique makes the best possible measurement of these components.

By properly wiring a vacuum or mechanical printed wiring board interface fixture, the adjacent test node technique can be utilized for components not directly connected to a common test node. Automatic test node generation using the adjacent test node technique makes the best possible measurement of these components.

Combining the common test node and adjacent test node techniques, the maximum number of test nodes for the program would be $[(N-1) \times T \times C] = [(N-1) \times T]$. For example, utilizing both the common test node technique and the adjacent test node technique to make three measurement types on a 500 node printed wiring board under test with 10 common nodes, the total measurements would be: $[(500-1) \times 3 \times 10] + [(500-1) \times 2[ = 16,487$. Utilizing the automatic test program list generation and the common test node and adjacent test node techniques, the best possible measurements are made for all components. It allows the data processor based test equipment to automatically generate high fault coverage test program lists of manageable size.

Automatic test program list generation is not only effective but practical. The data processor based equipment can be directed to make each measurement and retain only those measurements which are within a preselected range. Thus the data processor performs automatic program reduction. Due to the relatively small size of the test program list, automatic test program list generation is practical and is accomplished in a relatively short period of time compared to the N-squared technique. Human intervention and manual editing is a small task that can then be quickly accomplished.

Briefly, one embodiment of the present invention is a method using a digital data processor and an electrical circuit for producing a digitally coded test program list. The test program list is for controlling the operation of a circuit test system in testing, for electrical characteristics, a printed wiring board containing the electrical circuit. The electrical circuit has electrical circuit components connected to conductors. A sequence of test node characters is selected, which characters are in a sequential order between a first and last character, and a different one of the test node characters is assigned to each of a plurality of test nodes to be tested on the conductors in the electrical circuit. The electrical circuit is examined and a first test node is selected on one of the conductors that has at least two electrical components electrically connected thereto and a first test node character is assigned from the sequence of test node characters. A representation of the last test node character is input to the data processor. The data processor is controlled to generate digitally coded representations of pairs of test node characters and a common test node list of different pairs of test node characters. One test node character in each pair in the list is a representation of the first test node character and a second test node character in each pair is a representation of one of the other test node characters in the sequence of test node characters. The electrical characteristic is determined between each pair of test nodes identified by each of the pairs of test node characters. A representation of the electrical characteristic is associated with the corresponding pair of test node characters in the list.

In a preferred method, the user can develop a test program list for testing loaded printed circuit wiring boards to obtain nearly 100% fault coverage of a given board. In addition to the above steps, the electrical circuit is examined to select a plurality of selected ones of the electrical circuit components, each having a first conductor and a second conductor connected to the selected component. The first and second conductors of each of the plurality of selected components are ones that are not directly connected to the first test node.

Preferably, mutually adjacent test node characters from the sequential order of test node characters are selected to form unique pairs of adjacent test node characters. The test node characters in each of the unique pairs are assigned to a different one of the selected electrical circuit components, assigning one of the test node characters to a test node on the first conductor and assigning a second one of the test node characters to a test node on the second conductor of the respective selected component.

BRIEF DESCRIPTION OF THE DRAWINGS

FIG. 7 is not used;

FIG. 10 is a schematic diagram of a portion of the variable storage area of FIG. 8;

FIG. 11 shows a detailed schematic representation of the program storage area of FIG. 8;

FIGS. 13-32A, 32B, 33 35, 37, and 39, 48 are detailed flow charts depicting the detals of the method of FIG. 12;

FIG. 15 is not used.

FIGS. 34, and 36, are schematic diagrams providing samples of the program storage area map (FIG. 11) at different points in an example of the operation while building a test program list; and FIG. 38 is not used.

DESCRIPTION OF THE PREFERRED EMBODIMENT

Figure 1:
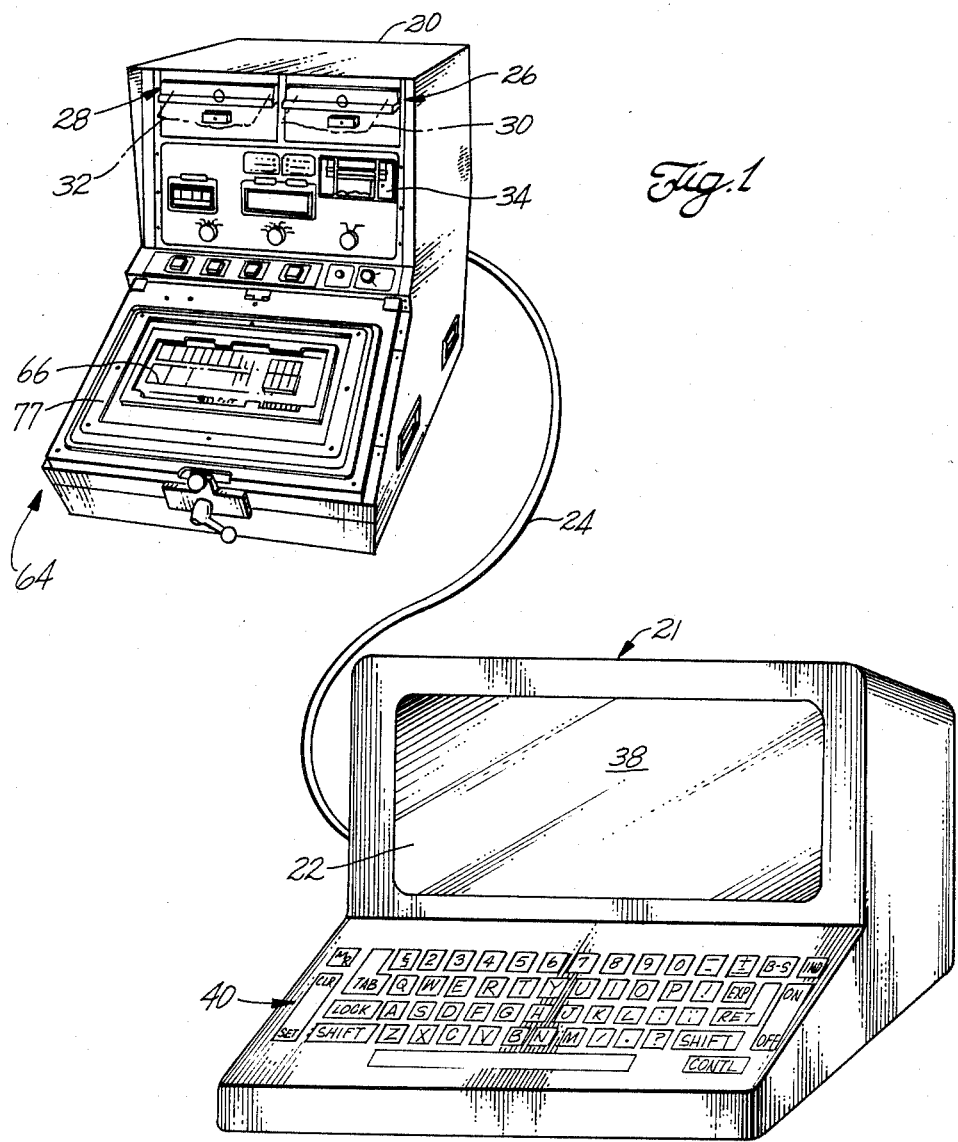
FIG. 1 is a perspective view of a test system including a digital data processor, disk drives, hard copy printout and a fixture system including a test head for accepting a printed wiring board for testing, and a video display terminal having a cathode ray tube and typical keyboard input.

FIG. 1 depicts an automatic test program list generator for generating a test program list for a printed wiring board. The purpose of the test program list is to test loaded production, printed wiring boards on an in-circuit tester for shorts, opens, missing components, wrong components, and misplaced or improperly oriented components and give confidence that the board is manufactured correctly.

Figure 4:
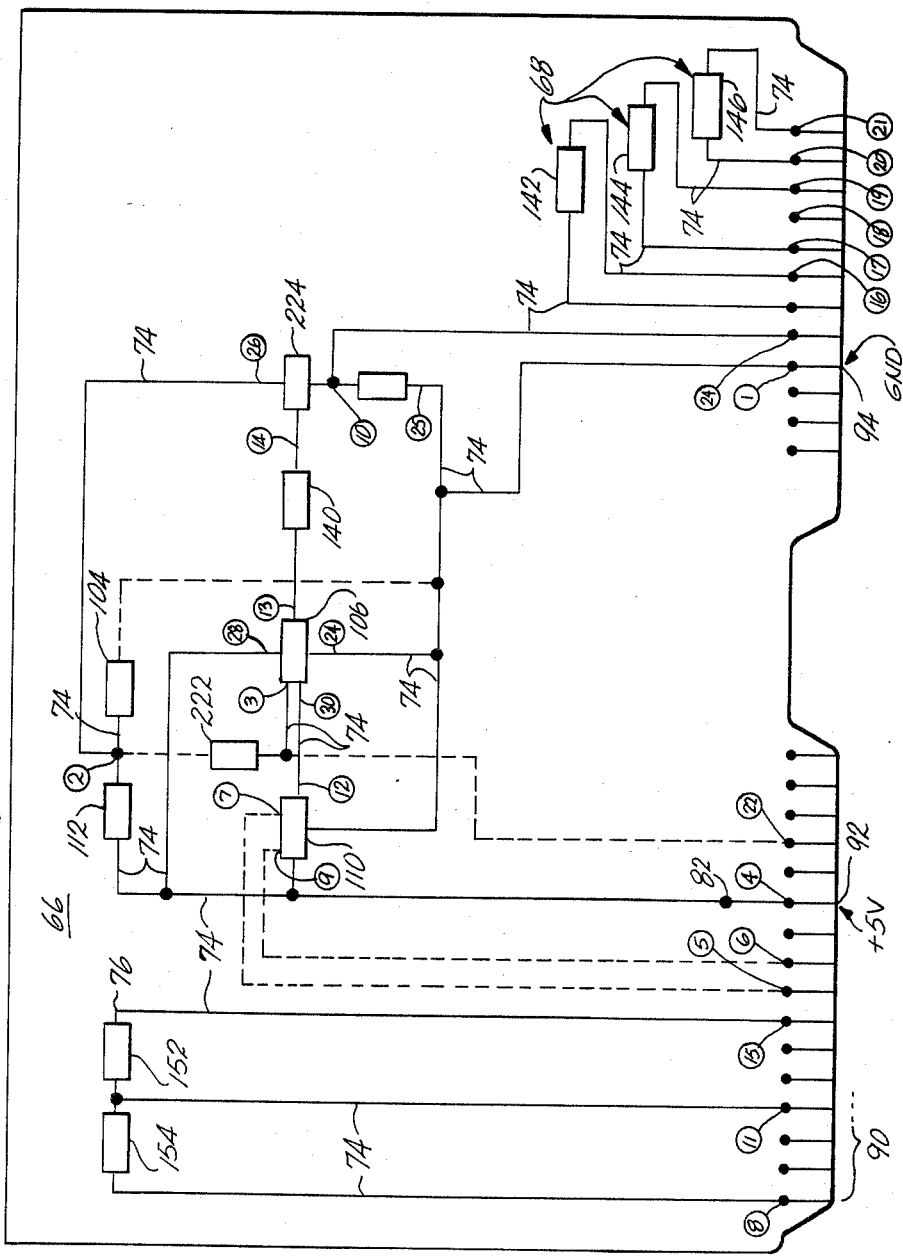
FIg. 4 is a schematic diagram of an example of a printed wiring board.
Figure 5:
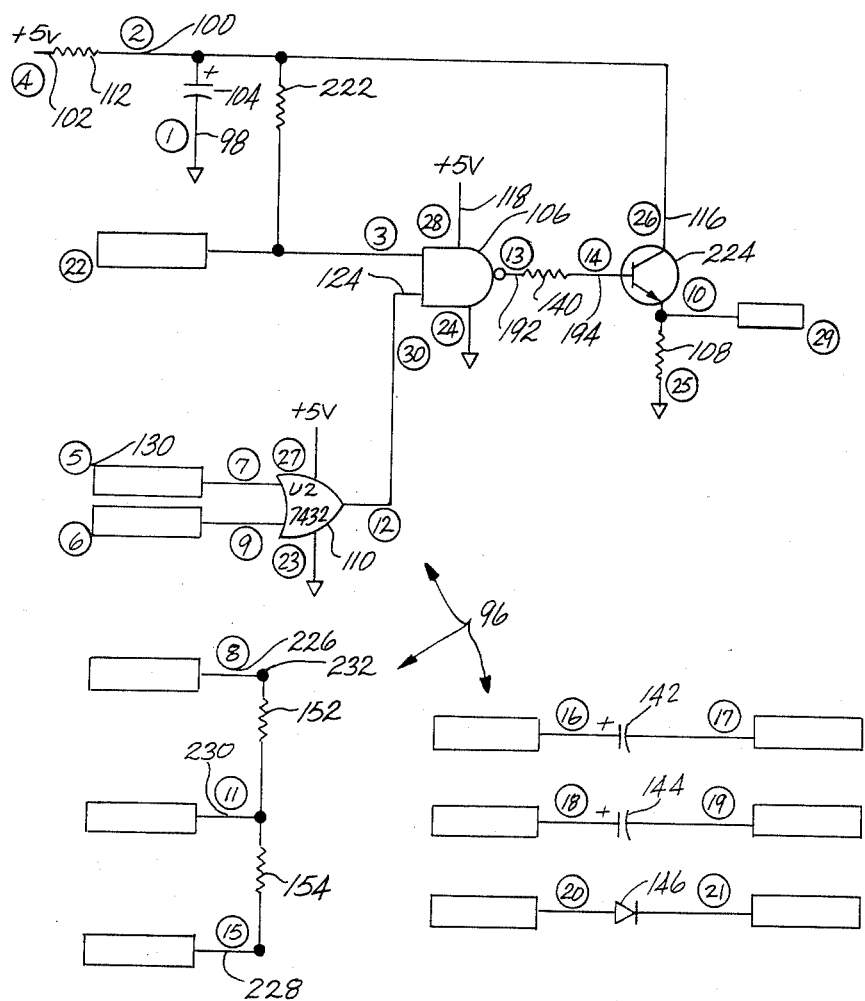
FIG. 5 is a schematic diagram of the electrical circuit on the printed wiring board of FIG. 4 for use with the method used in conjunction with the test system of FIG. 1.

The items required for building the test program list include a test system 20 including a vacuum fixturing system 64 for probing the printed wiring board, and a schematic of the electrical circuit on the printed wiring board such as that depicted in FIG. 5 or an actual printed wiring board assembly as schematically depicted in FIG. 4. The electrical circuit on the printed wiring board is manifested on the printed wiring board assembly of FIG. 4 and in the schematic of FIG. 5.

Typically, the first step in the process of generating the test program list is to determine the locations, i.e., test nodes, on conductors in the electrical circuit where tests are to be made. Accordingly, sequentially numbered test node characters are assigned. The sequence of characters are, by way of example, 1 through the "end point", where the "end point" is the highest numbered test node on the circuit board. At least one test node character is assigned to each of the different test nodes in the circuit to be tested. Initially, the user inspects a manifestation of the printed wiring board, i.e., either the actual printed wiring board assembly or the schematic (FIGS. 4 and 5) to identify and note those test nodes to which many components are directly connected. Each test node is identified in FIGS. 4 and 5 by a number in a circle.

Referring to FIG. 4, it will be seen that test node 1, on the ground conductor, is connected to resistor R6, capacitor 104, transistor 106 and transistor 110. Similarly, test node 4, on the +5 volt conductor, is connected to resistor 110, transistor 106 and resistor 112. Also, test node 2 is connected to resistor 112, capacitor 104 and transistor 224, and test node 3 is connected to resistor 22 and transistor 106. These test nodes, 1 through 4, are therefore called common test nodes in the electrical circuit of FIGS. 4 and 5 because many components are connected to each one.

The user then selects the adjacent test nodes. These are typically on the leads or conductors at opposite sides of components that are not directly connected to common test nodes. Sequentially numbered test node characters in the same sequence of test node characters are selected and are assigned to the adjacent test nodes. By way of example, capacitor 146 and resistors 142 and 144 are isolated from the rest of the circuit and adjacent test node characters 20 and 21 are assigned to the test nodes at opposite sides of capacitor 146, adjacent test node characters 18 and 19 are assigned to the test nodes at the opposite sides of resistor 144, and adjacent test node characters 16 and 17 are assigned to the test nodes at the opposite sides of resistor 142.

The end point or highest numbered test node character for the circuit is then input to the automatic test program list generator. The automatic test program list generator then generates a list for each common test node character for each measurement type. The list includes pairs of test node characters, the first character of which is one of the common point test node characters and the second character of which is the test node character for one of the other test nodes. In-circuit testers make electrical tests between two test nodes which are called "FROM" and "TO" nodes or points. In the automatic test program list generator of FIG. 1, the common test node character is referred to herein as a FROM point and the second is called a TO point. For example, for test node characters for common test nodes 1, 2 and 3, the common list generated would be (for FROM and TO nodes), 1 to 1, 1 to 2, 1 to 3, 1 to 4, ... 1 to N, 2 to 1, 2 to 2, 2 to 3, 2 to 4, 2 to 5, etc., to the end point, 3 to 1, 3 to 2, 3 to 3, 3 to 4, 3 to 5, ... 1 to N where N is the end point. The system also automatically generates an adjacent list of adjacent test node characters for each measurement type if this feature is selected. The adjacent list includes pairs of test node characters, each pair being unique and each pair including two characters which are adjacent in the sequence of characters. The test nodes identified by the test node characters in each adjacent pair are also referred to as FROM and TO test nodes. An example of pairs of test nodes in the adjacent list for FIG. 4 includes 1 to 2, 2 to 3, 3 to 4, ... N−1 to N where N is the end point. Such a common test node list and adjacent test node list are generated for each different measurement type which the user wishes tested. Even though the common and adjacent lists have been discussed as separate lists, they are integrated into a single test program list.

The measurement types include capacitance, resistance, and junction measurements. After all of the test nodes have been marked, they will be very useful to the user when he wishes to locate a particular test node during the generation of the test program list.

Figure 3:
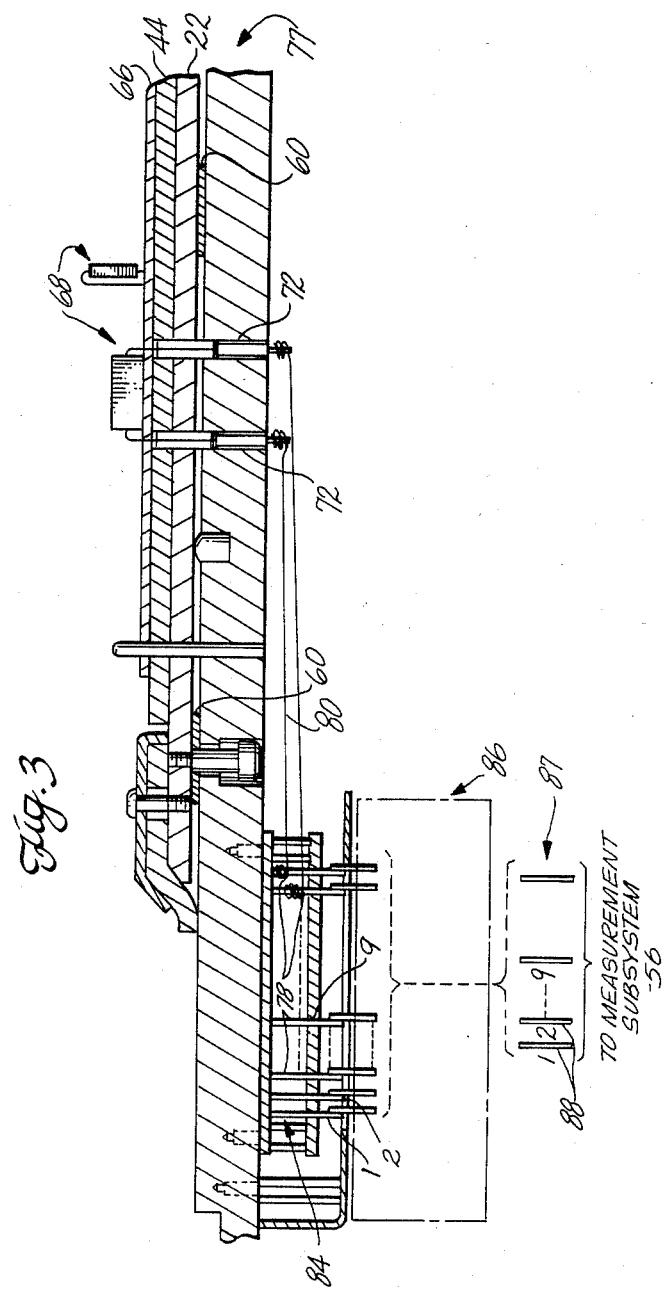
FIG. 3 is a schematic diagram of a side elevation view of the test head which forms part of the fixturing system with a printed wiring board in place.

During the program generation, a sample of the printed wiring board which is known to be good, such as board 66, is loaded into the vacuum fixture system 64 (FIGS. 1 and 3). As a pre-wiring step, each of those spring probes 72 (in the vacuum fixture) known to be connected to one of the common test nodes is connected to one of interface pins 1 through 9. Interface pins 1 through 9 are in turn connected to conductors numbered 1 through 9 respectively in conductors 87 which are connected to a measurement subsystem 56. The test system 20 is programmed so that those spring probes that are connected to test nodes 1 through 9 can be selected as common test nodes for automatic test program list generation.

The test program list as it is formed contains a row for each pair of test node characters. Each row contains the corresponding pair of test node characters and positions for other data such as nominal, high and low measurement values and an identification of the measurement type. After the test program list has been formed, the automatic test generator is ready for self learning.

The test program generator does the following: (1) for each measurement type, the generator measures the value between the test nodes identified by each pair of test node characters in the list; (2) if the resultant measured value is within the system's limits for that measurement type, the value is added to the position for nominal value, and high and low limits are computed and added to the positions for high and low measurement values. To be explained in more detail, system limits are initially contained in the system software for capacitance (time constant), resistance, and junction measurements. During the self learn operation, the value resulting from self learn for any pair of test node characters if outside of the upper and lower system limits for the corresponding row, the row is deleted automatically to thereby minimize the length of the test program list. Provision is made to allow the user to manually change nominal capacitance value, resistance value, or the junction value, if the user feels a different value is proper for a particular circuit.

Provision is also made to allow the user to inspect the circuit and add rows to the program list for any of the different measurement types, or to manually delete a row if he so desires.

Once the final test program list has been generated, the test program list can be used to control most any in-circuit tester to cause an unknown printed wiring board to be tested, provided the test program list is capable of reading the list. Preferably, the in-circuit tester is the same test system 20 depicted in FIG. 1.

Consider the hardware involved in more detail. The test system 20 includes conventional disk drives 26 and 28 for reading and writing on floppy disks indicated at 30 and 32 in FIG. 1. Disk drive 26 is referred to as the system disk drive in that the floppy disk 30 which it reads contains system software for control of the operation of the test system 20. The disk drive 28 is referred to as the program disk drive in that it reads and writes the test program on the floppy disk 32. The floppy disk 32 is a removable storage medium for the test program list that can be removed with the test program list and used in another in-circuit tester for testing an unknown printed wiring board.

The software stored on the system disk 30 includes data and program, hereinafter discussed in more detail, for controlling the overall operation of a data processor included in the test system 20.

Test system 20 also includes a printer 34 for printing out test program data, system status and test results (FIG. 1). The keyboard and display terminal 21 is the interface with the user and includes a conventional video display terminal 22 which includes its own internal random access memory (RAM) 23 and a cathode ray tube (CRT) 38. Keyboard and display terminal 21 also include a conventional computer terminal keyboard 40 containing numbered and lettered control and carriage return keys hereinafter described.

As a matter of convenience, pressing and holding the control key and actuating the B key will be referred to as actuation or entry of control B key; pressing and holding the control key and actuating the C key will be referred to as actuation or entry of the control C key; and pressing and holding the control key while actuating the L key will be referred to as actuation or entry of the control L key.

Figure 2:
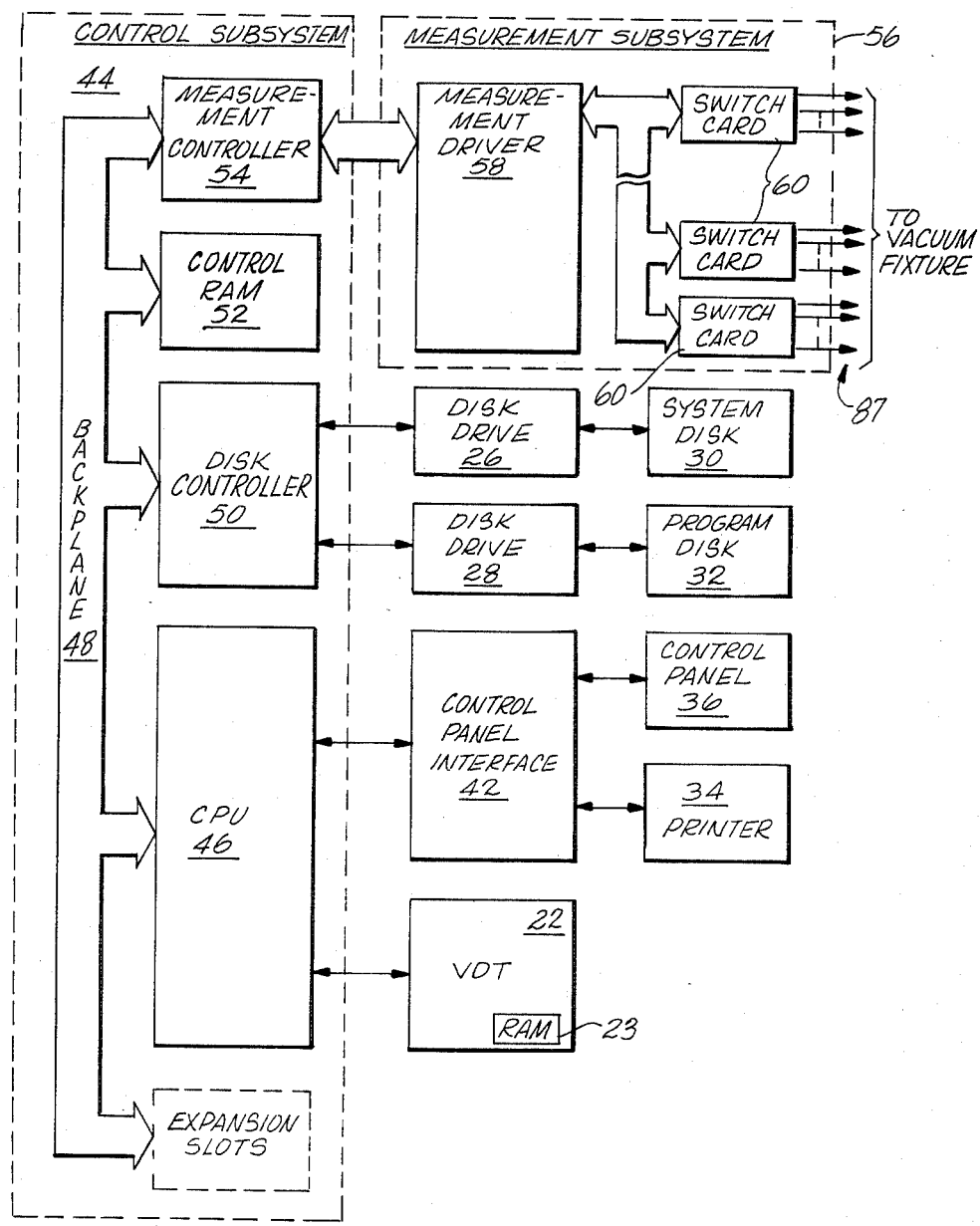
FIG. 2 is a schematic diagram of the test system and video display terminal of FIG. 1.

Refer now to the schematic and block diagram of FIG. 2. Test system 20 includes control panel interface 42, typical in the computer art, for interfacing the printer 34 and the control panel 36 with the balance of the test system 20.

Test system 20 also includes a control subsystem 44 comprising a central digital data processing unit (CPU) 46 for controlling and receiving input from the video display terminal 22, the printer 34 and the control panel 36. The CPU 46 is interconnected through a back plane 48 to a disk controller 50, a memory storage in the form of a control RAM 52, and a measurement controller 54. The disk controller 50 serves to control disk drives 26 and 28 through signals from the CPU 46. Control RAM 52 is the principal storage device for the test system 20 while the test system 20 is operating. The measurement controller 54 serves to control through input and output signals a measurement subsystem 56 comprising a measurement driver 58 and a plurality of switch cards 60. Such a measurement subsystem is well known in the art, an example being the H-P Digital LCR Meter, Model 4262A, disclosed in pages 88 and 89 of the book entitled "Electronic Instruments and Systems" published 1980 by Hewlett Packard, the content of which is incorporated herein by reference. The above described elements of hardware are well known in the art.

Consider the printed wiring board 66 in FIG. 4 and the corresponding schematic diagram in FIG. 5. The printed wiring board 66 has individual electronic components, some of which are shown at 68, interconnected and connected to pads 90 by conductors or traces 74. The conductors or traces 74 on one side of the board are shown by solid lines and those on the other side of the board are shown as broken lines. Pad 92 is a pad for a +5 volt power supply, and pad 94 is connected to ground potential. It will be understood that there may be other power supply pads and other ground potential pads. For example, another pad may be for −5 volts.

Figure 8:
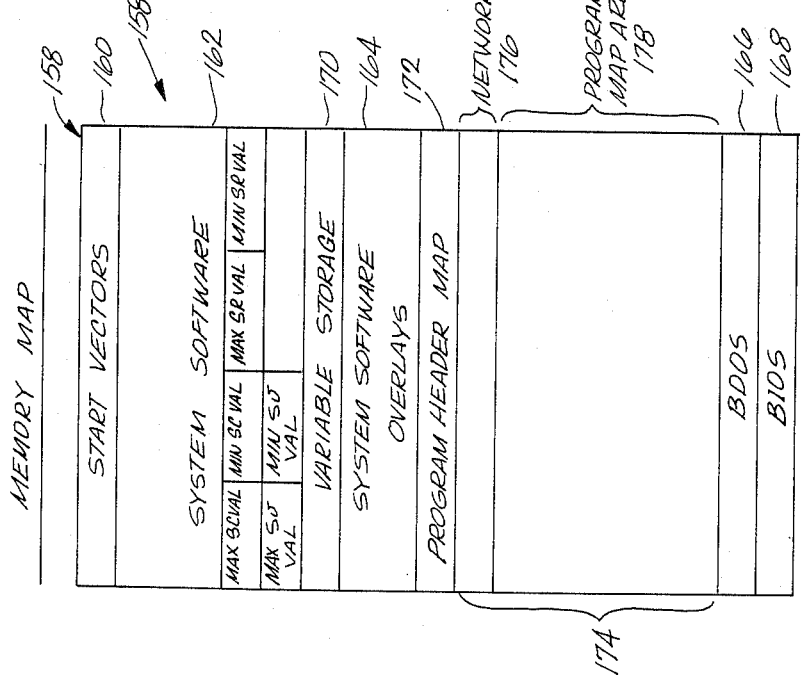
FIG. 8 is a schematic diagram of the memory map stored in the random access memory (RAM) shown in FIG. 2.
Figure 12:
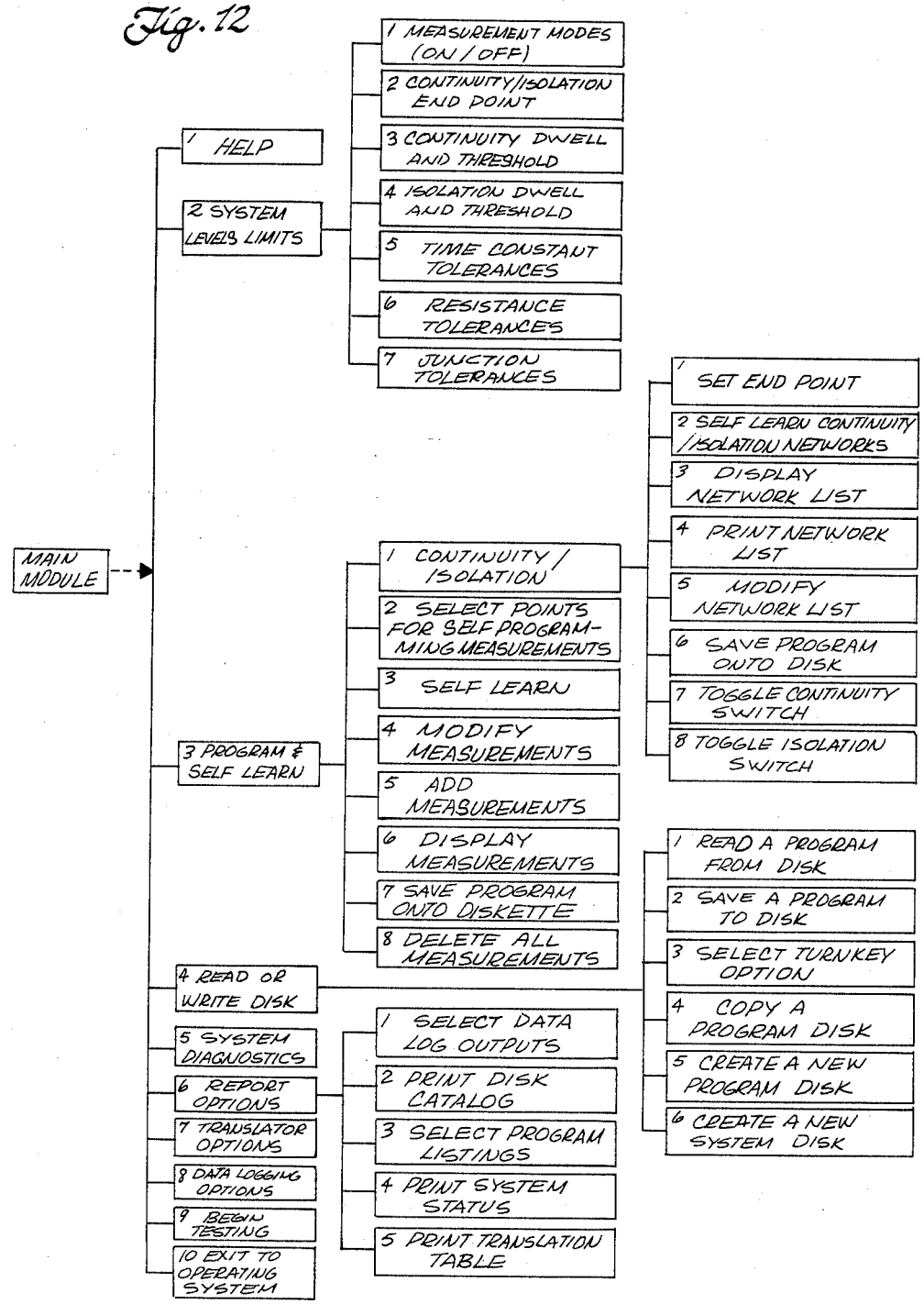
FIG. 12 is a general block diagram showing the major steps involved in the method according to one embodiment of the present invention.

Consider now the automatic program list generation method depicted in FIGS. 12-48 using the test system and terminal of FIG. 1 and the memory maps of FIGS. 8-11. FIG. 8 depicts a memory map 158 for software stored in various memory locations in control RAM 52. The memory map 158 includes storage for the system software and other software executed or otherwise used by the CPU in carrying out the method. Included are start vectors in location 160, system software in memory location 162, system software overlays and fields called BDOS and BIOS in memory locations 166 and 168, and such software. BDOS is an acronym for basic disk operating systems and enables the CPU to communicate with the disk drives. BIOS is an acronym for basic input output systems and enables the CPU to control the input output operation to the video display terminal on the keyboard. Examples of BDOS and BIOS are disclosed in the book entitled "CP/M Operating System Manual" published by Digital Research, July 1982. Location 170 is a variable storage for storage for the creation of the common test point flag map of FIG. 10 and for the miscellaneous variables used in the test program list generation method.

Figure 9:
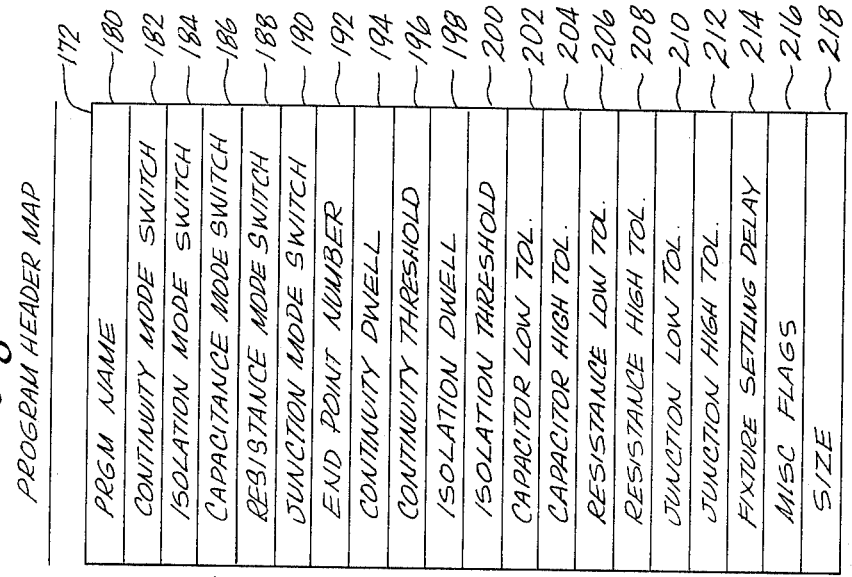
FIG. 9 is a detailed diagram of the program header map shown in the memory map of FIG. 8.

Program header map 172 is for storing variables and associated data for use in display functions for the video display terminal 22 and for test program list generation. A detailed diagram of the program header map 172 is shown in FIG. 9. Program storage area 174 is for storing the results of the test program list generation steps. Program storage area 174 is separated into two memory areas, a network list area 176 and one for the measurement list area 178. The network list area 176 is used in conjunction with a test program list generation method for testing circuit traces and generating a program for testing shorts and opens. Such a method is described in Long, U.S. Pat. No. 4,114,093. The program storage map area 178 is for storing a test program list as it is generated and the format is shown in detail in FIG. 11.

Initially, default values are inserted for the data associated with the variables in program header map 172. These default values are obtained by the CPU from the system disk 30. The common point flag map (FIG. 10), the program storage area 174, and its measurement list area 178 will be discussed hereafter in more detail with regard to the particular steps applicable to the storage areas.

Figure 13:
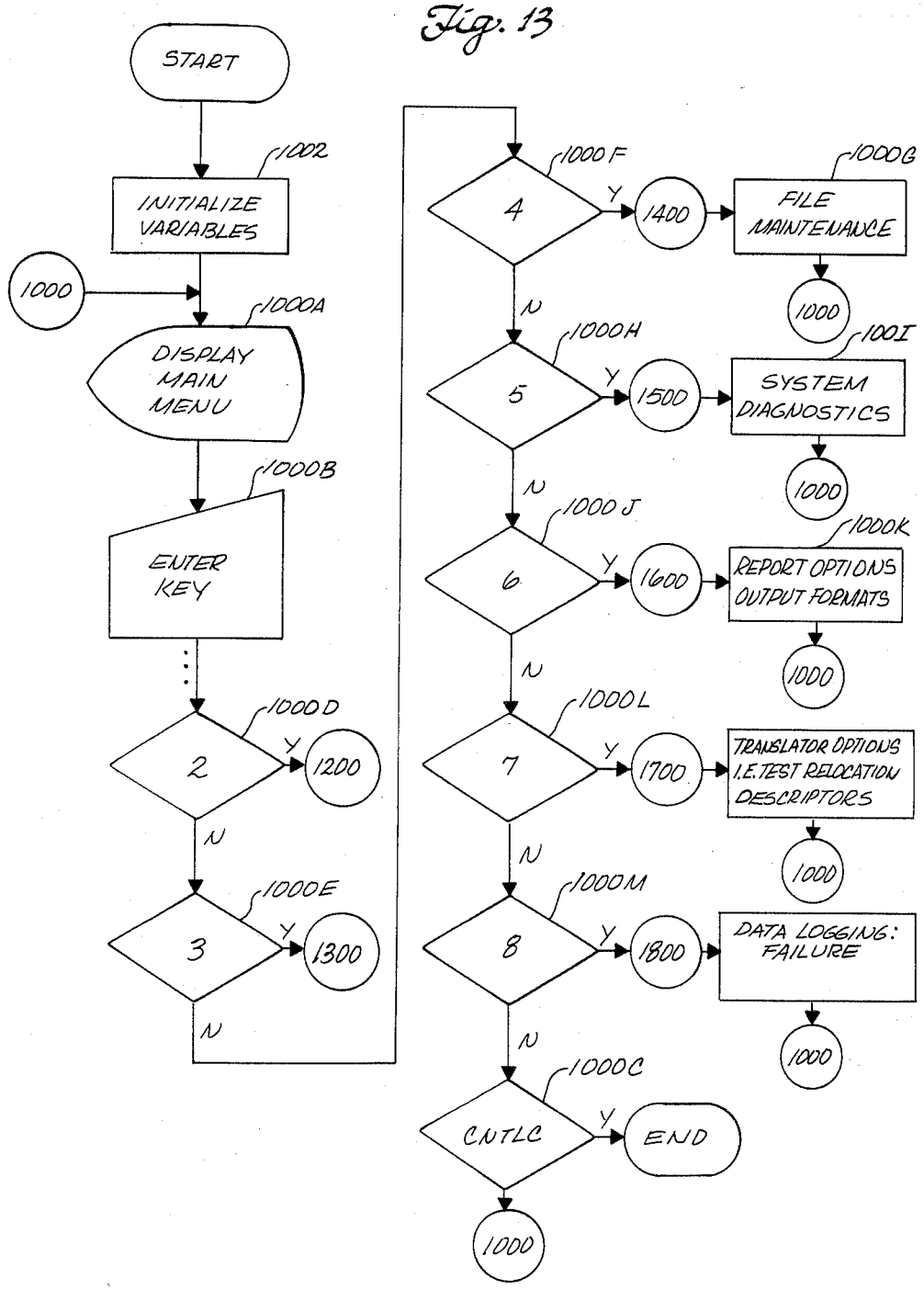

Refer now to the flow diagrams of FIG. 13. After a conventional start-up step, CPU 46 initializes the variables in variable storage area 170, program header map 172, and the program storage area 174 (FIG. 8) at block 1002. Initialization includes setting the registers or memory locations in the common point flag map of FIG. 10 to zero, and putting default values (to be explained) in each of the entries in the program header map 172. The default values are then maintained in the program header map until such time as they are changed by the user (as will be explained).

The data in program header map 172 is then accessed by the CPU 46 in order to display the headings or variables and the default values associated therewith at the CRT 22. Such a display is substantially as shown in the status display above the broken line of Table III. The status display, by way of example, is always displayed on the CRT 22 above a current operation display area during all displays.

The main menu (Table III) is displayed during block 1000A. The main menu includes the status display and, below, a current operating display. The status display of the main menu displays visual representations of the digitally coded values stored in the program header map areas 200–212 (FIG. 9). Digitally coded signals are stored in each of these storage areas which cause the CPU to display a visual representation of the signal on the status display. The default values stored in these areas are shown visually in the status display of Table III.

Each of the values in memory areas 194–212 is changeable under user control. The threshold values give the nominal permissible time periods for continuity and isolation tests. The percentage (%) values give the high and low permissible tolerances or percentage deviation from a nominal value.

The remaining variables in program header map 172, as shown in FIG. 9, are fixture settling delay 214, miscellaneous flags 216, and size 218. These variables are used for data recordation and maintenance of appropriate data.

The status display, as shown in Table III, is constantly shown on CRT 22 and is not updated until specific values for the variables are changed by the user. For simplicity, the status display will be deleted from most subsequent tables unless a change to the status display is made. The current operation display is updated more often than is the status display and is shown in subsequent tables.

The current operation display typically constitutes a display of prompts to the user requesting information input and also a display of current operating data used by the CPU 46.

The lower right corner of each of the tables contains a number corresponding to the number of the block of the flow charts that causes the display.

Assume now that the operation of the CPU is advanced to the display main menu block 1000A (FIG. 13). The data processor now causes the main menu display depicted in Table III to be shown on the CRT.

As indicated in Table III, the current operation display portion of the main menu has nine different prompts numbered 1 through 9. The user can select any one of these by actuating the correspondingly numbered key on the keyboard of the CRT unit. With reference to the flow diagram of FIG. 13, it will be seen that there are decision blocks numbered 1 through 9. These correspond to rows or items numbered 2 through 9 on the main menu display. Block 1 is omitted for "1. Help" on the main menu since an understanding of this is not required for a complete understanding of the present invention.

During the enter key block 1000B of the flow (FIG. 13) the user can select any one of the items indicated in the main menu by striking the correspondingly numbered key on the keyboard. This will cause the correspondingly numbered decision block 1000D, E, F, H, J, L, M, or N to be entered and the operation depicted going out to the right of the decision block to be entered in order to carry out the steps of the program indicated on the main menu.

Assume initially that the operator wishes to perform the "2. system levels & limits" operation. The user strikes key 2 on the keyboard, causing block 1000D and circle 1200 of the flow to be entered to the beginning of the set system levels & limits flow at FIG. 14.

Before considering the operation of the set system levels & limits flow, it should be noted that keys 3 through 9 would cause the correspondingly numbered decision block to be entered and the steps to be followed proceeding out to the right of the decision block. In the process, the operator may hold the control key and strike letter C key to actuate the control C key (see above definition), causing the operation in FIG. 13 to be executed.

If a key other than 1 through 9 is entered or other than the control C key, then the system will merely return to blocks 1000A or 1000B of the flow.

Figure 14:
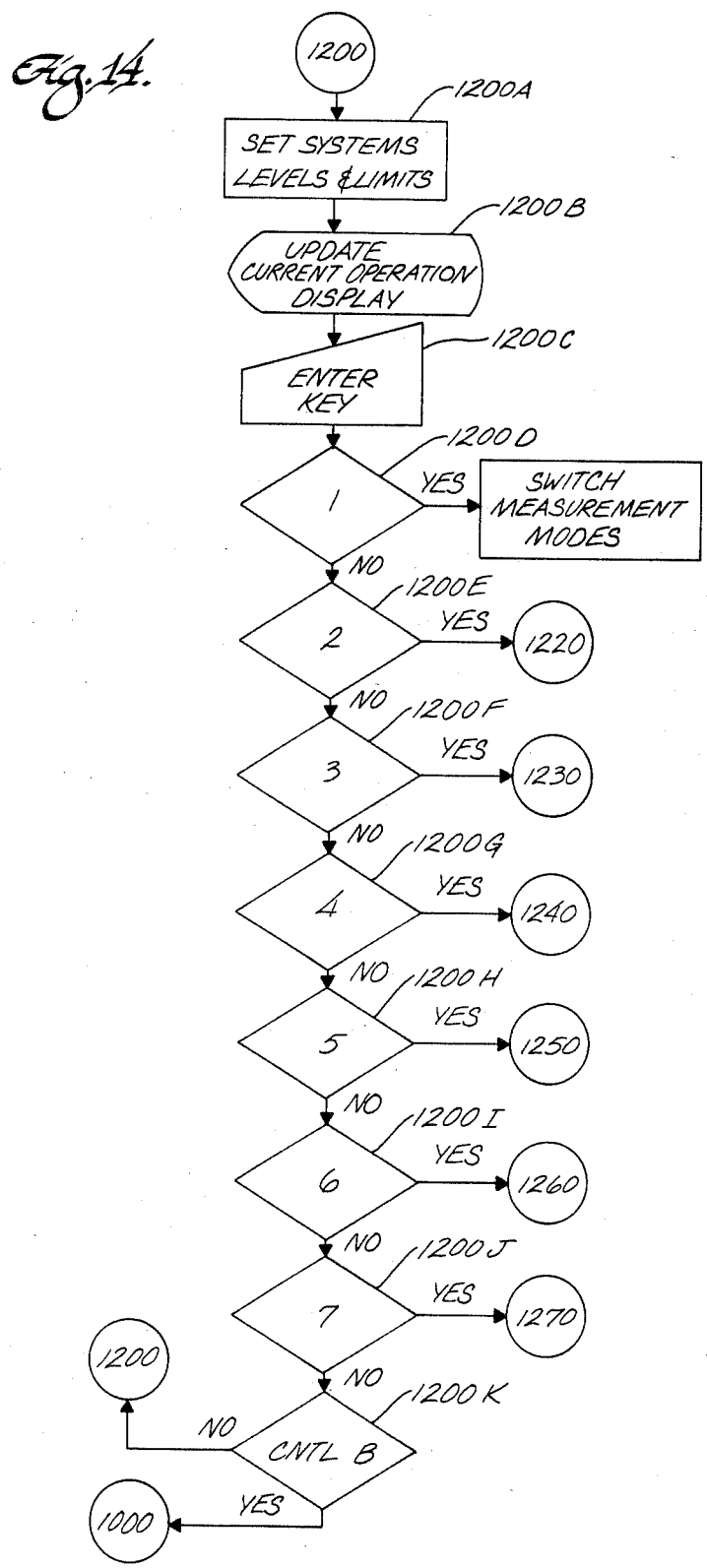

Assume now that during block 1000B (FIG. 13), key 2 is entered and therefore the CPU enters blocks 1200A, 1200B and 1200C of the set system levels & limits flow of FIG. 14. During block 1000B, the CPU causes an update of the current operation display so that the system levels & limits current display depicted in Table IV is now seen on the CRT. The system levels & limits display has prompts numbered 1 through 7 for selection by the user. Actuation of the key on the keyboard with the same number as that depicted on the display will cause the operation depicted adjacent the number on the display to be entered.

Considering the flow of FIG. 14 in more detail, actuation of one of the numbered keys 1 through 7 during block 1200C will cause the correspondingly numbered decision blocks 1200D through J to be entered, followed by which the path out of the circle to the right is followed to another part of the flow in one of the other Figures. The numbers in the circles correspond to the circled entry to the flows in one of the other Figures.

If a key is entered other than 1 through 7 and other than the key control B, then the operation merely circles back to the beginning of the set system levels & limits flow via circle 1200C. If the key control B is actuated, it means that the system is to go back to the previous menu (see Table IV) and circle 1000 is followed out of block 1200K back to the display main menu block 1000A (FIG. 13).

Generally, the method for setting system levels & limits is a process whereby the user can change the values as they exist in the program header map 172 of FIG. 9. With such changes, the status display (depicted at the top of Table III) is simultaneously updated.

If during block 1200C the user enters key 2 for "2. Continuity/isolation end point", the decision block of 1200E is executed. This block corresponds to program sublevel No. 2 of level 2 in FIG. 12. The CPU 46 then executes block 1220A in FIG. 16 where the continuity and isolation end point is to be set. This is normally the highest numbered test node on the circuit for which a test program list is generated. The CPU executes block 1220B and updates the current operation display according to Table VI. The user is now prompted to enter the end point number value chosen from the range of numbers 2-2048. 2048 is the upper limit in this particular embodiment but it is understood that the number could be higher or lower within the scope of the present invention.

The user keys in the end point number value during block 1220C and during block 1220D the CPU updates the program header map by entering a digitally coded value, representing the number keyed in by the user, into the program header map 172 in the end point number area 192 (FIG. 9). The CPU, during block 1220E, updates the status display as shown in Table VI to visibly display the value of the end point in area 192 to the right of the words "End Point". As an example, the end point is chosen to be 30, to correspond with the example circuit shown in FIGS. 4 and 5 and is shown in Table VI. The CPU then returns to the set system level & limits blocks 1200A, 1200B and 1200C (FIG. 14) via circle 1200 and the system levels & limits display of Table IV is now displayed on the CRT.

Assume that during block 1200C the user enters key 3 corresponding to "3. Continuity dwell and threshold" in Table IV. This will allow the user to change the continuity dwell and continuity threshold values in memory areas 194 and 196 of FIG. 9. CPU 46 then executes the steps beginning with set continuity dwell and threshold block 1230A (FIG. 17). These program steps correspond to sublevel No. 3 of level No. 2 in FIG. 12. The CPU during block 1230B updates the current operation display.

Table VII shows a prompt by the CPU to the user to enter a letter on the keyboard for changing the digitally coded value of the continuity dwell time 194 in the program header map 172 (FIG. 9) and the value displayed adjacent to "Continuity:Dwell=" in the STATUS display (Table III). According to Table VII, the user has ten letter key selections labeled A through J from which to choose ten different dwell times. If the user desires no change to be made, the user enters the carriage return key at which time the CPU exits block 1230D via circle 1231 and enters block 1231A (FIG. 18) directly.

Assume, during block 1230C (FIG. 17), that the user desires to change the continuity dwell value to 500 microseconds. The user enters the A key which corresponds to "A. 500 microseconds" in Table VII. The CPU then goes to blocks 1230C, 1230E, 1230F and stores a digitally coded value representing 500 microseconds into the continuity dwell area 194 of the program header map 172 (FIG. 9) and updates the Status Display to show "500 microseconds" adjacent to "Continuity:Dwell=", as indicated in Table VI. The operation then proceeds to block 1231A via circle 1231 (FIG. 18) where the "threshold=" value to the right of "continuity" may be changed.

FIG. 17 has decisional blocks A through J, one for each of items A through J in Table VII. Connected to each of the decisional block is an update header block which in turn is connected to an update status display block and the output of the latter goes back via circle 1231 to block 1231A (FIG. 18). For an example see the B decisional block 1230H connected to update decisional block 1230I which is connected to update status display 1230J and also blocks 1230K, 1230L and 1230M for the J decisional block. The corresponding blocks for decisions C-I are not shown in detail, are indicated by dotted line for simplicity but will be understood to be present. To select one of the other continuity dwell times indicated in Table VII, to have the digitally coded value representing such dwell time stored in the continuity dwell field 194 and then displayed adjacent to "Continuity:Dwell=" in the Status Display (Table III), one need only to actuate the desired letter key indicated for the desired value in Table VII and the operation is automatically carried out by the CPU in substantially the same manner as described for the A key. After the CPU stores the new value in field 194, the new value is read from field 194 and is displayed under control of the CPU on the status display.

Assume that exit via circle 1231 is taken from one of the update status display blocks (i.e., 1230G) or from block 1230D and the flow of FIG. 18 is entered for updating the threshold value for continuity. During block 1231A the video display terminal 22 is updated and shows the current operation display depicted in Table VIII. This prompts the user to enter a key for changing the continuity threshold value displayed adjacent "Continuity:Threshold=" in the status display (Table III). Assume the user wants to change the continuity threshold to 5 ohms. The user enters the A key (see Table VIII) so that the decisional block 1231F, the update program header block 1231G and the update status display block 1231H are entered. The program header map is updated during block 1231G by storing a digitally coded value representing 5 ohms into continuity threshold 196 area (FIG. 9). Furthermore, the status display is updated during block 1231H to display, adjacent "Continuity:Threshold=", the value 5 in place of the value 10 (Table III). The CPU then returns via circle 1200 to block 1200A (FIG. 14) of the set system levels & limits flow.

A similar decisional block, update display header block, and update status display block to 1231F, 1231G and 1231H is provided for each of the other letter keys B-J indicated in the display of Table VIII. Only those blocks for keys A, B and J are specifically shown, the others being indicated by dotted lines. Actuation of one of letter keys B-J during block 1231B will cause the blocks corresponding to the letter key to be entered where the digitally coded value representing the corresponding value shown in Table VIII is stored in the continuity threshold 196 area and the corresponding value is displayed in the status display. If during block 1231B the user strikes the carriage return key instead of a letter key A-J, decisional block 1231I and circle 1200 are followed to exit the flow of FIG. 18 to re-enter the set system levels & limits flow of FIG. 14 where the system levels & limits display (Table III) is re-displayed. Similarly the circle 1200 will be followed out of each of the update status display blocks of FIG. 18 back to re-enter the set system levels & limits flow of FIG. 14.

Assume now during block 1200C (FIG. 14) while the set system levels & limits display (FIG. IV) is displayed that the user enters key 4 corresponding to "4. Isolation Dwell and Threshold" in Table IV. The CPU will branch via the decisional block 1200G and circle 1240 to the set isolation dwell and threshold flow of FIG. 19 and blocks 1240A, 1240B and 1240C. During block 1240B (FIG. 19) the isolation dwell display of Table IX is displayed on the CRT. The value to be updated is displayed to the user in the status display adjacent to "Isolation:Dwell=". Table III depicts a value of "500μ" as an example. The operation of the flow of FIG. 19 is essentially the same as for FIG. 17. However, when a letter key is struck, a digitally coded value representing isolation dwell time is stored in isolation dwell area 198 of the program header map (FIG. 9) and the value is displayed adjacent to "Isolation:Dwell=" in the status display (Table III). The values stored and displayed, corresponding to keys A-J, are depicted in the screen of Table IX. The program flow then goes to the update isolation threshold flow of FIG. 20 via circle 1241 after the program header and display are updated or if the carriage return key is actuated.

During the update isolation threshold flow of FIG. 20 the display of Table X is displayed and the digital coded value in the isolation threshold 200 is updated to one of the values shown in Table X adjacent the letter of the key which the user actuates. Also the value displayed adjacent to "Isolation:Threshold=" in the status display is updated to display the same value. The operation is essentially the same as that described with reference to the flow of FIG. 18 with the differences noted above. After the updates take place, or if the carriage return key is struck instead of a letter key, the operation exits via circle 1200 and returns back to the set system levels & limits flow of FIG. 14.

Return to block 1200C of the set system levels & limits flow of FIG. 14 and assume that the user now enters key 5. The CPU proceeds through blocks 1200G to block 1250A of the set low & high capacitance (time constant) tolerances flow in FIG. 21. The CPU now begins execution of sublevel 5 in level 2 of FIG. 12. The CPU updates the current operation display during block 1250B so the time constant tolerances display is shown on the CRT (Table XI).

The display has 9 percentage values each adjacent a different one of letters A through I. The letters indicate the key to actuate on the CRT to select the desired low tolerance time constant. The set low & high capacitance tolerance flow causes the capacitor low tolerance area 202 and the "Time Constant:Tolerances=" values to be updated for the low or negative tolerance value selected by the user on the keyboard. The display prompts the user to enter a key for the desired percentage for the low capacitance tolerance. For example, if the user desires to change the low capacitance tolerance to −10%, the user enters the A key during block 1250C causing decisional block 1250D to be entered. During the update program header block 1250E the program header map 172 is updated by storing a digitally coded value representing 10% into the capacitor low tolerance area 202 (FIG. 9). During the update status display block 1250F, the status display is updated by changing the −40%, shown in Table I, to −10%. The CPU then proceeds via circle 1251 to block 1251A of the flow in FIG. 22 where the high capacitance tolerance can be changed.

It is to be understood that the user can enter, during block 1250C, any of the other letters shown in Table XI and essentially the same steps would be executed, causing a digitally coded value, corresponding to the letter key, to be stored in capacitor low tolerance area 202 (FIG. 9) and to be displayed in the first position following the "Time Constant:Tolerances=" of the Status Display (Table III).

A decisional block, an update program header block and an update status display block are provided similar to 1250D, 1250E and 1250F for each of the letter keys A through I. For example, actuation of key B causes an update decisional block, an update program header block and an update status display block to be entered to store a "−15%". If a carriage return is entered, the CPU continues to block 1251A (FIG. 21). Only the decisional blocks and the associated update program header and update status display blocks are shown for the letters A, B and I, the ones for C through H being indicated by dotted line. However, the operation here for each letter key is essentially the same except that the value for the actuated letter key (see Table XI) is stored in the capacitor low tolerance area 202 and a visual representation of the stored value is displayed in place of the first value following "Time Constant:Tolerances=" in the status display (Table III).

The flow of FIG. 22 is for changing the second or + "Time Constant:Tolerances=" value in the status display and in the capacitor high tolerance area 204 of the program header map (FIG. 9). The updated operation display is shown in Table XII. This display prompts the user to enter a letter key corresponding to one of the letters A to P for a new high capacitance tolerance. Actuation of one of letter keys A-P during block 1215B causes one of sixteen decisional blocks A-P (FIG. 22) to be entered followed by an update program header block and an update status display block where the digitally coded value (shown in Table XII) corresponding to the actuated letter key is stored into the capacitance high tolerance area 204 of the program header map (FIG. 9) and the second or + value following "Time Constant:Tolerances=" value in the status display is updated to the same visual value. The operation during these blocks is, except as discussed above, essentially the same as for the previously described flow of FIG. 21 and therefore will not be repeated. However it should be noted that after the update status display block, following each decisional block and upon actuation of the carriage return key, the operation returns via circle 1200 to the set system levels & limits flow of FIG. 14. Only the decisional block, the update program header block and the update status display block for the letter keys A, B and P are shown, the ones for C-O being indicated by dotted lines.

Assume during block 1200C of the set system levels & limits flow (FIG. 14) that key 6 is entered on the keyboard. The CPU then goes to block 1200I and then to block 1260A of the set low & high resistance tolerance flow. During block 1260B the current display for resistance tolerance (Table XIII) is displayed on the CRT and prompts the user to enter a letter key corresponding to the desired percentage value of resistance depicted adjacent to the letters. The user now enables the CPU to change the resistance low tolerance area 206 and resistance high tolerance area 208 in program header map 172 and update the low and high values adjacent to "Resistance-Tolerances=" in the status display. The low resistance tolerance is changed in a manner similar to that for the capacitance low tolerance in the steps of FIGS. 20 and 21 in conjunction with Table XI. However, in the flow of FIG. 23, the program header 172 is updated by changing the digitally coded resistance low tolerance 206 (FIG. 9) to the value depicted in Table XIII adjacent the letter of the key that is actuated. Also the high or + value adjacent "Resistance:Tolerances=" in the status display (Table III) is set to visually display the same value.

FIG. 23 shows a decisional block, an update program header block and an update status display block for each of letters A through I (similar to FIG. 20) for changing or updating the program header and the status display to the value in Table XIII corresponding to the letter key that is actuated. Only the blocks for letter keys A, B and I are shown, the others being indicated by dotted line for simplicity.

After the update status display block for each letter key or after block 1260J, if a carriage return key is actuated, the flow continues via circle 1261 to the flow of FIG. 24 where the high resistance tolerances are updated.

During the flow of FIG. 24, the resistance tolerance display of Table XIV is displayed during block 1261A to prompt the user to select one of the letter keys A-P indicated on the display. The flow of FIG. 24 has a decisional block, an update program header block and an update status display block for each of letter keys A-P, only the ones for blocks A, B and P being shown, the others being indicated by dotted line, and operates essentially the same as the similarly named blocks in FIG. 20. However, actuation of one of keys A-P causes a digitally coded value representing the corresponding resistance value in Table XIV to be stored in the resistance high tolerance area 210 and the same value to be displayed in place of the second or + value adjacent "Resistance:Tolerance=" in the status display (Table III).

Following the update display block for each letter key and in the event the carriage return key is actuated, the operation returns via circle 1200 to the set system levels & limits flow of FIG. 14 where the system levels & limits display of Table IV again appears on the CRT.

Assume now, during the set system levels & limits flow of FIG. 14, that the user strikes key 7, indicating that the junction tolerances are to be set (see Table IV). Decisional block 1200J is taken through circle 1270 to the set low & high junction tolerance flow of FIG. 25 where blocks 1270A, 1270B and 1270C are entered. The low junction tolerances display of Table XV is now displayed, giving sixteen options, identified by one of letters A through P. The display of Table XV prompts the user to enter one of the lettered keys on the keyboard to select the corresponding percentage tolerance. Actuation of one of the lettered keys during block 1270C causes one of the decisional blocks lettered A through P to be entered, followed by an update program header block and an update status display block. Only the decisional block, update program header block and update status display block for program keys A, B and P are shown, the others being indicated by dotted line but understood to be present and the ame as those shown.

After a letter key is struck the update program header block causes the percentage corresponding to the entered letter key (Table XV) to be stored into the junction low tolerance area 210, (in digital form) and the update status display causes a visual representation of the stored value to be displayed in the first position following the "Junction:Tolerances=—" of the status display (Table III). The flow in FIG. 25 is essentially the same as the set low tolerance flow for the time constant (capacitance) tolerances flow described hereinabove.

Following the update status display, following each decisional block and in the event a carriage return key is struck, an exit is taken from the flow of FIG. 25 to the set high junction tolerance flow of FIG. 26. During blocks 1271A and 1271B, the high junction tolerance display of Table XVI is displayed, prompting the user to enter any one of the sixteen letter keys A through P for selecting the high tolerance value. Similar to the other flows, once a letter key is struck, a decisional block, an update program header block and an update status display block corresponding to the letter key that is struck, are entered, thereby storing the value corresponding to the letter key into the junction high tolerance area 212 and causing the "Junction:Tolerances=" ...+" value of the status display to display the updated value.

Following the update status display for any decisional block and in the event a carriage return key is struck, the CPU exits the flow of FIG. 26 back to the set system levels & limits flow of FIG. 14 via circle 1200.

Assume now that the operation of the system is in block 1200C of the set system levels & limits flow of FIG. 14. The user may terminate this operation by entering control B which will cause the system to exit the decisional block 1200K back to block 1000A of the flow of FIG. 13 where the main menu (Table III) is again displayed and the system waits in block 1000D for another key to be entered. Assume now that during block 1000B, the operator enters key 3, causing decisional block 1000E to be followed through circle 1300 to the program and learn flow diagram of FIG. 27. Blocks 1300A, 1300B, and 1300C are sequentially entered. During block 1300B, the current display is updated to that depicted in Table XVII. These programs are entered for producing the test program list and also self-learn nominal values to complete the production of the test program list. If at this point the user wishes to return to the main menu, the display prompt also indicates that a control B may be entered which will cause decisional block 1300O to be followed through circle 1000 back to the flow of FIG. 13 and allow a new main menu selection to be made.

Selections 1 through 8 depicted in Table XVII correspond to the program flow blocks 1 through 8 following the "3. Program and self learn" blocks of FIG. 12. The numbered key corresponding to the number of the desired program is entered by the user, which will then cause the CPU to branch through the correspondingly numbered decisional blocks 1300D, 1300E, 1300F, 1300G, 1300H, 1300I, 1300K, or 1300M, to the program which will cause the selected operation to take place.

The user now loads a printed wiring board such as board 66 into the vacuum fixture system 64 of FIG. 1, causing various test nodes on the printed circuit board to be brought into contact with spring probes 72 (FIG. 3) and thus connected through conductors 80 through separate interface pins 84, through separate conductors 87, back to the switch cards 60 in the measurement subsystem 56 (see FIGS. 3 and 2). At this point the CPU as well as the other parts of the system depicted in FIG. 2 are ready to conduct the continuity/isolation program generation, select common and adjacent test node networks for each of the different measurement types (capacitance, resistance, and junction), self learn and modify measurements tasks.

Assume that the user decides to create a continuity/isolation program. One key on the keyboard will be actuated and will cause decisional block 1300D (FIG. 27) to be followed through circle 1310 to the program continuity and isolation block 1300N. The CPU will then conduct a program generation process, testing for continuity and isolation as described in the above referenced Long patent. The CPU unit, during this operation, operates in sublevel 1 of level 3 in the flow of FIG. 12. In the process, continuity and isolation tests are conducted between various test nodes on the printed wiring board 66, thereby generating a program which is stored into the network list area 176 of the program storage area 174 (FIG. 8).

After completion of the program continuity and isolation program generation block, circle 1300 is followed back to the beginning of the program and learn flow diagram and the system awaits the next key entry in block 1300C.

Figure 28:
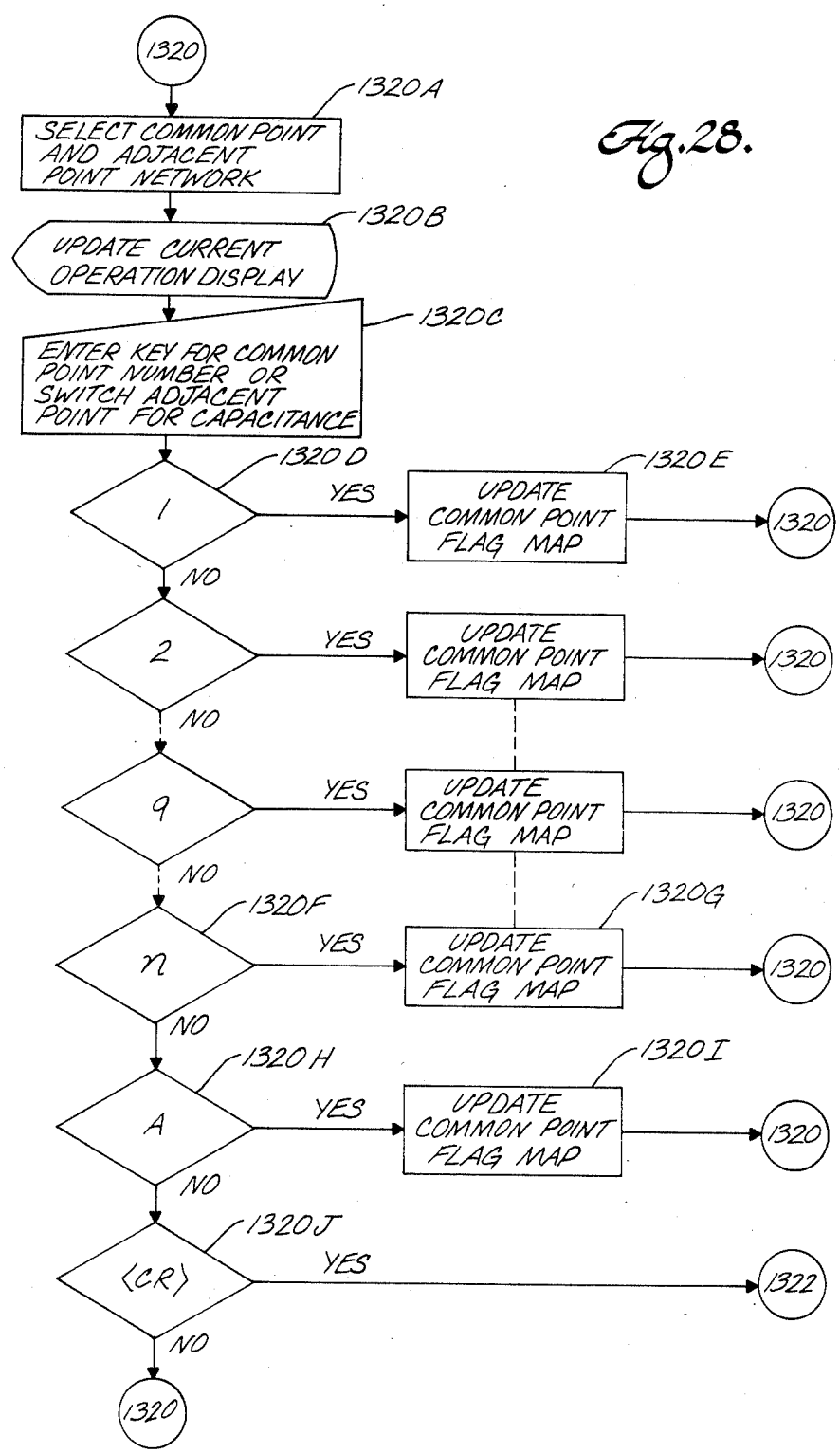

Assume now that the user enters key 2 to cause the selection of the common and adjacent networks program. Actuation of key 2 causes the CPU to follow the decisional block 1300E through circle 1320 to the select common point number and adjacent point network flow in FIG. 28. Flow blocks 1320A, 1320B and 1320C are sequentially entered and, during block 1320B, the current operation display depicted in Table XVIII is displayed. The purpose of the flow of FIG. 28 is to permit the user to identify the common test nodes which will be used for self learning capacitance (time constant) and to indicate whether adjacent test node program list generation is to be conducted for capacitance (time constants). To select a common test node the user merely actuates one of the numbered keys 1 through 9.

Assume the user actuates the 1 key during block 1320C of FIG. 28. The CPU will then pass through decisional block 1320D to the update common point flag map 1320E in FIG. 10. To this end the CPU during block 1320E sets coordinate C,1 of the common point flag map "on". Subsequently the CPU goes through circle 1320 back to blocks 1320A, 1320B and 1320C. During block 1320B, the CPU, responsive to the 1 bit in coordinate C,1 of the common point flag map, will change the 1 in the time constant row of Table XVIII to *1*. The asterisk is used to indicate that test node 1 on the printed wiring board 66 is to be a common test node.

The user may continue and select any of the other test nodes 2 through 9 as a common test node in a similar manner to that described above for test node 1. A decisional block such as 1320D and an update common point flag map block such as 1320E is provided for each of the different numerals 1 through 9. It is understood that similar blocks are provided for numerals 3 through 8 as indicated by the dotted lines. Actuation of any one of the numeral keys 2 through 9 will cause the corresponding decisional block to be entered followed by the corresponding update flag map block, pursuant to which the CPU will set the corresponding flag in row C of the common point flag map (FIG. 10) "on". Thus entering key 2, 3, 4, 5, 6, 7, 8, or 9 will cause the flag at the correspondingly numbered columns of row C in the common point flag map to be set "on" by the CPU. After entry of such key the operation will recycle back through blocks 1320A, 1320B and 1320C, during which the CPU will cause the display of Table XVIII to be updated.

Assume that the user wishes a time constant program to be generated for the adjacent test nodes. In this case during block 1320C, the user enters the A key which will cause decision block 1320H to be entered followed by update common point flag map block 1320I. The CPU during this operation then sets the flag at column A of row C in the common point flag map (FIG. 10) "on". When the system returns to blocks 1320A, 1320B and 1320C, the display of Table XVIII will be updated by showing a *A* in the time constant row.

It will be noted that only a limited number of common test nodes are allotted since there are usually only a limited number of common test nodes in any given printed wiring board. However it should be understood that one may arrange the system disclosed by providing the facility to allow the user to enter the number of each of the common test nodes he wishes for his particular printed wiring board. The number could be stored in memory and then utilized for time constant (capacitance) resistance and junction program generation similar to that described hereinafter.

When the user has selected all the common test nodes desired for use in the self-learn capacitance portion of the program list generation, the carriage return key will be pressed to move through decisional block 1320J to blocks 1322A and 1322B at circle 1322. During block 1322A, the current operation display is updated, as shown in Table XIX. The display prompts the user to enter a key to identify those test node numbers which are common nodes for resistance program generation or to enter the A key to toggle resistance for adjacent test node program list generation. Assume that during block 1322B the user actuates the 1 key. Decision block 1322C is entered followed by the update common point flag map block 1322D. During the update common point flag map block 1322D, the CPU sets the flag at coordinate R,1 of the common point flag map of FIG. 10 "on". The CPU then returns via flag 1322 to block 1322A and 1322B, causing the display of Table XIX to be updated.

Figure 10:
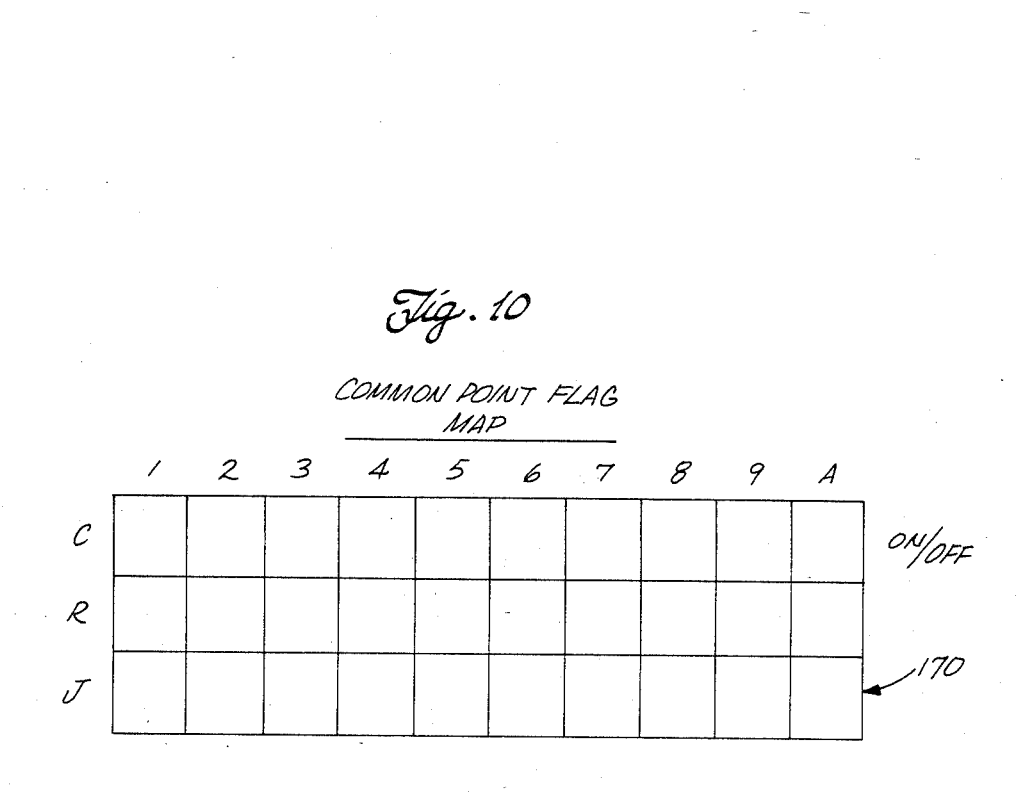

A decisional block and an update common point flag map block similar to 1322C and 1322D are provided for each of the numerals 2 through 9, only those for numerals 1, 2, 3 and 9 being shown. When the user actuates one of keys 2–9 the correspondingly numbered decision block and update common point flag map are entered by the CPU where the flag in row R in the column corresponding to the number of the key is set "on" in the common point flag map (FIG. 10). Subsequently the circle 1322 route is followed back to blocks 1322A and 1322B. During block 1322A the display depicted in Table XIX is updated.

Similarly, if it is desired to create an adjacent test node list for resistance, the operator enters the A key which will cause decision block 1322G and update common point flag map block 1322H to be entered, where the flag at column A of row R is set "on" and subsequently, during block 1322A, the display is updated as shown in Table XX where, by way of example, the numerals 1, 2 and 3 and the letter A in the resistance row are indicated to be "on".

Assume that the user has entered all of the common test node numbers and wishes to select no more for resistance. The user actuates the carriage return key, causing decisional block 1322I to be followed through circle 1324 to the enter number of common point or switch adjacent point for a junction flow of FIG. 30. Upon entering the flow of FIG. 30, similar to flows 28 and 29, the CPU goes through an update current operation display block 1324A and to block 1324B. In 1324A the CPU updates the display as depicted in Table XX, prompting the user to enter common test nodes for junctions or enable adjacent test node testing of junctions.

Figure 29:
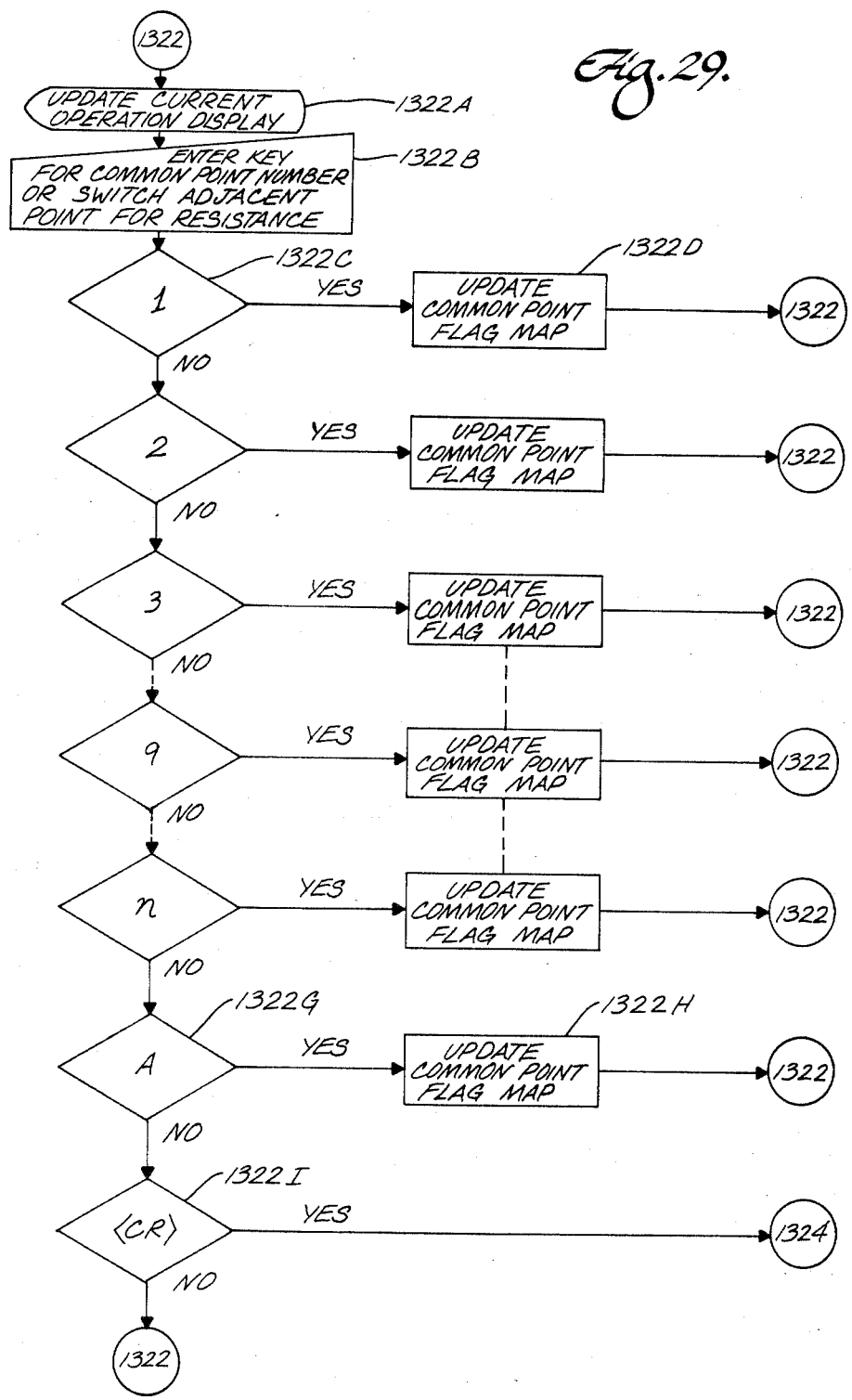
Figure 30:
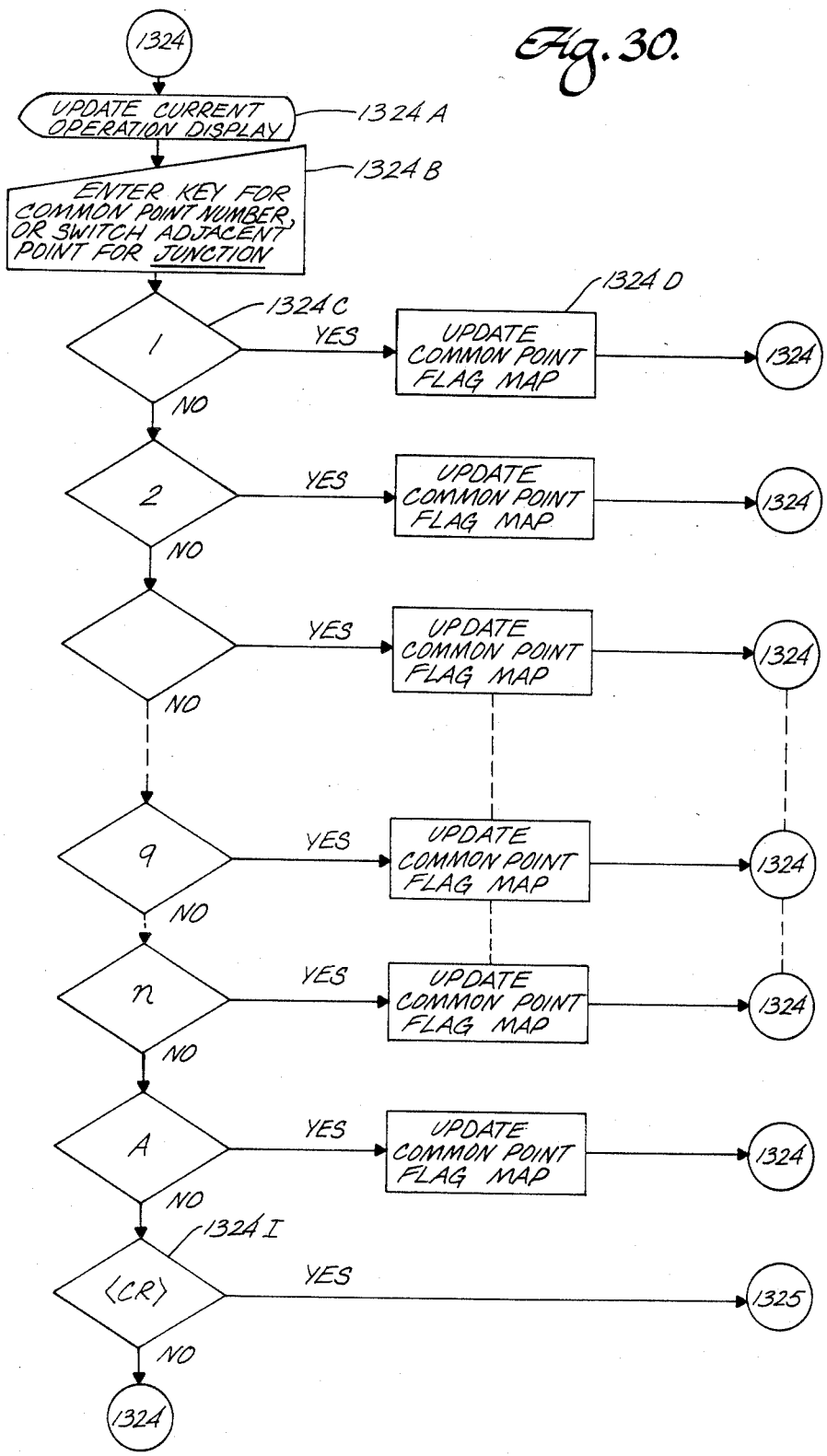

The enter number of common point or switch adjacent point for junction flow of FIG. 30 is essentially the same as the flows of FIGS. 28 and 29 with a decisional block and an update common point flag map block being provided for each of numerals 1 through 9, and for the letter A (adjacent test node). If during block 1324B any one of keys 1-9 or A is actuated, the corresponding decisional block and update common point flag map block are entered and the CPU sets the flag in the correspondingly numbered or lettered column to an "on" condition in the common point flag map (FIG. 10). The operation for junctions will not be disclosed in more detail since it is essentially the same as that for FIGS. 28 and 29.

Assume the user has entered all of the common test nodes desired and has made the selection for adjacent test node for junctions, the user will then actuate the carriage return key, causing decisional block 1324I to be entered and circle 1325 to be followed to the completion blocks of the flow depicted in FIG. 31. Blocks 1325A and 1325B are then entered. If all of the selections, i.e., time constant, resistance, and junction have been entered, this is indicated by the user striking the Y key, and the CPU will branch out of the decisional block 1325B back to the program and learn flow of FIG. 27 via circle 1300. If all of the time constant, resistance and junction entries have not been made, then actuation of any key other than Y will cause a branch to be made via flag 1320 back to the select common point and adjacent point network flow of FIG. 28, where the values entered can be supplemented or changed in the manner described above.

Figure 27:
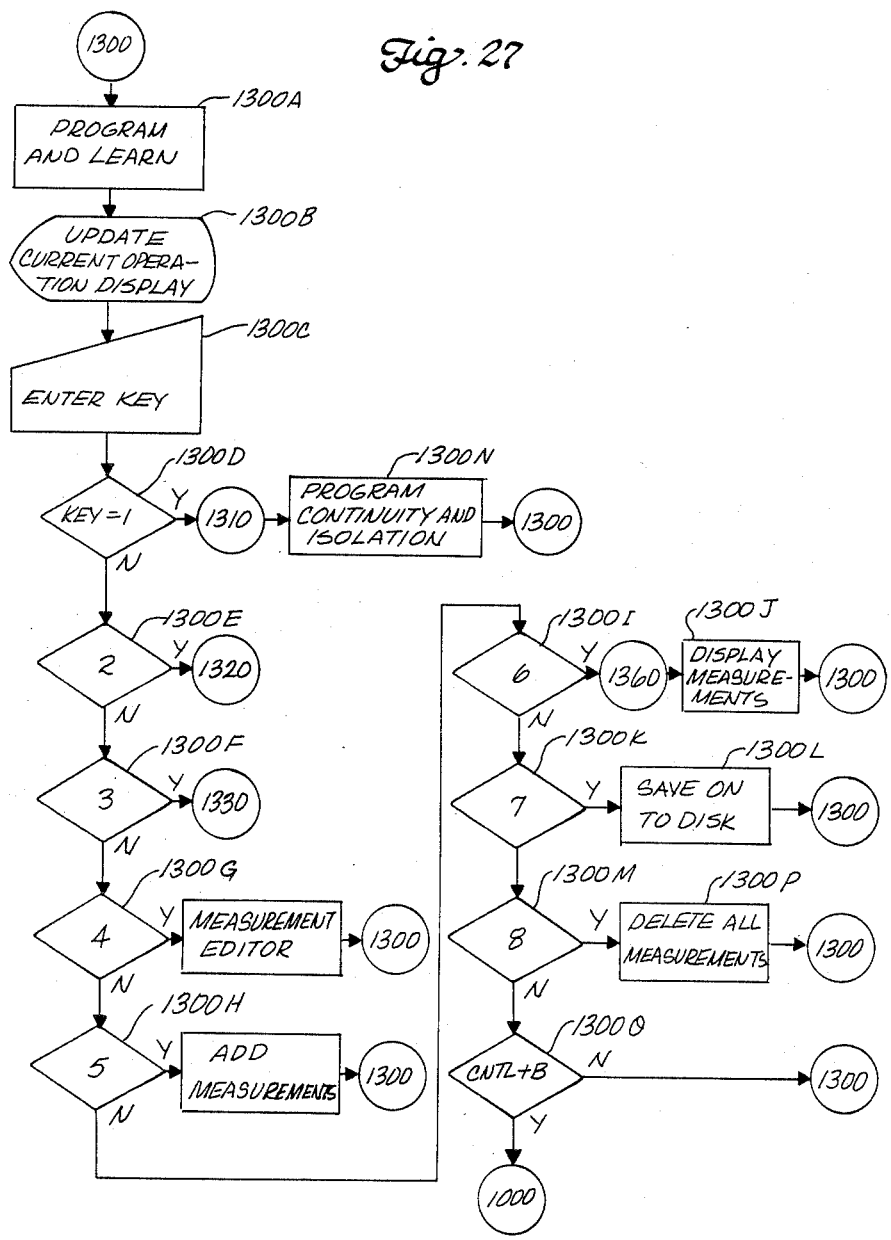

Assume now that all of the selections have been made and that the program and learn flow of FIG. 27 is now entered.

Blocks 1300A, 1300B and 1300C have been entered. During block 1300B the program and learn display of Table XVII is again displayed, allowing the user to select another one of the programs. Assume that during block 1300C the user decides that he wishes to perform the self learn steps. The operator actuates key 3, causing the CPU to pass through decisional block 1300F and circle 1330 to the build test program self learn flow of FIG. 32A. During this flow the CPU builds a test sublist for capacitance measurements. The sublist includes each one of the common test node numbers noted in the column for row C of the common point flag map which is "on". The sublist includes a list of pairs of test nodes, the first test node being a common test node whose flag is "on" in FIG. 10 and the second of which is one of the other test nodes. A similar test sublist is built for resistance measurements and another one is built for junction measurements. Program blocks 1330A and 1330B are entered. During block 1330B the current display is updated as depicted in Table XXI. The display of Table XXI prompts the user to select one of five numbered options or actuate the control L key or the control B key to perform the function indicated in the Table. Only actuation of the control L and control B keys are of importance and will be discussed and decisional blocks for the remaining options will be omitted from FIG. 32A.

Assume that Table XXI is displayed for the first time and the user wishes to build the test program list into the program storage area map of FIG. 11. The user actuates the control L key during decisional block 1330C. The CPU goes to block 1332A et sequence of FIG. 32B where the CPU now automatically generates the common test node and adjacent test node list of test pairs, stores them into the FROM and TO columns in the program storage area map of FIG. 11 and then self learns and stores the capacitance, resistance and junction nominal values into the nominal value (NOM.-VAL.) column in the same row as the corresponding pair of test nodes are stored. If, instead, during decisional block 1330C the user enters the control B key, the CPU goes back via circle 1300 to the flow of FIG. 27 to enable the user to select one of the options indicated in Table XVII.

FIGS. 32A et sequence form an overall build test program and self learn flow diagram. The following is a summary of the flow diagrams that are employed and a brief description of what each does.

| FIG. | Description |
| --- | --- |
| 32B | Is a build a capacitance test program list flow diagram |
| 33 | Is a write a test program list flow diagram for capacitance listing common test nodes |
| 35 | Is a write a test program list flow diagram for capacitance listing adjacent test nodes |
| 37 | Is a learn nominal component value for capacitance flow diagram |
| 39 | Is a build a resistance test program list flow diagram |
| 40 | Is a write a test program list flow diagram for resistance listing common test nodes |
| 41 | Is a write a test program list flow diagram for resistance listing adjacent test nodes |
| 42 | Is a learn nominal component value for resistance flow diagram |
| 43 | Is a build a junction test program list flow diagram |
| 44 | Is a write a test program list flow diagram for junctions listing common test nodes |
| 45 | Is a write a test program list flow diagram for junctions listing adjacent test nodes |
| 46, 47 | Is a learn a nominal component value flow diagram for junctions |

Typically, the first time that the current display of Table XXI is shown on the CRT and the flow of FIG. 32B is entered, all of the values in the program storage area map of FIG. 11 are zero, or at the zero default value, and the user wishes to generate the various common test node and adjacent test node list, self-learn the nomimal values for each pair of test nodes, and complete the minimum value, maximum value, low tolerance and high tolerance information into the program storage area map of FIG. 11. To be explained in more detail, when completed, the program storage map of FIG. 11 forms the test program list for testing the printed wiring board.

The CPU passes through blocks 1332A, 1332B, and to one of the decisional blocks following. The operation about to be described generally involves the CPU accessing the common point flag map of FIG. 10 to search for those flags which have been set "on". For each flag that is "on" the CPU will execute the correspondingly numbered decisional block C1,C2 . . . C9, the subscript to the letter C being the corresponding number, will set the flag to "off", and then proceed to the flow of FIG. 33 were a write-a-test program list for capacitance portion of the program list generation flow is followed, and will write a row in the program list. In this regard a list of pairs of test node characters is generated, one of which is the number of the common test node noted in the column of FIG. 10 that has been set "off", the other number being the number of one of the other test nodes. The list of pairs of test nodes characters goes up to the value entered by the user in the end point number area 192 during the flow of FIG. 16 and now stored in the program header, FIG. 9.

Consider the operation in more detail. Initially the CPU goes to the decisional block 1332C for the flag at coordinate C,1 (C1) where it determines that the C1 flag is "on" and accordingly it enters block 1332D. During block 1332D the CPU sets the C1 flag (at coordinate C,1) to "off" and then proceeds through circle 1331 to the write-a-test program list flow diagram for capacitance, listing common test nodes in FIG. 33. At this point it should be noted that setting the C1 flag "off" will prevent common test node number 1 for capacitance from being used in generating a future list. During the flow diagram of FIG. 33 the CPU will create a list of test node character pairs, one being the common test node character 1 and the second being a character corresponding to one of the other test nodes. Also each entry in the list will be identified by the particular type of test measurement to be conducted for the particular test node pair. Continuing with the operation, block 1331B is entered where a counter in the CPU labeled "TO" is set to 1 and block 1331C is then entered, during which a digitally coded representation of the word "capacitance" is written into row 1 of the measurement type column in the program storage area map of FIG. 11. For simplicity, the words "program storage area map" are hereinafter sometimes referred to as PSA in the description and in the Figures. Note, for example, block 1331C.

The CPU next enters block 1331D and stores the common test node number 1, obtained from the flag coordinate C,1 (C1) in the common point flag map, FIG. 10, into the FROM column of the first row of PSA (FIG. 11). Block 1331E is then entered where the 1 value in the TO counter is stored into the TO column of the first row of PSA. Characters 1,1 are now in row 1 in the FROM and TO columns of FIG. 11. Zeros are then stored into the minimum value column, the nominal value column, and the maximum value column of row 1 of the PSA during block 1331F.

During block 1331G, the CPU obtains the capacitance low tolerance value from area 202 of the program header map 172 (FIG. 9). This value is either the default value originally stored by the CPU or is one that was updated by the user and will be displayed on the status display portion of the display of Table XXI (table III), in this case as a −40%. The low tolerance value so obtained is then stored into the low tolerance column of the first row of PSA (FIG. 11). Similarly, during block 1331H the CPU obtains the capacitance high tolerance value from area 204 in the program header map 172 (FIG. 9) and stores the value into the high tolerance column of the first row of PSA. During block 1331I, the mask flag at the right end of PSA is set "off". During block 1331J a digitally coded value representing a carriage return is stored into row 1 of a column (not shown) at th right end of row 1. This has the effect of making the next row the current row for the write-a-test program operation as will be explained. The resultant information contained in the first row of PSA is depicted by way of example in FIG. 34.

During block 1331K the TO counter is then incremented by the CPU by 1 so that it now contains the next higher numbered common test node character. During block 1331L the value in the TO counter is compared against the end point value (number) 192 of the program header (FIG. 9). If the value in the TO counter is equal to or less than the end point value, then the CPU passes through circle 1331O back to block 1331C of FIG. 33 where the operation of blocks 1331C through 1331K is repeated. During this operation the digitally coded representation for the word "capacitance" is stored in row 2 of the measurement type column (FIG. 34) and the common test node character is again stored into the FROM column and the incremented value of the TO counter is stored into the TO column, the minimum value, nominal value and maximum value columns are set to zero, the same low and high tolerance values are stored in the low tolerance and high tolerance columns, the mask is set "off", and a digitally coded representation of a carriage return is stored all in the current row. Additionally the TO counter is incremented to 3 and block 1331L is again entered where the incremented value in the TO counter is compared against the end point. The result is depicted in row 2 of the PSA depicted in FIG. 34. This operation is repeated for each of the rows of the PSA until during 1331L the CPU detects that the value in the TO counter is greater than the end point value. When this occurs the CPU branches through circle 1332 back to the build capacitor test program block 1332A in the flow diagram of FIG. 32B. At this point, as depicted in FIG. 34, a partially completed test program list for common test node 1 has been generated and the minimum value, nominal value and maximum value for each test node is zero. These values will be learned and stored in the test program list at a later time. The CPU passes through block 1332A, 1332B and then during block 1332C determines that the C1 flat at coordinate C,1 of the common point of flag map (FIG. 10) is "off". Therefore the CPU goes on to decisional block 1332E for flag C2 (coordinate C,2) where the flag C2 is tested and found to be "on". Therefore the CPU passes to block 1332F where the flag C2 is set "off" (preventing this common test node character from being used again for capacitance) and the operation returns back through circle 1331 to the flow of FIG. 33. At this time a test program list is generated similar to that depicted in FIG. 34 for capacitance but this time for the common test node 2. To this end, during block 1331B, the TO counter is reset to 1 and then during the subsequent blocks 1331C through 1331K the next row in the program storage area map has the following values stored in the columns indicated in FIG. 34: capacitance 2 1 0 0 0 −40% +40% off. In addition the TO counter is incremented by 1 during 1331K so that it now contains the value of the next sequential TO test node and the operation of blocks 1331C through 1331K is repeated, this time noting the same values in the next row except for the TO value which is incremented by 1. This operation is repeated until a row is generated for each of the TO test node characters up to the end point number. When the TO counter has been incremented so that it is greater than the end point value, decisional block 1331L again causes the CPU to go back to block 1332A of the flow in FIG. 32B where it passes through decision blocks 1332C, 1332E to the next decisional block (not shown) corresponding to the C3 flag (at coordinate C,3) of the common point flag map of FIG. 10 where the above described operation is repeated, provided the C3 flag is "on".

It will be understood that there is a decisional block for each coordinate in row C of the common point flag map, such as decisional block 1332C, and a set flag to off block for each of the same coordinates in the flow diagram of FIG. 32B, the output of which is connected through a circle back to the input of the flow diagram of FIG. 33, similar to decisional blocks 1332C and 1332D. However, for simplicity, only the decisional blocks and set flag blocks for coordinate C,1 (flag C1), C,2 (flag C2), and C,9 (flag C9) are shown.

Assume that the CPU finds that the remaining flags corresponding to the coordinates C,3 through C,9 in the common point flag map of FIG. 10 are "off". This will cause the CPU to pass through the decisional blocks to decisional block 1332G in FIG. 32B. During this decisional block the CPU checks coordinate C,A of the common point flag map of FIG. 10. If the user has set the flag at this coordinate "on" for adjacent test node test, then the CPU passes to block 1332H where the flag at coordinate C,A is set "off" and circle 1333 is followed to the flow diagram of FIG. 35. During the flow diagram of FIG. 35 the CPU writes a test program list for capacitance, listing adjacent test nodes. The adjacent test node list is a list of pairs of test nodes for each of those test nodes which is not directly connected to a common test node and is for capacitance.

Consider the operation. The CPU passes from block 1333A to 1333B where the TO counter is set to state 2. Then block 1333C is entered. During block 1333C the CPU writes a value representing the word "capacitance" into the measurement type column in the next available row in the PSA. This is depicted in the PSA example of FIG. 36. Next, during block 1333D the counter called "FROM" in the CPU is set to the value in the TO counter, minus 1. In the example being given, the TO counter has a 2 and therefore the FROM counter now contains a 1. During the subsequent block 1333E the value in the FROM counter is stored into the FROM column of the current row depicted in the PSA of FIG. 36. During subsequent block 1333F the value in the TO counter is then stored into the TO column of the current row of FIG. 36. At this point the FROM and TO columns contain characters identifying the first two adjacent nodes to be tested for capacitance. During the subsequent block 1333G, the minimum value, nominal value and maximum value columns in the current row of FIG. 36 are set to zero. During blocks 1333H and 1333I, the CPU, similar to the process described above, obtains the capacitance low tolerance value and the capacitance high tolerance value in areas 202 and 204 of the program header map (FIG. 9), storing these values into the low tolerance and high tolerance columns of the current row of the PSA depicted in FIG. 36. During the subsequent block 1333J the flag in the mask column of the current row is set to "off". During 1333k a digitally coded value representing a carriage return is written into the last column (not shown) of the current row. During block 1333L the TO counter is then incremented by 1 to the next sequential value which in this case will be the value 3 corresponding to the next TO point of the adjacent point list. During block 1333M the CPU compares the value in the TO counter with the end point at 192 in the program header map (FIG. 9). If the former is equal to or less than the end point, then the circle 1333O is followed back to block 1333C where blocks 1333C through 1333L are repeated. This time the FROM and TO points stored into the next row of FIG. 36 are 2 and 3 and the same values are stored in the other columns as for row 1. This operation is repeated, incrementing the TO counter during each cycle until the TO counter is greater than the value of the end point. When this occurs the CPU branches out of block 1333M through flag 1332 to block 1332A of the flow of FIG. 32B. This time it is found that the CA flag at coordinate C,A of the common point flag map for row C is "off" and therefore circle 13301 is taken to block 13301A of the flow of FIG. 37. During the flow of FIG. 37 the CPU causes a nominal component value for capacitance to be learned for each of the pairs of test nodes identified by the test program list for capacitance contained in the PSA (see FIGS. 34 and 36).

During the flow the CPU accesses each of the rows of the PSA (FIGS. 34 and 36), reading the FROM and TO points, applies a test signal between the FROM and TO points identified in each row, and determines a capacitance value resulting from the test which is then assumed to be a nominal value. The CPU then takes the low and high tolerance values for capacitance, determines a minimum value and a maximum value for capacitance using the nominal value, and then stores the minimum value, nominal value and maximum value for capacitance at the measurement list 178 into the row corresponding to the FROM and TO points between which the test has been applied.

Figure 37:
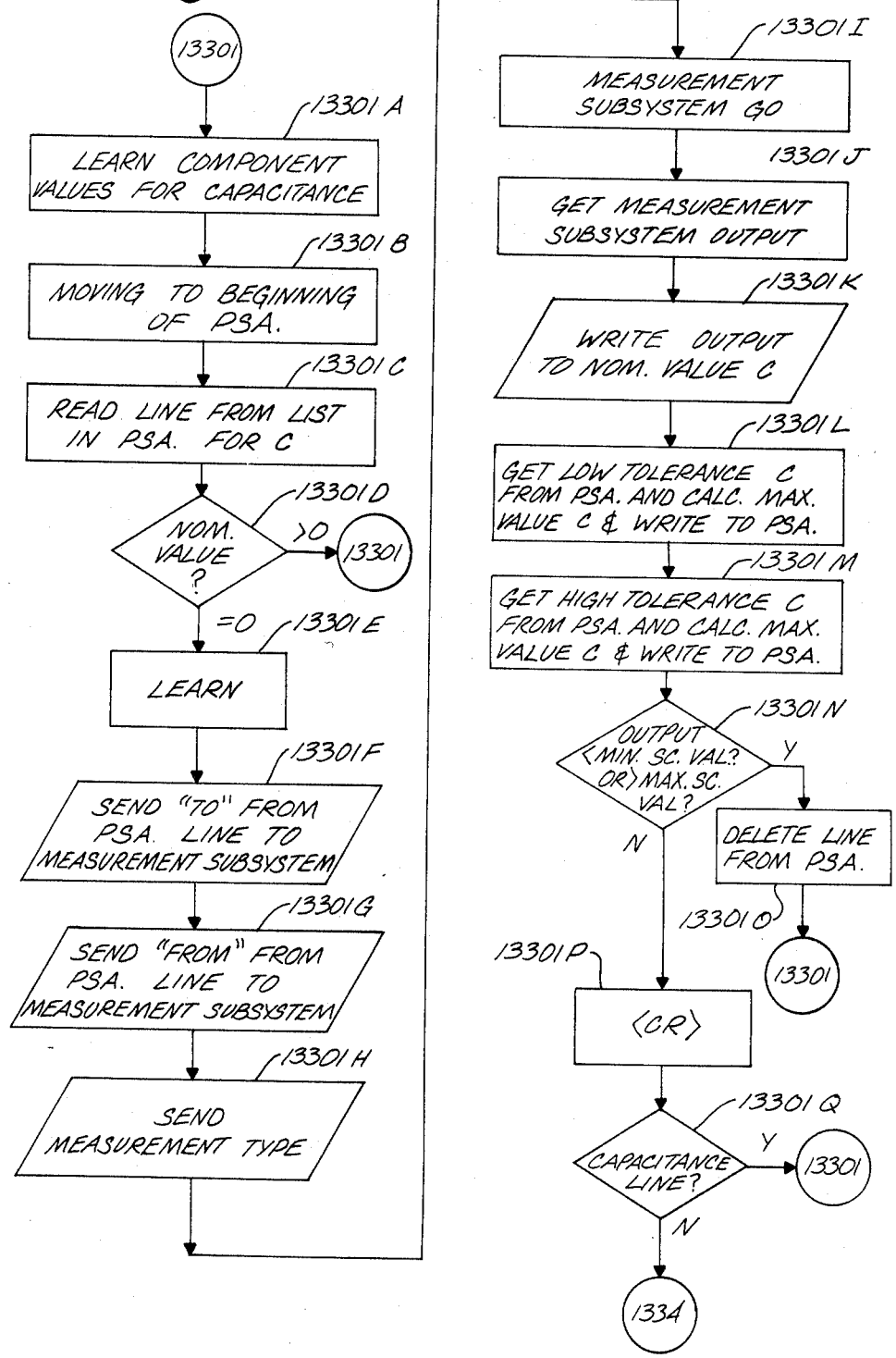

Consider now the operation with reference to FIG. 37. The CPU passes through blocks 13301A and 13301B. During block 13301B the CPU moves to the first row of the PSA (FIG. 34). During block 13301C the CPU reads the first row of data from the PSA. During block 13301D the CPU checks the nominal value read to see whether it is greater than or equal to zero. If it is equal to zero then block 13301E is entered where the machine initiates a learn operation. During block 13301F the CPU sends the TO value from the first line of the PSA to the measurement system 56 of FIG. 2. During block 13301G the CPU sends the FROM value of the first line from PSA to the measurement subsystem 56. During block 13301H the CPU sends the coded character representing the measurement type for capacitance to the measurement subsystem 56 and initiates the measurement subsystem to test between the FROM and TO points identified by the FROM and TO values to determine the value of capacitance and to form a capacitance value corresponding to that which is measured. To this end, during block 13301I the CPU initiates the measurement operation. The switch cards 60 are then switched so that they make a connection through two of conductors 87 (FIG. 3) to the interface pins 84 which in turn are connected through two conductors 80 to a corresponding pair of spring probes 72 which in turn are connected between two test nodes on the printed wiring board 66. The measurement driver 54 then applies a test signal between the two conductors in conductors 87, causing a resultant signal that can be monitored by the measurement driver, uses the resultant signal to determine the value of capacitance between the two test nodes, forms a digitally coded signal representing the value of capacitance (measured capacitance value) and applies the measured capacitance value through the measurement controller 54 to the back plane 48. The CPU 46 then reads the measured value from the back plane 48 during block 13301J.

During block 13301K the measured capacitance value from the measurement system is written into the nominal value column in the first row of the capacitance program in the PSA (FIG. 34). During block 13301L the low tolerance percentage for capacitance in the first row is read from the first row of the PSA multiplied times the nominal value of capacitance (in the same row) to calculate a minimum value for capacitance. The computed minumum value is then written by the CPU into the minimum value column of the first row for capacitance in the PSA.

During block 13301M the high tolerance value for capacitance in the first row of the PSA is read and multiplied times the nominal value for capacitance in the same row to calculate the maximum value of capacitance and the calculated maximum value of capacitance is then written into the maximum value column in the first row for capacitance in PSA.

During block 13301N (FIG. 37) the CPU determines whether the value read from the sample printed wiring board is within the allowed system limits. The system software 162 (FIG. 8) section of the memory map contains maximum system capacitance value (max SC val); minimum system capacitance value (min SC val); maximum system resistance value (max SR val); minimum system resistance value (min SR val); maximum system junction value (max SJ val); and minimum system junction value (min SJ val). These maximum and minimum values indicate the maximum and minimum values of capacitance, resistance and junction for the measurements performed by the system on the printed wiring board. If the measured value (read and stored in the nominal value column) is outside of these minimum and maximum values, the entire row for the corresponding pair of FROM and TO test nodes is deleted from the test program list being generated in the program storage map (FIG. 11). The reason the deletion is made is that there is probably either an open or a short, and there is no need to keep the measurement value for that particular pair of test nodes in the test program list. As a result the system automatically minimizes the length of the test program list.

Consider now the operation during block 13301N. The CPU reads the minimum system capacitance value from the system software area 162 of the memory map (FIG. 8) and compares it with the nominal value just stored into the nominal value column of the row in the PSA map. Since the first two test nodes between which the measurement is made are the same, i.e., 1,1, the measured value of resistance will be zero and a zero will be stored into the nominal value column. Therefore when the comparison is made the CPU detects that the nominal value is less than the minimum system capacitance value and therefore branches to block 13301O where the CPU deletes the first line from the PSA. Following block 13301O, the system returns to blocks 13301A, 13301B and 13301C via circle 13301 where the measurement is made for the next sequential row in the PSA. For convenience this and future rows, as operated on, will be called the current row.

Assume that block 13301N had been entered and the nominal value had been greater than the minimum and maximum system capacitance value levels. In that case the CPU would compare the same value against the maximum system capacitance value from the system software area 162, detect that the former is greater, and then block 13301O would again be entered to delete the corresponding row from the PSA. It will be understood that a value less than the minimum system capacitance value level indicates a short circuit whereas a value greater than the maximum system capacitance value level indicates an open circuit. Neither a short circuit nor an open circuit would normally be tested during a capacitance test.

Assume now that during block 13301N the nominal value read from the PSA is between the minimum and maximum system capacitance values. The CPU goes to block 13301P. During block 13301P the CPU detects the carriage return character indicating the end of row 1 and moves to the next row in the PSA. This then becomes the current row for processing. During block 13301Q the CPU checks to see whether there is another capacitance measurement type row in the PSA and if there is it returns via circle 13301 to the beginning of the flow of FIG. 37. If it is the last row for a capacitance measurement type then the CPU follows circle 1334 to the beginning of the flow of FIG. 39 where the build a resistance test program operation takes place.

Figure 40:
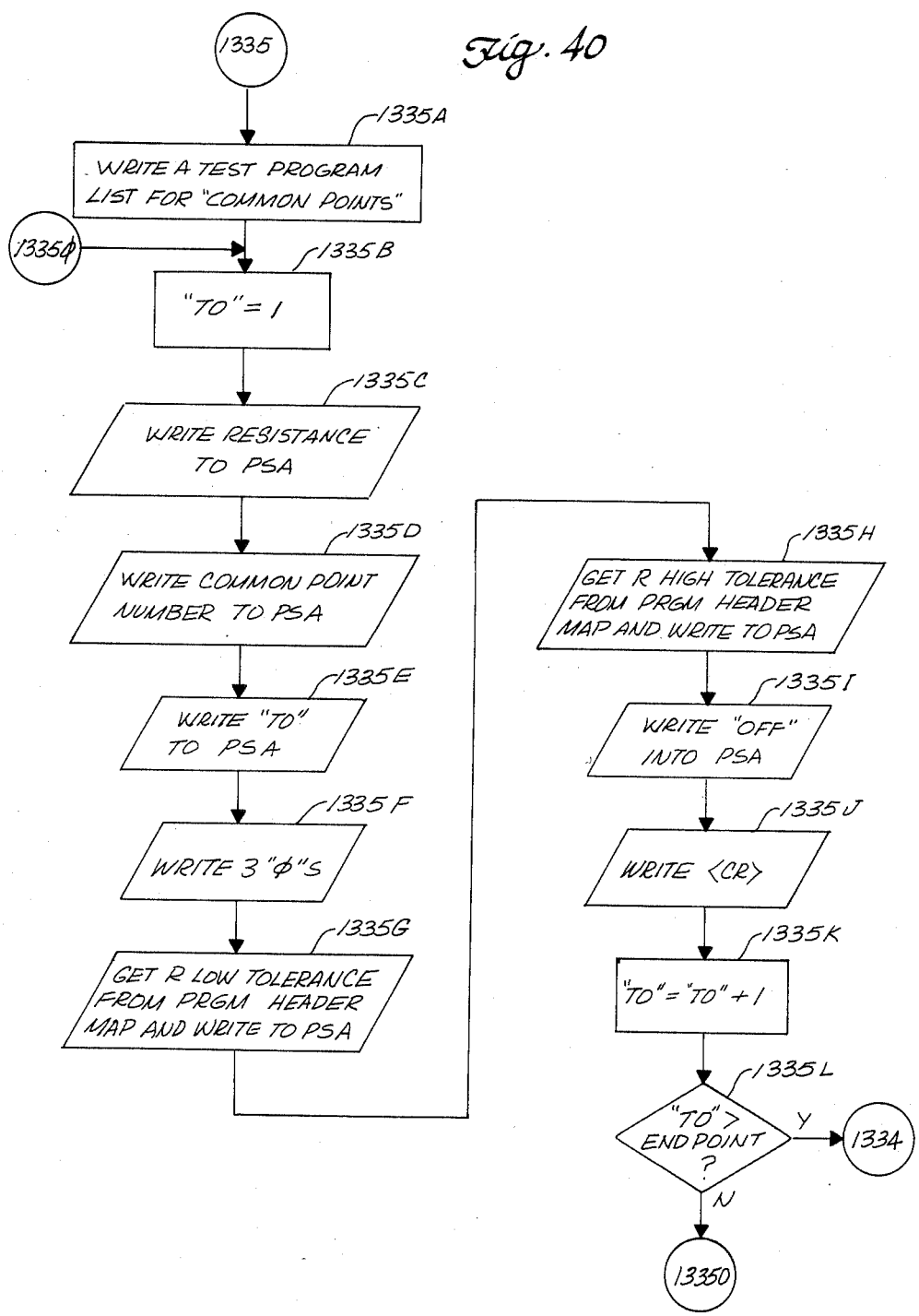
Figure 41:
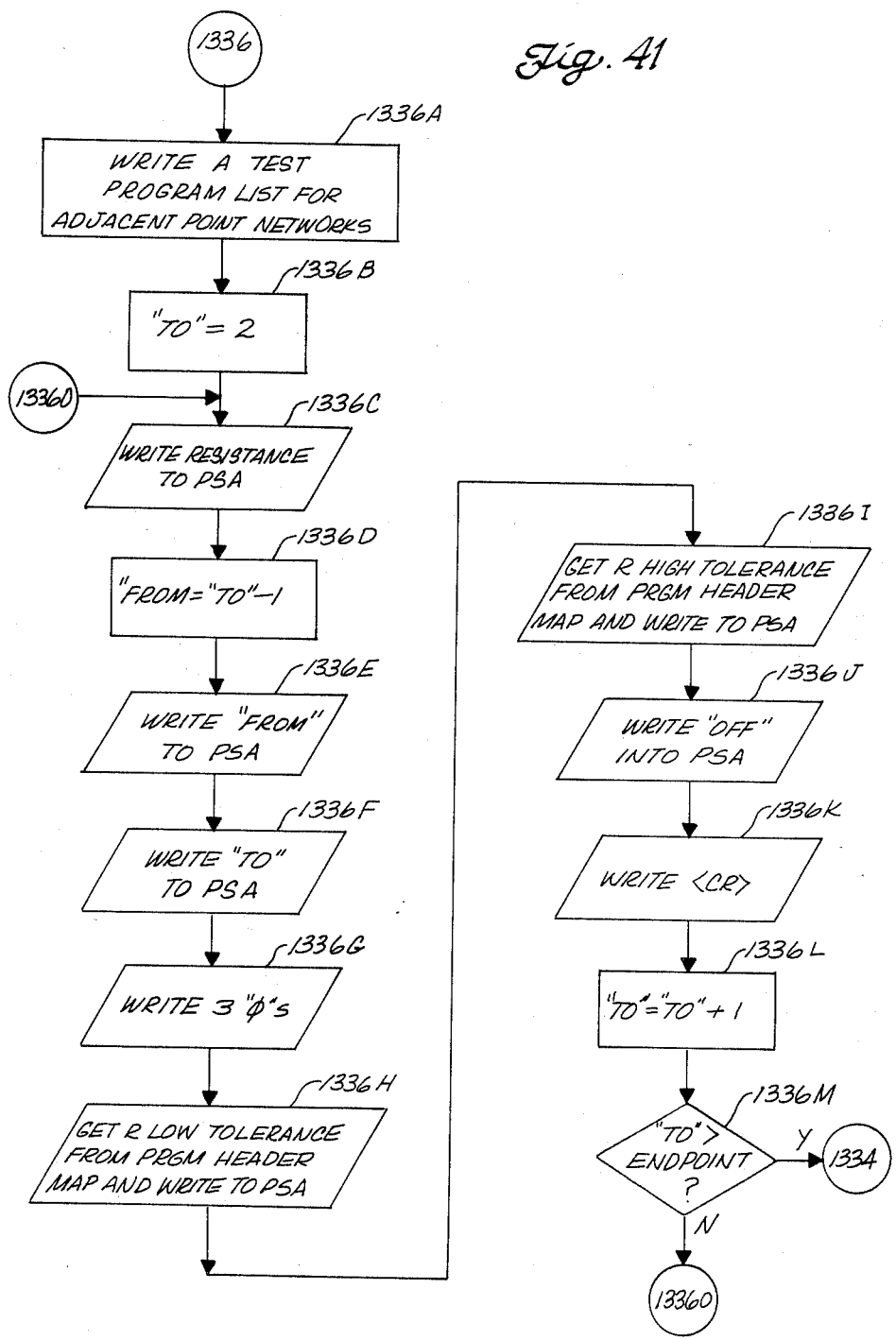

The build a resistance test program flow diagram of FIG. 39 is essentially the same as the build a capacitance test program flow diagram of FIG. 32B but is arranged to search the row R of the common point flag map (FIG. 10) and to generate a list of pairs of common test node characters for each common test node number in each column whose flag is "on". A decisional block such as 1334C and a set flag to "off" block such as 1334D are provided for each of the different flags at the coordinates R1, R2 through R9. As the CPU checks the flag in each column, the flag is set "off" and the CPU passes through the corresponding circle to the write a test program list for resistance, listing the common test node flow diagram depicted in FIG. 40. The operation of flow diagram depicted in FIG. 40 are essentially identical to that depicted for capacitance in FIG. 33 except that all operations are now taking place for resistance and as a result an area in PSA is created for resistance in which all of the FROM and TO nodes for each of the common test nodes identified in the common point flag map (FIG. 10) are created. The test program list is essentially the same as that depicted in FIG. 34 for capacitance except that the values are for resistance. More specifically, each of the common test node characters is listed in the FROM column, each of the TO test node characters is listed in the TO column, the minimum value, nominal value and maximum value for resistance are all set to zero, the low tolerance and high tolerance percentage for resistance are read from areas 206 and 208 of the program header map (FIG. 9) and are stored in the corresponding columns of the PSA, and the mask flag is set "off". Similarly, a decisional block is included for flag A and a set flag A to off block, blocks 1334G and 1334H. If the A flag in the common point flag map is "on", then block 1334H is entered where the flag is set "off" and the flow diagram of FIG. 41 is entered via circle 1336, where the CPU writes a test program list for adjacent test nodes. The operation of the flow diagram of FIG. 41 is essentially the same as FIG. 35 to create a list similar to that depicted in FIG. 36 except that a coded value for resistance is stored in the measurement type column, low and high tolerance values are taken from the areas 206 and 208 of the program header map (FIG. 9) and stored into the low and high tolerance columns, and the list is inserted immediately following the common list for resistance measurement type in the PSA.

Figure 42:
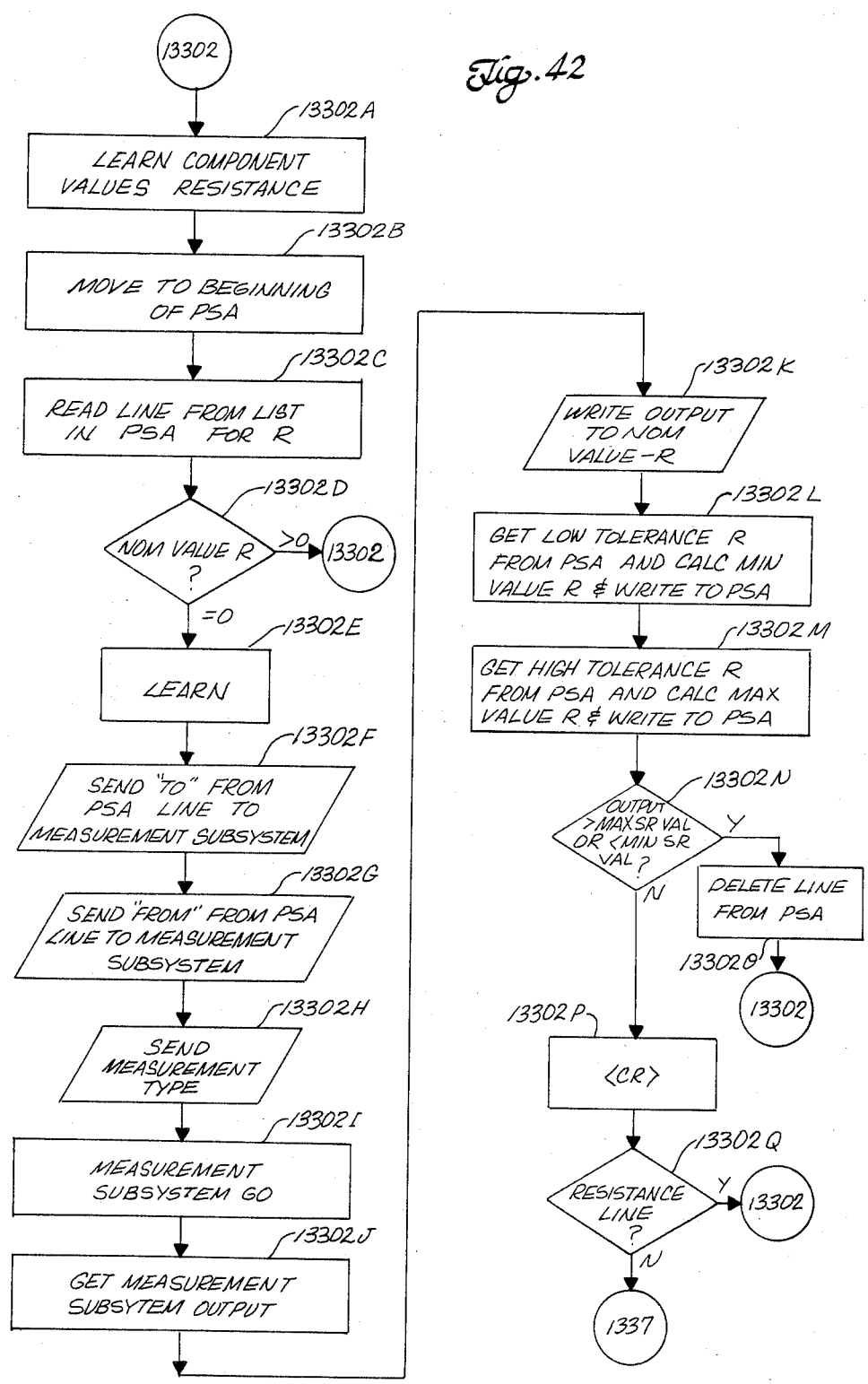

Subsequently the flow diagram of FIG. 42 is followed, out of circle 13302 of FIG. 39, where the system automatically learns the nominal component values for resistance in a similar manner to that described above with respect to FIG. 37 for the capacitance flow. The corresponding blocks in the flow diagram are included. The operation is essentially the same except that the measurement system applies the test signal and measures resistance, and the measured value of resistance is stored into the nominal value column of the PSA.

The CPU then takes each row and multiplies the measured resistance value stored in the nominal value column times the low tolerance value and times the high tolerance value (for resistance) to calculate the minimum and maximum values for resistance. The calculated minimum and maximum values for resistance are then stored in the corresponding columns of the PSA.

The flow of FIG. 42 also has decisional block 13302N where the measured value stored in the nominal value column is compared against the maximum system resistance value (max SR val) and against the minimum system resistance value (min SR val) stored in the system software area 162, and if the value is above the maximum value or below the minimum value, the CPU goes through block 13302O where the corresponding row of the resistance measurement table in the PSA is deleted. The operation in the flow of FIG. 42 is repeated for each row for resistance measurement types. When all of the resistance measurement type rows have been processed, then decisional block 13302Q is followed out through circle 1337 to the build a junction test program flow diagram of FIG. 43.

Figure 43:
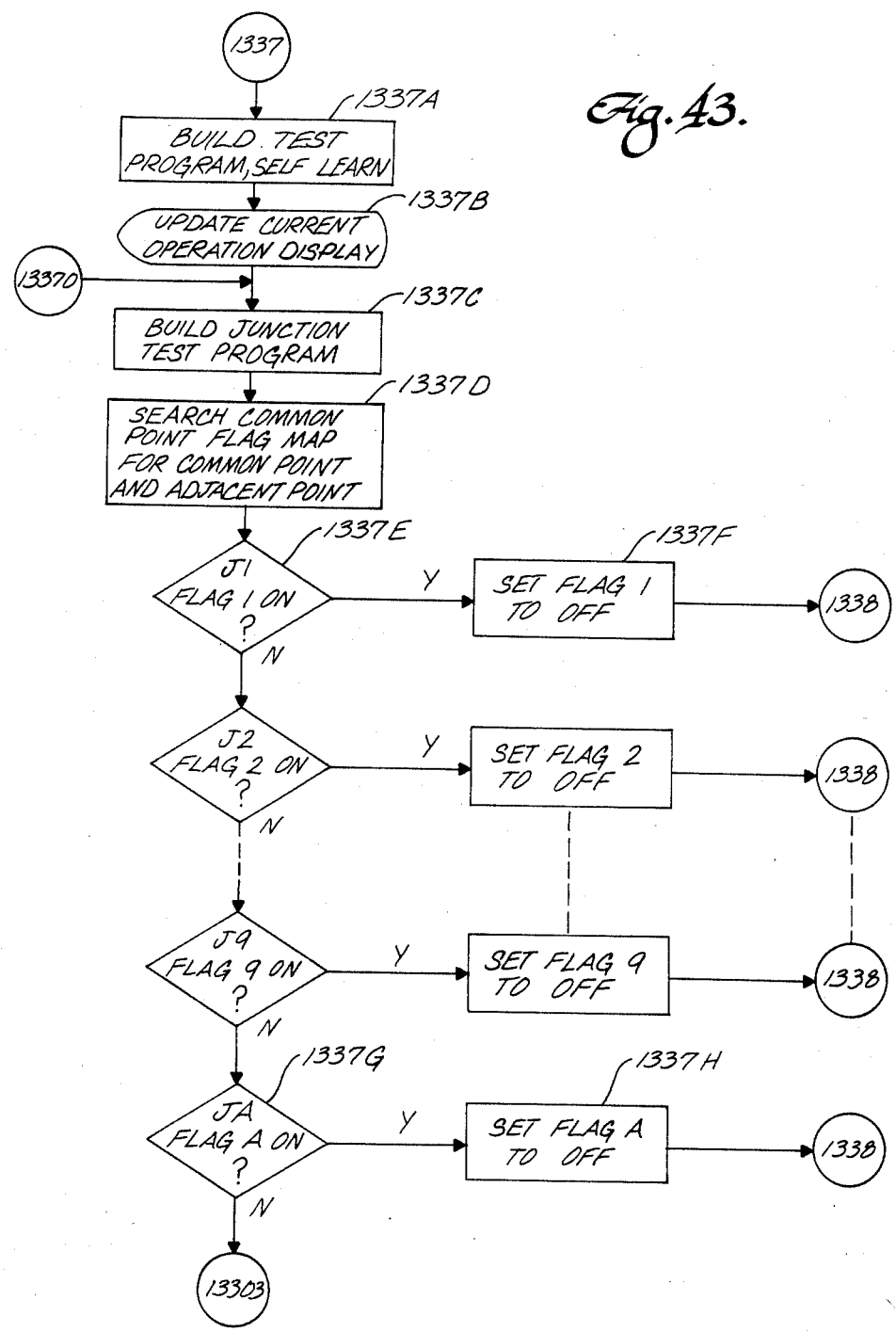
Figure 44:
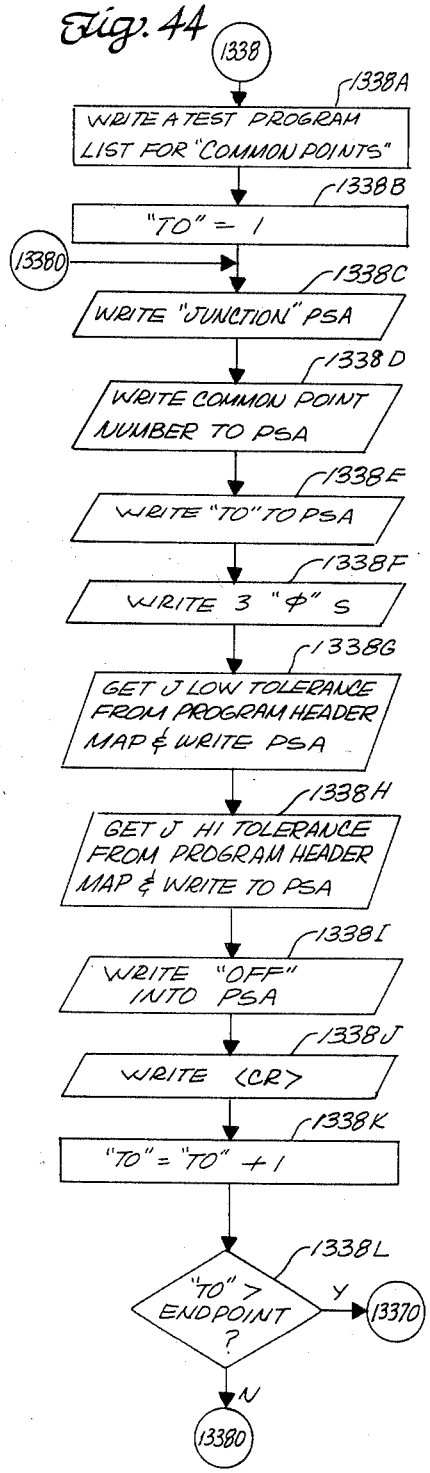
Figure 45:
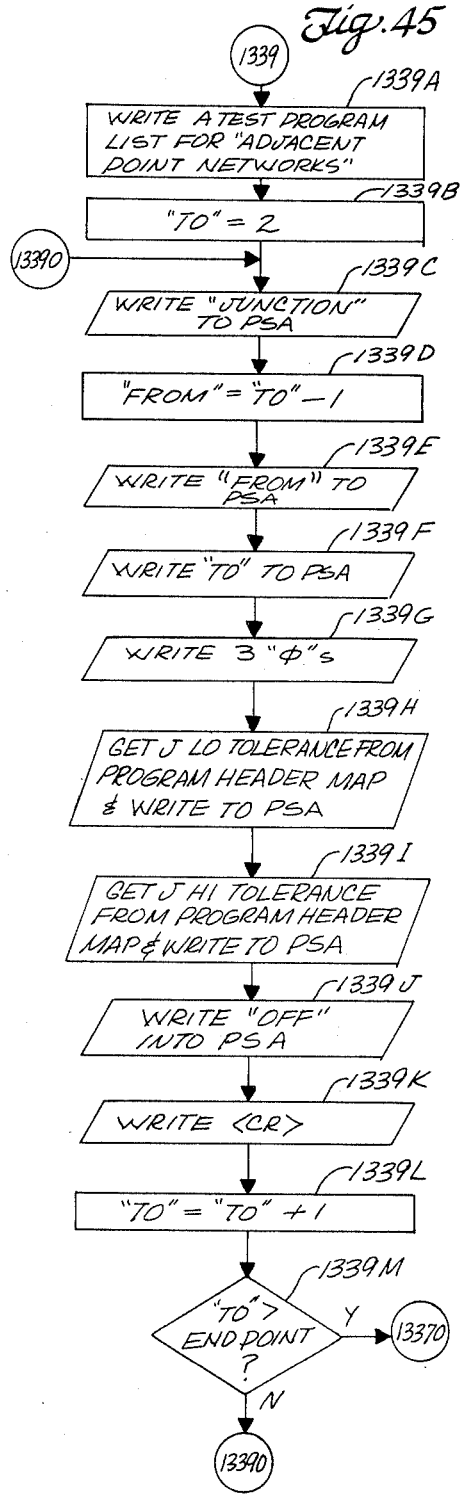
Figure 46:
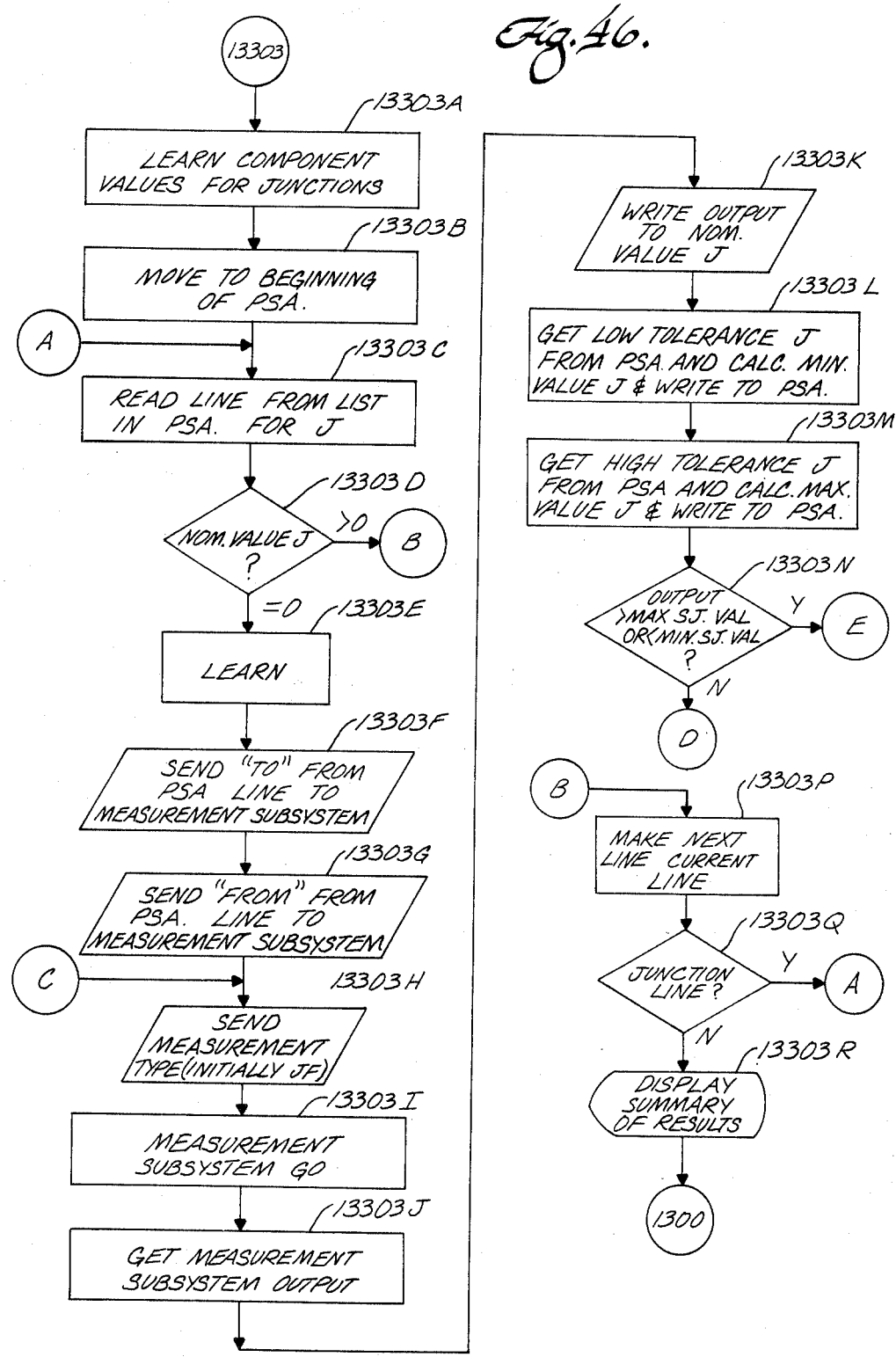
Figure 47:
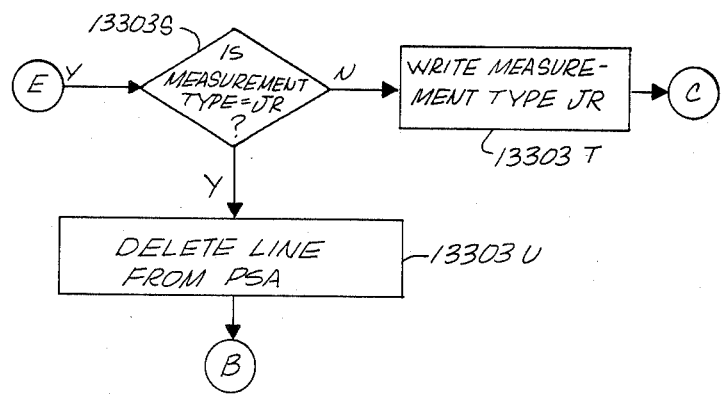
Figure 48:
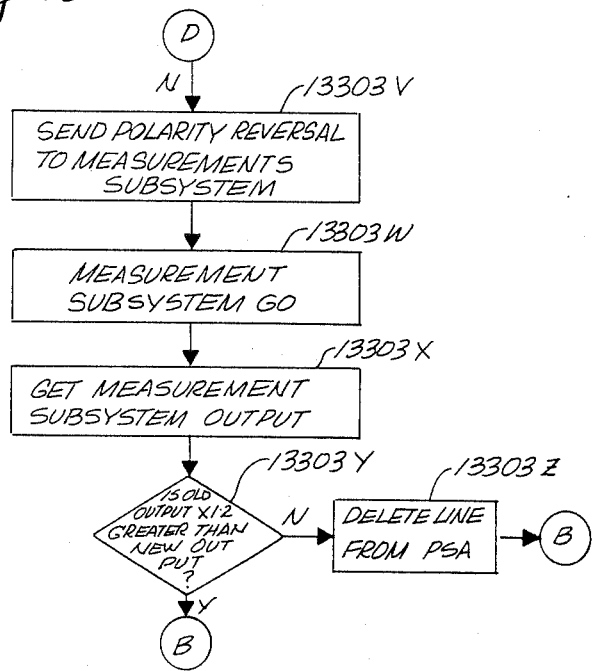

FIGS. 43, 44, 45, 46 and 47 are for building a junction test program and are essentially identical to FIGS. 32B, 33, 35 and 37 for building a capacitance test program list with the following exceptions: during the operation of FIG. 43 the CPU operates on row J (junction) of the common point flag map in FIG. 10; during the flows of FIGS. 44 and 45 the CPU stores the word "junction" in the measurement type column, stores the high and low tolerances from the junction low tolerance and junction high tolerance areas 210 and 212 (FIG. 9) into the high and low tolerance columns of the common test node and adjacent test node rows of the PSA.

The operation of the learn nominal components values for junctions flow diagram (FIG. 46) is similar to the learn nominal component values for capacitance and resistance flow diagram discussed above, but certain changes have been incorporated to handle the special problems involved with testing for junctions. Specifically, the junctions being tested are similar to conductor junctions in which the electrical characteristic in one direction is different than the electrical chracteristic in the other direction. For example, the resistance in one direction through a junction will be low and, therefore, when a current signal is applied, the voltage will be low. By way of contrast, the resistance in the opposite direction will be high and, therefore, a current applied through the junction in that direction will result in a high voltage. The learn operation of FIGS. 46 and 47 takes these characteristics into account.

Consider now the operation. During blocks 13303A and 13303B, the CPU moves to the beginning or first row of the program test list in the PSA which has the measurement type JUNCTION. To be explained in more detail, the measurement type for junctions is one of two types, namely, a junction forward (JF) or a junction reverse (JR). During block 13303C the CPU reads the first row from the junction section of the PSA. During block 13303D the value in the nominal value column is compared against zero. Since it will initially be zero, the operation follows to 13303E for the learn process.

Consider for a moment what action would have taken place if the nominal value had been something other than zero. In this case, there would have been a nominal value previously read and stored. Therefore, during the relearn process, it is desired to avoid overriding of this value. Accordingly, the route through circle B is taken to block 13303P where the CPU makes the next row of the junction portion of the PSA, the "current" row or line being operated on thereby skipping the row that has the non-zero value to be saved. During block 13303Q a check is made to see whether the current row is now a junction row. If it is, then the route through circle A is taken back to block 13303C where the CPU reads the next row from PSA for JUNCTIONS. If, on the other hand, the next row is not a JUNCTION row, then block 13303R is entered where the results are displayed and then circle 1300 is followed to an earlier flow. Return now to block 13303E. Block 13303E would have been entered if the value read from the nominal value column of a junction row is zero, meaning there is a value that needs to be learned and inserted. During blocks 13303F and 13303G, the FROM and TO values are read from the junction first (current) row of the PSA and applied to the measurement subsystem. During block 13303H, the measurement type, which is initially a junction forward measurement type, is sent to the measurement system.

During block 13303I the measurement subsystem applies a junction forward measurement signal. Specifically, a current signal is applied in the forward direction between the FROM and TO test points. During block 13303J the measurement subsystem determines the resultant voltage and provides a value representative thereof back to the CPU.

During block 13303K, the output from the measurement subsystem is stored into the nominal value column of the first row of junctions in PSA. During block, 13303L the low tolerance value from the row is taken from PSA, multiplied times the output from the measurement subsystem and the resultant value is stored into the minimum value column of the first row of junctions in the PSA. The same action is taken for the high tolerance value during block 13303M and thus a maximum value is then contained in the maximum value column of the current; row 1 of the PSA for junctions.

During block 13303N, the resultant output from the measurement subsystem is still contained in the CPU and is then compared with the maximum system junction value (MAX SJ VAL) and the minimum system junction value (MIN SJ VAL) stored in the system software area 162 of the memory map (FIG. 8). If the output is outside of the range of maximum and minimum values, then two possibilities exist. First, it is possible that there is an open, a short or other unacceptable value between the FROM and TO points just tested. The other possibility is that there is a junction between the two nodes, but that the junction is in the reverse direction rather than in the forward direction. Accordingly, the circle E route is followed to FIG. 47 where during block 13303S, a check is made to see whether the value in the measurement type column of the PSA of the first row is a junction reverse type. As pointed out above, it is initially a junction forward value and, accordingly, block 13303T is entered where the CPU writes a measurement type for junction reverse into the measurement type column of the first row for junction. Circle C is then followed to block 13303H through 13303N where the new measurement type junction reverse is sent through the measurement subsystem, and the measurement subsystem is caused to apply a current in the opposite direction between the same FROM and TO points. The output from the measurement system is multiplied times the low tolerance and high tolerance values to calculate the new minimum and maximum values for junction and the results are written into the minimum value and maximum value columns of the first row of the PSA and during block 13303N, a check is again made to see if the current output from the measurement subsystem is within the limits of the maximum system junction value and the minimum system junction value.

Assume this time that the output is outside of the maximum/minimum system junction value range and circle E is followed to decision block 13303S where it is found that the value in the measurement type column is junction reverse. This time block 13303U is entered to delete the first row for junction from the PSA because the row is outside of the maximum and minimum system junction value limits and therefore is not to be used in the test program list.

Following block 13303U, blocks 13303P through 13303R are then entered where the next row for junction in the PSA is made the current row and the subsequent operation discussed above is the same, except the current row is used in place of the first row.

Assume that the next row is another junction row and therefore the A circle is followed from 13303Q back to block 13303C. This time the operation is made on the next row for junction of the PSA. The operation will be identical to that described above, except that the current row will be operated on instead of the current first row.

Return now to block 13303N and assume that it is found that the measured value from the measurement subsystem is within the maximum and minimum system junction value limits. Circle D is followed to block 13303V of FIG. 48 where the CPU reverses the polarity to the measurement subsystem. Specifically, if the measurement type column contained a junction forward measurement type, a junction reverse measurement type is now sent to the measurement subsystem. If a junction reverse measurement type had been read from the row of the PSA and sent to the measurement subsystem, then a junction forward measurement type would be sent to the measurement subsystem. During blocks 13303W and 13303X, the measurement system, similar to blocks 13303I and J, applies a current signal (as opposed to a voltage) between the FROM and TO points (previously received) for the current row of the PSA in the direction of the measurement type provided during block 13303V, resulting in a voltage between the test nodes and the resultant voltage is measured and a corresponding output (digitally coded value) is provided from the measurement subsystem. During block 13303Y, the value represented by the old output of the measurement subsystem, which was provided during the preceding block 13303J, is multiplied times a factor 1.2 and is then compared with the value represented by the new or current output from the measurement subsystem provided during block 13303X. If it is not greater, then there is not a proper junction between the FROM and TO points of the current line and, accordingly, block 13303Z is entered where the current row is deleted from the PSA and circle B is followed to blocks 13303P through 13303R where the next row in the PSA is made the current row. If the test does not fail, then the circle B is followed back to the same blocks.

Once all rows for junction measurement types are completed the PSA then contains the capacitance values for common test nodes and adjacent test nodes, resistance values for common test nodes and adjacent test nodes, and junction values for both common test nodes and adjacent test nodes, and all have been edited by deleting those rows in the PSA for which the nominal value is outside of the maximum and minimum system values. Thus a test program list has been self learned by the test program list generator, automatically deleting those rows from the list between which there is an open or a short, or other value outside of the system limit.

It will be understood that once such a test program list is generated, the user may modify rows in the list in a conventional manner known in the art, using a measurement editor. This for example may be initiated during the flow of FIG. 27 while display XVIII is on the CRT by striking key 4. Similarly, actuation of key 5 causes the system to permit the user to add rows of measurement types to be learned. In this case the nominal value, the minimum value and maximum value are set to zero and allows these values to be self learned during the operation of FIG. 37 for capacitance, FIG. 42 for resistance, and FIG. 46 for junctions. In the event that the user wishes to use the test program list, that has just been generated, on another in-circuit tester, he may strike key 7 during block 1300C of the FIG. 27 flow in which case the program header map 172, the network list 176 and the PSA 178 (FIG. 8) are stored into a floppy disk by the program disk drive. If for some reason the user wishes to delete all measurement from the PSA, he actuates key 8 in which case the CPU gives the user the option to delete all measurement from the PSA. It will be understood by those skilled in the art that the system could be prevented from re-learning non-zero values that are already in the nominal value column of the PSA for capacitance, resistance and junctions. This could be done through an appropriate program that would stop re-learn for any row of the PSA that has a non-zero value for nominal value.

Table I depicts an example of a printout of a test program list for the example circuit of FIGS. 4 and 5 for the measurement type column, the FROM and TO columns, and the nominal value column. It is of interest to note that adjacent numbers were not assigned to test nodes on opposite sides of the resistors 152 and 154. Instead the non-adjacent numbers 8, 11 and 15 were assigned and as a result the resultant test program list of TABLE I does not include FROM and TO test nodes for measuring across each of these resistors. This could have been simply remedied by assigning adjacent numbers such as 31,32 and 32,33 to test nodes on opposite sides of these resistors in which case the list would have included the following additional rows:

|  | FROM | TO | NOMINAL |
|---|---|---|---|
| Resistance | 31 | 32 | 10K |
| Resistance | 32 | 33 | 10K |

These would have appeared immediately below FROM and TO test node characters 13,14. Of course the end point test node value would have had to be set to 33 so as to include the additional test nodes 31, 32 and 33.

Alternatively, the user could have made note of the absence of resistors 152 and 154 and could have added them during one of the edit blocks discussed above.

Table XXII gives an example of the pairs of common node characters and pairs of adjacent node characters that the CPU generates for each of four common nodes for capacitance, resistance and junction measurement types before any deleting is done during self learn and before any editing. The other columns in Table XXII are not shown. The left column gives the measurement type and the right two columns give the FROM and TO node characters. Six lists of unique pairs of test node characters are includes for each measurement type.

By way of example, between lines 1 and 2, thirty unique pairs of test node characters are indicated, for capacitance, where the first test node character is the common test node character number 1 and the second test node character is one of characters 1 through 30. Between 2 and 3, thirty unique pairs of test node characters are indicated, for capacitance, where the first test node character is the common test node character number 2 and the second test node character is one of characters 1 through 30. Similar lists are included between lines 3 and 4 and 5 and 6, for capacitance, for common nodes 3 and 4. Between lines 6 and 7 are thirty unique pairs of test node characters, for capacitance, in which the two characters of each pair are adjacent to the other in the sequence of numbers 1 to 30. Between lines 7 and 8 are six lists of unique pairs of test node characters, for resistance, identical to those discussed above for capacitance. Between lines 8 and 9 are six lists of unique pairs of test node characters, for junction, identical to those discussed above for capacitance. It will be obvious to those skilled in the art that the self learn and deletion of rows could be done at any of a number of times as the various parts of the list are built or after all lists are built, within the scope of the invention.

Consider briefly how the test program depicted in Table I would be used on an in-circuit tester for testing production printed wiring boards. The printed wiring board is put in a fixture which probes the test points on the board. Each row of the test program list is read by the in-circuit tester and the measurement type indicated in the row is applied to the indicated FROM and TO nodes, and the result is measured. Although not shown in Table I, it will be understood that each row also includes the maximum and minimum values depicted in the PSA (FIG. 11). In the case of capacitance and resistance mseasurements, the resultant signal is used to compute a value, which represents an electrical characteristic of the circuit between the FROM and TO test node, and is compared against the maximum and minimum values in the corresponding row of the test program list. If the resultant value is outside of these limits, the test is considered to fail and appropriate action is taken. If the resultant value is within the limits, then the electrical circuit between the corresponding FROM and TO points is considered to be good. In the case of time constants and resistance, the test is rather straightforward and is compared in only one direction. However, in the case of junctions the rows in Table I each contain either a junction forward measurement type or a junction reverse measurement type (the junction forward and junction reverse symbols are not shown). In any event, the in-circuit tester will be provided the junction forward or junction reverse measurement types, the FROM and TO points and the maximum and minimum values. The tester will then apply a current signal between the FROM and TO nodes, in the direction indicated by the measurement type, and will form a measurement result which will be compared against the maximum and minimum values from the corresponding row. If the result is outside of the maximum and minimum value limits, then the test fails and the user takes appropriate action. If the result of the comparison is within the limits, then the in-circuit tester will reverse the junction measurement type (i.e., if it is originally a junction forward, it is reversed to a junction reverse; if initially a junction reverse, it is reversed to a junction forward) and the test is reapplied between the same FROM and TO points in the direction indicated by the new measurement which is found to be acceptable. It is then multiplied times 1.2 and compared with the new value resulting from the new test. If the new output is less than 1.2 times the old value, then the test is considered to fail and the user takes appropriate action, and if it is greater than the circuit between the FROM and TO nodes for that row, it is considered to be acceptable.

Figure 6:
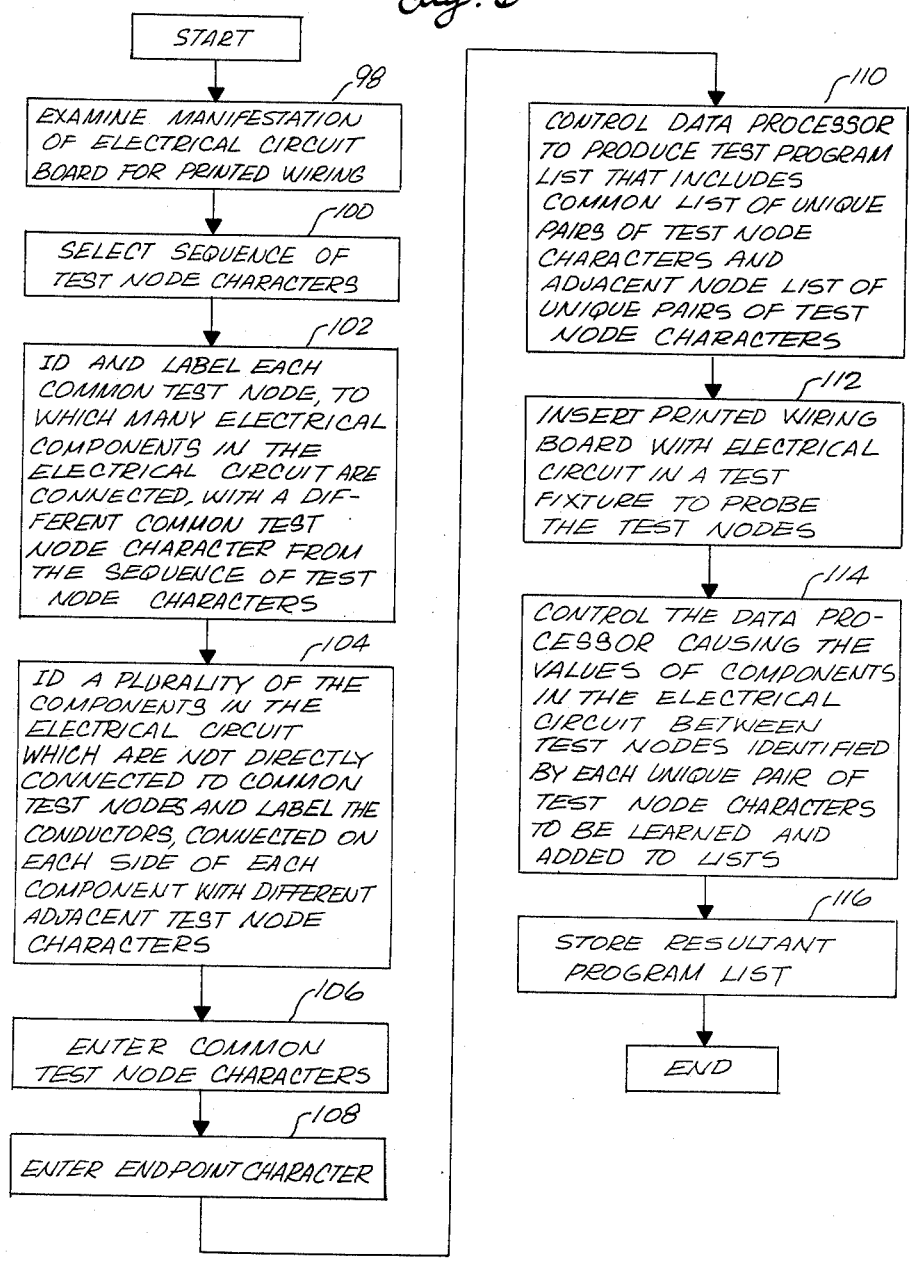
FIG. 6 is a simplified flow chart depicting the overall method for generating a digitally coded test program list for testing printed wiring board, and embodying the present invention.

Briefly, the system disclosed in FIG. 1 involves a method using a digital data processor for generating a test program for testing a printed wiring board having an electrical circuit, including components, thereon. The overall operation is depicted in the generalized flow diagram of FIG. 6. Initially, the user examines a manifestation of the electrical circuit for the printed wiring board (block 98). The user then selects a sequence of test node characters such as the sequential numbers of the decimal numbered system 1 through 2,048 (block 100).

The user then identifies and labels each common test node, to which many electrical components in the electrical circuit are connected, with a different common test node character selected from the sequence of test node characters (block 102). A plurality of the components in the electrical circuit which are not directly connected to common test nodes are identified and the conductors on each side of each of these components are labelled with a different mutually adjacent test node character selected from the sequence of test node characters (block 104). Adjacent test node characters are those characters which are adjacent in the sequence. For example, two characters would not be adjacent and the operation would not work properly if there were a teset node character between two adjacent test node characters which is assigned to another test node in the circuit. However, it should be understood that any sequence of characters or numbers could be used, such as 1, 3, 5, 7 . . . or 2, 4, 6, 8, or A, B, C, D, E.

The user enters the common test node characters into the data processor (block 106). The user also enters an end point character into the data processor (block 108). The end point character is the last character in the sequence of test node characters which is assigned to one of the test nodes in the electrical circuit.

The data processor is then controlled to produce a test program list that includes a common list of unique pairs of test node characters and an adjacent list of unique pairs of test node characters (block 110). The common list of unique pairs of test node characters includes one of the common test node characters and one of the other test node characters in the sequence between the beginning and end point character. The adjacent list of unique pairs of test node characters includes in each pair a character which is mutually adjacent to the other in the sequence. For example, in the sequence 1, 2, 3, 4 ..., the adjacent pairs are 1,2 and 2,3 and 3,4; in the sequence 1, 3, 5, 7 ..., the adjacent pairs are 1,3 and 3,5 and 5,7 ...; in the sequence 2, 4, 6, 8 ..., the adjacent pairs are 2,4 and 4,6 and 6,8 ....

A sample of the printed wiring board is inserted into a test fixture to probe each of the test nodes to which test node characters have been assigned and to which tests are to be applied (block 112). The data processor is then controlled causing the electrical characteristic of the electrical circuit between each pair of test nodes in the common list and in the adjacent list to be measured and determined (block 114). The data processor adds the measurement to the list in association with the corresponding pair of test nodes between which the test was applied (block 114) and forms and stores the resultant test program list (block 116).

It should be noted that the above are preferred configurations, but others are foreseeable. The described embodiments of the invention are only considered to be preferred and illustrative of the inventive concept; the scope of the invention is not to be restricted to such embodiment. Various and numerous other arrangements may be devised by one skilled in the art without departing from the spirit and scope of the invention. For example, the results of the continuity isolation network list, developed in the program and learn portion of the continuity isolation programming steps, may be used in conjunction with the common test node and adjacent test node generation steps in order to further shorten the steps required in generating a suitable test program list.

TABLE I

Programming Example - Program Listing

| Type | Measurements | | Nominal |
|---|---|---|---|
| | From | To | |
| Time Constant | 1 | 2 | 96u |
| Time Constant | 16 | 17 | 481u |
| Time Constant | 18 | 19 | 10u |
| Resistance | 1 | 10 | 2.1K |
| Resistance | 2 | 3 | 4.7K |
| Resistance | 2 | 4 | 10K |
| Resistance | 13 | 14 | 1.05K |
| Junction | 1 | 3 | 1.2V |
| Junction | 1 | 4 | 1.2V |
| Junction | 1 | 7 | 1.6V |
| Junction | 1 | 9 | 2.0V |
| Junction | 1 | 13 | 1.2V |
| Junction | 2 | 4 | 2.2V |
| Junction | 2 | 13 | 1.4V |
| Junction | 2 | 14 | 1.3V |
| Junction | 20 | 21 | 1.2V |

TABLE II (not used)

TABLE III

STATUS DISPLAY

| | | | |
|---|---|---|---|
| Program Name = DEMO | End Point = 0 | Size = 0 | Board Type = Loaded |
| ON | Continuity: Dwell = 500μ Threshold = 10 | | Translator = OFF |
| ON | Isolation: Dwell = 500μ Threshold = 10 | | Clock = |
| ON | Time Constant: Tolerances = −40% +40% | | Datalog = OFF |
| ON | Resistance: Tolerances = −20% +20% | | Fixture Delay = 0.5 |
| ON | Junction: Tolerances = −30% +30% | | Program saved = NO |

CURRENT OPERATION DISPLAY

MAIN MENU
   1. Help
   2. System levels and limits
   3. Program and self learn
   4. Read or write disk
   5. System diagnostics
   6. Report options
   7. Translator options
   8. Datalogging options
   9. Begin testing
CONTROL+C Exit to operating system
Please enter number of your selection: _

(1000)

TABLE IV

SYSTEM LEVELS AND LIMITS

1. Measurement modes (ON/OFF)
   2. Continuity/Isolation end point
   3. Continuity dwell and threshold
   4. Isolation dwell and threshold
   5. Time constant tolerances
   6. Resistance tolerances
   7. Junction tolerances
CONTROL+B Go back to previous menu
Please enter number of your selection: _

(1200)

TABLE V (not used)

TABLE VI

| | | | |
|---|---|---|---|
| Program Name = DEMO | End Point = 30 | Size = 0 | Board Type = LOADED |
| ON | Continuity: Dwell = 500μ Threshold = 10 | | Translator = OFF |
| ON | Isolation: Dwell = 500μ Threshold = 10 | | Clock = |
| ON | Time Constant: Tolerances = −40% +40% | | Datalog = OFF |
| ON | Resistance: Tolerances = −20% +20% | | Fixture Delay = 0.5 |
| ON | Junction: Tolerances = −30% +30% | | Program saved = YES |

TABLE VI-continued
CONTINUITY/ISOLATION END POINT
This system is configured for a maximum of 2048 points.
Please enter number between 2 and 2048: _

(1220)

TABLE VII
CONTINUITY DWELL

| | | | |
|---|---|---|---|
| A. | 500 microseconds | F. | 20 milliseconds |
| B. | 1 millisecond | G. | 50 milliseconds |
| C. | 2 milliseconds | H. | 100 milliseconds |
| D. | 5 milliseconds | I. | 500 milliseconds |
| E. | 10 milliseconds | J. | 1 second |

Enter letter for new continuity dwell or RETURN if no change: _

(1230)

TABLE VIII
CONTINUITY THRESHOLD

| | | | |
|---|---|---|---|
| A. | 5 ohms | F. | 1 Kilohm |
| B. | 10 ohms | G. | 5 Kilohms |
| C. | 50 ohms | H. | 10 Kilohms |
| D. | 100 ohms | I. | 50 Kilohms |
| E. | 500 ohms | J. | 100 Kilohms |

Enter letter for new continuity threshold or RETURN if no change: _

(1231)

TABLE IX
ISOLATION DWELL

| | | | |
|---|---|---|---|
| A. | 500 microseconds | F. | 20 milliseconds |
| B. | 1 millisecond | G. | 50 milliseconds |
| C. | 2 milliseconds | H. | 100 milliseconds |
| D. | 5 milliseconds | I. | 500 milliseconds |
| E. | 10 milliseconds | J. | 1 second |

Enter letter for new isolation dwell or RETURN if no change: _

(1240)

TABLE X
ISOLATION THRESHOLD

| | | | |
|---|---|---|---|
| A. | 5 ohms | F. | 1 Kilohm |
| B. | 10 ohms | G. | 5 Kilohms |
| C. | 50 ohms | H. | 10 Kilohms |
| D. | 100 ohms | I. | 50 Kilohms |
| E. | 500 ohms | J. | 100 Kilohms |

Enter letter for new isolation threshold or RETURN if no change: _

(1241)

TABLE XI
TIME CONSTANT TOLERANCES

| | | |
|---|---|---|
| A. 10% | D. 25% | G. 40% |
| B. 15% | E. 30% | H. 45% |
| C. 20% | F. 35% | I. 50% |

Select letter of new low tolerance or RETURN if no change: _

(1250)

TABLE XII
TIME CONSTANT TOLERANCES

| | | | |
|---|---|---|---|
| A. 10% | E. 30% | I. 50% | M. 70% |
| B. 15% | F. 35% | J. 55% | N. 75% |
| C. 20% | G. 40% | K. 60% | O. 80% |
| D. 25% | E. 45% | L. 65% | P. 85% |

Select letter of new high tolerance or RETURN if no change: _

(1251)

TABLE XIII
RESISTANCE TOLERANCES

| | | | |
|---|---|---|---|
| A. 10% | E. 30% | I. 50% | M. 70% |
| B. 15% | F. 35% | J. 55% | N. 75% |
| C. 20% | G. 40% | K. 60% | O. 80% |
| D. 25% | H. 45% | L. 65% | P. 85% |

Select letter of new low tolerance or RETURN if no change: _

(1260)

TABLE XIV
RESISTANCE TOLERANCES

| | | | |
|---|---|---|---|
| A. 10% | E. 30% | I. 50% | M. 70% |
| B. 15% | F. 35% | J. 55% | N. 75% |
| C. 20% | G. 40% | K. 60% | O. 80% |
| D. 25% | H. 45% | L. 65% | P. 85% |

Select letter of new high tolerance or RETURN if no change: _

(1261)

TABLE XV
JUNCTION TOLERANCES

| | | | |
|---|---|---|---|
| A. 10% | E. 30% | I. 50% | K. 70% |
| B. 15% | F. 35% | J. 55% | N. 75% |
| C. 20% | G. 40% | K. 60% | O. 80% |
| D. 25% | H. 45% | L. 65% | P. 85% |

Select letter of new low tolerance or RETURN if no change: _

(1270)

TABLE XVI
JUNCTION TOLERANCES

| | | | |
|---|---|---|---|
| A. 10% | E. 30% | I. 50% | M. 70% |
| B. 15% | F. 35% | J. 55% | N. 75% |
| C. 20% | G. 40% | K. 60% | O. 80% |
| D. 25% | H. 45% | L. 65% | P. 85% |

Select letter of new high tolerance or RETURN if no change: _

(1271)

TABLE XVII
PROGRAM AND LEARN

1. Continuity/Isolation
2. Select common and adjacent networks
3. Self learn
4. Modify measurements
5. Add measurements
6. Display measurements
7. Save program onto diskette
8. Delete all measurements CONTROL+B Go back to previous menu Please enter number of your selection: _

(1300)

TABLE XVIII

| | | | | | | | | | | |
|---|---|---|---|---|---|---|---|---|---|---|
| TIME CONSTANT | 1 | 2 | 3 | 4 | 5 | 6 | 7 | 8 | 9 | A |
| RESISTANCE | 1 | 2 | 3 | 4 | 5 | 6 | 7 | 8 | 9 | A |
| JUNCTION | 1 | 2 | 3 | 4 | 5 | 6 | 7 | 8 | 9 | A |

(Press "A" to toggle adjacent network option)
Enter selection to toggle time constant point or RETURN when done: _

TABLE XVIII-continued (1320)

TABLE XIX

| | | | | | | | | | | |
|---|---|---|---|---|---|---|---|---|---|---|
| TIME CONSTANT | 1 | *2* | *3* | *4* | 5 | 6 | 7 | 8 | 9 | *A* |
| RESIS-TANCE | 1* | 2 | 3 | 4 | 5 | 6 | 7 | 8 | 9 | A |
| JUNCTION | 1 | 2 | 3 | 4 | 5 | 6 | 7 | 8 | 9 | A |

(Press "A" to toggle adjacent network option)
Enter selection to toggle time constant point or RETURN when done: _
Enter selection to toggle resistance point or RETURN when done: _

(1322)

TABLE XX

| | | | | | | | | | | |
|---|---|---|---|---|---|---|---|---|---|---|
| TIME CONSTANT | 1 | *2* | *3* | *4* | 5 | 6 | 7 | 8 | 9 | *A* |
| RESISTANCE | *1* | *2* | *3* | 6 | 7 | 8 | 5 | 9 | 9 | *A* |
| JUNCTION | 1 | 2 | 3 | 4 | 5 | 6 | 7 | 8 | 9 | A |

(Press "A" to toggle adjacent network option)
Enter selection to toggle time constant point or RETURN when done: _
Enter selection to toggle resistance point or RETURN when done: _
Enter selection to toggle junction point or RETURN when done: _

(1324)

TABLE XXI

SELF LEARN OPTIONS

All zero value measurements will be learned.
You may select any or all of the following to be Relearned:

1 Continuity/Isolation network list
    2 All time constants
    3 All resistances
    4 All junctions
   *5* Delete out of range measurements
CONTROL+L Learn the selected values
CONTROL+B Go back to previous menu
    Enter your selection: _

(1330)

TABLE XXII

| | RESISTANCE TYPE | FROM | TO |
|---|---|---|---|
| 1 | | | |
| | CAPACITANCE | 1 | 1 |
| | CAPACITANCE | 1 | 2 |
| | — | — | — |
| | — | — | — |
| | CAPACITANCE | 1 | 30 |
| 2 | | | |
| | CAPACITANCE | 2 | 1 |
| | CAPACITANCE | 2 | 2 |
| | — | — | — |
| | — | — | — |
| | CAPACITANCE | 2 | 30 |
| 3 | | | |
| | CAPACITANCE | 3 | 1 |
| | CAPACITANCE | 3 | 2 |
| | — | — | — |
| | — | — | — |
| | CAPACITANCE | 3 | 30 |
| 4 | | | |
| | CAPACITANCE | 4 | 1 |
| | CAPACITANCE | 4 | 2 |
| | — | — | — |
| | — | — | — |
| | CAPACITANCE | 4 | 30 |
| 5 | | | |
| | CAPACITANCE | 1 | 2 |
| | CAPACITANCE | 2 | 3 |
| | — | — | — |

TABLE XXII-continued

| | RESISTANCE TYPE | FROM | TO |
|---|---|---|---|
| | — | — | — |
| | — | — | — |
| 6 | CAPACITANCE | 29 | 30 |
| | RESISTANCE | 1 | 1 |
| | — | — | — |
| | — | — | — |
| 7 | RESISTANCE | 29 | 30 |
| | JUNCTION | 1 | 1 |
| | — | — | — |
| | — | — | — |
| | JUNCTION | 29 | 30 |

What is claimed is:

1. A method using a digital data test program generator for generating a test program list for testing a printing wiring board having an electrical circuit, including components, thereon comprising the steps of:
   inputting to the generator a common test node character in a sequence of test node characters;
   inputting one of the test node characters as a last test node character in the same sequence of test node characters;
   enabling the generator to form a representation of a common list of pairs of the test node characters, and each pair being unique, each pair comprising the common test node character;
   enabling the generator to form a representation of an adjacent list of pairs of the test node characters, each pair being unique and comprising test node characters that are adjacent in the sequence of test node characters;
   assigning each of individual ones of the pairs of test node characters in the common list and adjacent list to a corresponding pair of test nodes on the electrical circuit;
   controlling the generator to sequentially apply a test signal between each of the pairs of test nodes identified in the common list and in the adjacent list on a sample of the printed wiring board and from the test signal to determine a resultant electrical characteristic for the electrical circuit between each of the pairs of test nodes; and
   controlling the generator to store a program test list comprising representations of at least some of the pairs in the common list and the adjacent list of pairs of test node characters and, in association with the representation for each pair of test node characters, a representation of an electrical characteristic which was determined for the pair of test noded corresponding to such pair of test node characters.

2. A method according to claim 1 comprising the steps of manually controlling the generator to enable the deletion of any pair of test node characters from the program test list.

3. A method according to claim 1 comprising the steps of:
    storing the representation of at least one reference value for electrical characterstics;
    enabling the generator to compare the representation of at least one reference value with the resultant electrical characteristic between each of plural ones of the pairs of test nodes to detect a representation of an electrical characteristic for any one of the plurality of pairs of test nodes which has an undesired value; and
    enabling the generator to effectively exclude from the program test list any of the pairs of test node characters which correspond to a pair of test nodes determined to have an undesired value of electrical characteristic.

4. A method according to claim 1 comprising the step of inserting a sample of the printed wiring board into a test fixture for electrically connecting probes to each of the test nodes on the printed wiring board.

5. A method using a digital data processor and a manifestation of an electrical circuit for producing a digitally coded test program list, the test program list being for controlling the operation of a circuit test system in testing a printed wiring board containing the electrical circuit for electrical characteristics, the electrical circuit comprising electrical circuit components connected to conductors, the method comprising the steps of:
    selecting a sequence of test node characters that are in a sequential order between a first and last character;
    assigning a different one of the test node characters to each of a plurality of the test nodes to be tested on the conductors in the electrical circuit;
    selecting a first test node on one of the conductors that has at least two electrical components electrically connected thereto and assigning thereto a common test node character selected from the sequence of test node characters;
    inputting a representation of the last test node character to the data processor;
    controlling the data processor to generate digitally coded representations of a common list of unique pairs of test node characters, a first test node character in each pair in the list comprising a representation of the common test node character and a second test node character in each air comprising a representation of one of the other test node characters in the sequence of test node characters;
    determining an electrical characteristic of the electrical circuit between each pair of test nodes identified by each of a plurality of the pairs of test node characters in the common list; and
    forming a test program list comprising representations of pairs of test node characters from the common list and representations of the electrical characteristic between the test nodes corresponding to the pairs of test node characters included in the test program list.

6. A method according to claim 5 comprising the steps of:
    placing a printed wiring board containing the electrical circuit in a test fixture having a plurality of electrical probes, causing each said probe to contact a different electrical test node on the conductors of the electrical circuit;
    accessing the common list and applying a test signal through the electrical probes to test nodes indicated by the pairs of test node characters in the common list to determine an electrical characteristic of the electrical circuit between the test nodes between which the test signal is applied;
    determining when the electrical characteristic for any particular one of the pairs of test nodes is outside of an acceptable range; and
    responding to the determination that an out of acceptable range exists for any one of the pair of test nodes for excluding the corresponding pair of test node characters from the test program list.

7. A method according to claim 5 including the additional step of controlling the digital data processor to enable a user to provide an input to the digital data processor to modify the list of pairs of test node characters included in the test program list.

8. A method according to claim 5 comprising:
    selecting a second test node on one of the conductors that has at least two electrical components electrically connected thereto and assigning a second and different common test node character selected from the sequence of test node characters;
    controlling the data processor, causing it to generate digitally coded representations of a second common list of unique pairs of test node characters, a first test node character in each pair in the second common list comprising a representation of the second common node character and a second test node character in each pair in the second common list comprising a representation of one of the other test node characters in the sequence of test node characters;
    determining the electrical characteristic of the electrical circuit between each pair of test nodes identified by each of a plurality of test node characters in the second common list; and
    forming in the test program list representations of pairs of test node characters from the second common list and representations of the electrical characteristic determined between the test nodes corresponding to the pairs of test node characters, from the second common list, included in the test program.

9. A method according to claim 5 comprising the steps of:
    selecting a plurality of selected ones of the electrical circuit components in the electrical circuit which are not directly connected to a test node corresponding to a common test node character, each of the selected components having a first conductor and a second conductor connected to opposite sides of the selected component;
    selecting mutually adjacent ones of the test node characters in the sequential order of test node characters to form adjacent pairs of adjacent test node characters, each adjacent pair comprising a unique pair of the test node characters;
    assigning each of the adjacent pairs of test node characters to a different one of the selected ones of the electrical circuit components by assigning one of the test node characters thereof to a test node on the first conductor and assigning a second one of the test node characters thereof to a test node on the second conductor of the assigned selected component;

controlling the data processor to generate digitally coded representations of an adjacent point list of the adjacent pairs of test node characters;

determining an electrical characteristic of the electrical circuit between each pair of the test nodes identified by each of a plurality of the pairs of test nodes in the adjacent list; and forming in the test program list representations of the pairs of test node characters from the adjacent list and representations of electrical characteristics determined between the test nodes corresponding to the pair of test node characters from the adjacent list which are included in the test program list.

10. A method according to any of claims 5, 8 or 9 wherein the test program list is stored in a memory.

11. A method according to any of claims 5, 8 or 9 wherein the test program is stored in a removable storage medium.

12. A method according to claim 5 comprising the steps of:

placing the printed wiring board containing the electrical circuit in a test fixture which is coupled to the data processor through a measurement system; enabling the data processor for cooperation with the measurement system to apply a test signal between each pair of test nodes identified by each of a plurality of the pairs of test node characters in each common list, to determine a result of the test signal and thereby determine said electrical characteristic.

13. A method using a digital data processor and a manifestation of an electrical circuit for producing a digitally coded test program list, the test program list being for controlling the operation of a circuit test system in testing a printed wiring board containing the electrical circuit for electrical characteristics, the electrical circuit comprising electrical circuit components connected to conductors, the method comprising the steps of:

selecting a sequence of test node characters that are in a sequential order between a first and last character;

assigning a different one of the test node characters to each of a plurality of the test nodes to be tested on the conductors in the electrical circuit;

selected a first test node on one of the conductors that has at least two electrical components electrically connected thereto and assigning thereto a common test node character selected from the sequence of test node characters;

inputting a representation of the last test node character to the data processor;

controlling the data processor to generate, for each of a plurality of different measurement types, digitally coded representations of a common list of unique pairs of test node characters, a first test node character in each pair in each common list for each measurement type comprising a representation of the common test node character and a second test node character in each pair comprising a representation of one of the other test node characters in the sequence of test node characters;

determining an electrical characteristic of the electrical circuit between each pair of test nodes identified by each of a plurality of the pairs of test node characters in each common list for each measurement type; and forming a test program list comprising entries, each entry for each of the measurement types comprising representations of pairs of test node characters from the common list and representations of the electrical characteristic between the test nodes corresponding to the pair of test node characters included in the test program list.

14. A method according to claim 13 comprising the steps of:

placing the printed wiring board containing the electrical circuit in a test fixture having a plurality of electrical probes, causing each said probe to contact a different electrical test node on the conductors of the electrical circuit;

accessing the common list and applying a test signal through the electrical probes to test nodes indicated by the pairs of test node characters in the common list to determine an electrical characteristic of the electrical circuit between the test nodes between which the test signal is applied;

determining when the electrical characteristic for any particular one of the pairs of test nodes is outside of an acceptable range; and responding to the determination that an out of acceptable range exists for any one of the pair of test nodes for excluding the corresponding pair of test node characters from the test program list.

15. A method according to claim 13 including the additional step of controlling the digital data processor to enable a user to provide an input to the digital data processor to modify the list of pairs of test node characters included in the test program list.

16. A method according to claim 13 comprising:

selecting a second test node on one of the conductors that has at least two electrical components electrically connected thereto and assigning a second and different common test node character selected from the sequence of test node characters;

controlling the data processor, causing it to generate, for each different measurement type, digitally coded representations of a second common list of unique pairs of test node characters, a first test node character in each pair in the second common list for each measurement type comprising a representation of the second common node character and a second test node character in each such pair comprising a representation of one of the other test node characters in the sequence of test node characters;

determining the electrical characteristic of the electrical circuit between each pair of test nodes identified by each of a plurality of test node characters in the second common list; and forming in the test program list, for each of the measurement types, representations of pairs of test node characters from the second common list and representations of the electrical characteristic determined between the test nodes corresponding to the pairs of test node characters, from the second common list, included in the test program.

17. A method according to claim 13 comprising the steps of:

selecting a plurality of selected ones of the electrical circuit components in the electrical circuit which are not directly connected to a test node corresponding to a common test node character, each of the selected components having a first conductor and a second conductor connected to opposite sides of the selected component;

selecting mutually adjacent ones of the test node characters in the sequential order of test node characters to form adjacent pairs of adjacent test node characters, each adjacent pair comprising a unique pair of the test node characters;

assigning each of the adjacent pairs of test node characters to a different one of the selected ones of the electrical circuit components by assigning one of the test node characters thereof to a test node on the first conductor and assigning a second one of the test node characters thereof to a test node on the second conductor of the assigned selected component;

controlling the data processor to generate digitally coded representations of an adjacent point list of the adjacent pairs of test node characters;

determining an electrical characteristic of the electrical circuit between each pair of the test nodes identified by each of a plurality of the pairs of test nodes in the adjacent list; and forming in the test program list representations of the pairs of test node characters from the adjacent list and representations of electrical characteristics determined between the test nodes corresponding to the pair of test node characters from the adjacent list which are included in the test program list.

18. A method according to any of claims 13, 16 or 17 wherein the test program list is stored in a memory.

19. A method according to any of claims 13, 16 or 17 wherein the test program is stored in a removable storage medium.

20. A method according to claim 13 comprising the steps of:

placing the printed wiring board containing the electrical circuit in a test fixture which is coupled to the data processor through a measurement system; enabling the data processor for cooperation with the measurement system to apply a test signal between each pair of test nodes identified by each of a plurality of the pairs of test node characters in each comon list for each measurement type, to determine a result of the test signal and thereby determine said electrical characteristic.

* * * * *